(12) United States Patent
Adachi et al.

(10) Patent No.: US 8,592,041 B2
(45) Date of Patent: *Nov. 26, 2013

(54) GLASS CERAMIC COMPOSITION AND GLASS CERAMIC SUBSTRATE

(75) Inventors: Hiroshige Adachi, Nagaokakyo (JP); Sadaaki Sakamoto, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/110,307

(22) Filed: May 18, 2011

(65) Prior Publication Data

US 2011/0223399 A1 Sep. 15, 2011

Related U.S. Application Data

(63) Continuation of application No. PCT/JP2009/068799, filed on Nov. 4, 2009.

(30) Foreign Application Priority Data

Nov. 19, 2008 (JP) ................................. 2008-295082
Sep. 8, 2009 (JP) ................................. 2009-206971

(51) Int. Cl.
*B32B 15/04* (2006.01)
*B32B 17/00* (2006.01)
*C03C 6/00* (2006.01)

(52) U.S. Cl.
USPC ........... 428/432; 428/688; 428/697; 428/699; 428/701; 428/702; 501/134; 501/136; 501/154; 501/102; 501/103; 501/108; 501/122; 501/53

(58) Field of Classification Search
USPC .................. 428/432, 701, 702, 688, 697, 699; 501/134, 136, 154, 102, 103, 108, 122, 501/53

See application file for complete search history.

(56) References Cited

U.S. PATENT DOCUMENTS 6,303,225 B1 * 10/2001 Veerasamy .................... 428/408
7,060,322 B2 * 6/2006 Veerasamy .................... 427/154

(Continued)

FOREIGN PATENT DOCUMENTS

JP        11-209178       8/1999
JP     20010189534       7/2001

(Continued)

OTHER PUBLICATIONS

Written Opinion of the International Searching Authority, mailed Feb. 2, 2010.

*Primary Examiner* — David Sample
*Assistant Examiner* — Lauren Colgan
(74) *Attorney, Agent, or Firm* — Dickstein Shapiro LLP

(57) ABSTRACT

Provided is a glass ceramic composition which can be fired at a temperature of 1000° C. or lower, and a sintered body of which has a low relative permittivity and a high Q value, stable temperature characteristic and high reliability, and is excellent in plating solution resistance. The glass ceramic composition provides a low dielectric constant layer for inclusion in a laminate glass ceramic substrate in a ceramic multilayer module. It includes a first ceramic having forsterite as the main constituent, a second ceramic having at least one of $SrTiO_3$ and $TiO_2$ as the main constituent, a third ceramic having $BaZrO_3$ as the main constituent, a fourth ceramic having at least one of $ZrO_2$ and MnO as the main constituent, and 3 weight % or more of a borosilicate glass containing $Li_2O$, MgO, $B_2O_3$, $SiO_2$ and ZnO, which further contains an additive constituent including at least one of CaO and SrO.

16 Claims, 8 Drawing Sheets

(56) References Cited

U.S. PATENT DOCUMENTS

| | | | |
|---|---|---|---|
| 7,351,674 B2 | 4/2008 | Mori et al. | |
| 8,153,266 B2* | 4/2012 | Petrmichl et al. | 428/432 |
| 2005/0048284 A1* | 3/2005 | Veerasamy | 428/408 |
| 2005/0095430 A1* | 5/2005 | Veerasamy | 428/408 |
| 2005/0095431 A1* | 5/2005 | Veerasamy | 428/408 |
| 2005/0178652 A1* | 8/2005 | Murphy et al. | 204/192.11 |
| 2005/0191494 A1* | 9/2005 | Veerasamy | 428/408 |
| 2005/0260419 A1* | 11/2005 | Hukari et al. | 428/428 |
| 2006/0240266 A1* | 10/2006 | Schicht et al. | 428/426 |
| 2006/0287184 A1 | 12/2006 | Mori et al. | |
| 2007/0042186 A1* | 2/2007 | Veerasamy | 428/408 |
| 2007/0042187 A1* | 2/2007 | Veerasamy | 428/408 |
| 2007/0128450 A1 | 6/2007 | Mori et al. | |
| 2007/0237935 A1 | 10/2007 | Mori et al. | |
| 2008/0020211 A1* | 1/2008 | Petrmichl et al. | 428/428 |
| 2008/0199702 A1* | 8/2008 | Murphy et al. | 428/408 |
| 2009/0122506 A1 | 5/2009 | Sugimoto et al. | |
| 2009/0169839 A1 | 7/2009 | Sugimoto et al. | |
| 2010/0075156 A1* | 3/2010 | Petrmichl et al. | 428/428 |
| 2010/0266823 A1* | 10/2010 | Hukari et al. | 428/212 |
| 2011/0027471 A1* | 2/2011 | Murphy et al. | 427/154 |
| 2011/0027595 A1* | 2/2011 | Murphy | 428/426 |
| 2011/0111204 A1* | 5/2011 | Veerasamy et al. | 428/312.8 |
| 2011/0135914 A1* | 6/2011 | Murphy et al. | 428/336 |
| 2012/0015195 A1* | 1/2012 | Wang et al. | 428/426 |

FOREIGN PATENT DOCUMENTS

| | | |
|---|---|---|
| JP | 2007-031177 | 2/2007 |
| JP | 2008-037739 | 2/2008 |
| WO | WO-2005/082806 A1 | 9/2005 |
| WO | WO-2008-018407 | 2/2008 |
| WO | WO-2008/018408 A1 | 2/2008 |
| WO | WO2008018408 * | 2/2008 |

* cited by examiner

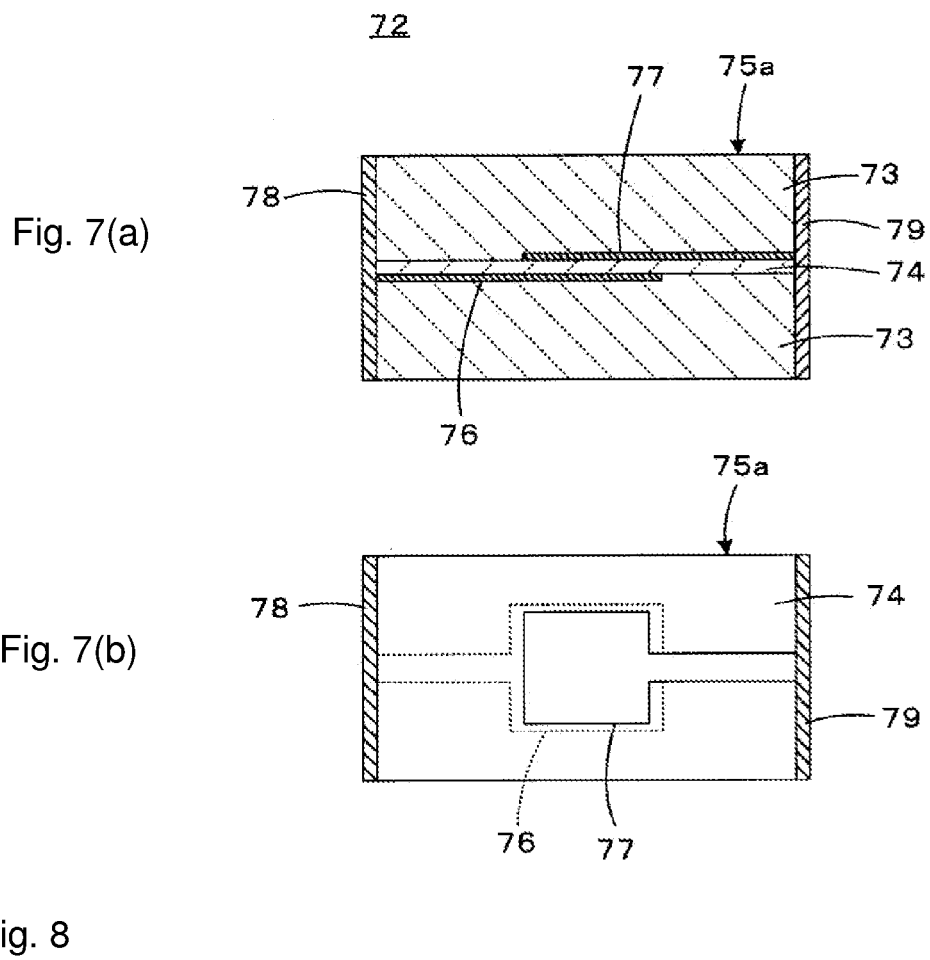
Fig. 7(a)
Fig. 7(b)
Fig. 8
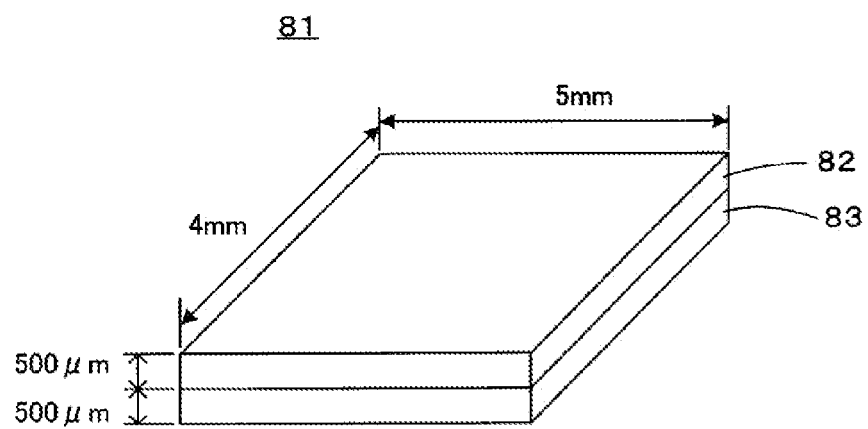

Co-sintered body 85

Co-sintered body 86

US 8,592,041 B2

GLASS CERAMIC COMPOSITION AND GLASS CERAMIC SUBSTRATE

This is a continuation of application Serial No. PCT/JP2009/068799, filed Nov. 4, 2009, the content of which are incorporated herein by reference.

TECHNICAL FIELD

The present invention relates to a glass ceramic composition including a glass constituent so as to enable firing at low temperature, and a glass ceramic substrate configured by use of the same.

BACKGROUND ART

As one effective way for enabling miniaturization of electronic devices, multifunctional electronic components are used in electronic devices. Examples of the multifunctional electronic components include ceramic multilayer modules.

The ceramic multilayer module includes a laminate ceramic substrate. Wiring conductors, which are for performing the function of electrical connection or for configuring passive elements such as a capacitor and an inductor, are incorporated in the laminate ceramic substrate, and various electronic components are mounted on the laminate ceramic substrate.

In this way, the ceramic multilayer module can be multi-functionalized though it is small-sized, and this is used to make miniaturization of electronic devices possible.

Further, the demand of higher frequency for the electronic devices have increased in addition to the above miniaturization of electronic devices. In the context of such situations it is desired that the laminate ceramic substrate provided in ceramic multilayer modules used in a high-frequency domain be superior in high-frequency characteristics. More specifically, it is desired that an insulating ceramic sintered body used as an insulating ceramic layer to provide a laminated structure in the laminate ceramic substrate be superior in high-frequency characteristics.

Examples of insulating ceramic compositions for obtaining the insulating ceramic sintered body which can satisfy such demands include, for example, a composition described in Japanese Unexamined Patent Publication No. 2008-37739 (Patent Document 1).

Patent Document 1 discloses a glass ceramic composition including a first ceramic powder having forsterite as the main constituent, a second ceramic powder containing at least one selected from the group consisting of a ceramic powder having calcium titanate as the main constituent, a ceramic powder having strontium titanate as the main constituent and a ceramic powder having titanium oxide as the main constituent, and a borosilicate glass powder containing lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 45 weight % on a $SiO_2$ equivalent basis, zinc in an amount of 6 to 20 weight % on a ZnO equivalent basis, and aluminum in an amount of 0 to 15 weight % on an $Al_2O_3$ equivalent basis.

In this glass ceramic composition, the above borosilicate glass powder accounts for 3 weight %, and at least one additive constituent selected from the group consisting of calcium oxide, barium oxide, and strontium oxide is added to the borosilicate glass. When the content of the additive constituent is represented by the percentage of the borosilicate glass powder, the lower limit of the content of the additive constituent is 2 weight % in terms of the sum of the calcium oxide content on a CaO equivalent basis, the barium oxide content on a BaO equivalent basis and the strontium oxide content on a SrO equivalent basis, and the upper limit of the content of the additive constituent is 15 weight % on the CaO equivalent basis in the case of calcium oxide, 25 weight % on the BaO equivalent basis in the case of barium oxide, and 25 weight % on the SrO equivalent basis in the case of strontium oxide.

In accordance with the glass ceramic composition described in Patent Document 1, it is possible to fire a glass ceramic composition at a temperature of 1000° C. or lower, and a glass ceramic sintered body, which is obtained by this firing, has excellent chemical stability, a relatively low relative permittivity and a higher Q value, and the temperature coefficient ($\tau_f$) of a resonance frequency is stable. Therefore, if the ceramic substrate is formed by use of the glass ceramic sintered body, copper or silver can be used as the main constituent of the wiring conductors provided there, and a ceramic substrate suitable for high-frequency applications can be formed.

However, the glass ceramic composition described in Patent Document 1 has a problem in that the Q value of a sintered body thereof is relatively low and the glass ceramic composition is inferior in chemical resistance, such as plating solution resistance.

On the other hand, when a capacitor is configured in the laminate ceramic substrate, for example, the ceramic sintered body ceramic layer located in association with the capacitor desirably has a high dielectric constant.

Examples of the high dielectric ceramic composition for obtaining a ceramic sintered body capable of satisfying such demands include a ceramic composition described in International Publication WO 2008/018408 (Patent Document 2).

Patent Document 2 discloses a glass ceramic composition formed by including a $SrZrO_3$ based ceramic and a $Li_2O$—MgO—ZnO—$B_2O_3$—$SiO_2$ based glass, wherein the $Li_2O$—MgO—ZnO—$B_2O_3$—$SiO_2$ based glass accounts for 1 to 12 weight % of the total, where the content of $Li_2O$ is 3.5 to 15 weight %, the content of MgO is 20 to 50 weight %, the content of BaO is 0 to 25 weight %, the content of CaO is 0 to 10 weight %, the content of SrO is 0 to 25 weight %, the content of $B_2O_3$ is 16 to 29 weight %, the content of $SiO_2$ is 11 to 35 weight %, the content of ZnO is 5 to 20 weight %, and the content of $Al_2O_3$ is 0 to 15 weight %, and wherein the glass ceramic composition further contains a $SrTiO_3$ based ceramic in an amount of 0 to 6 weight % of the total.

In accordance with the glass ceramic composition described in Patent Document 2, it is possible to sufficiently achieve sintering at low temperature while maintaining characteristics of the $SrZrO_3$ based ceramic even if an additive amount of the above glass is small since the $Li_2O$—MgO—ZnO—$B_2O_3$—$SiO_2$ based glass exhibits extremely good wettability on a $SrZrO_3$ based ceramic. Accordingly, the high relative permittivity of the $SrZrO_3$ based ceramic can be maintained in accordance with a glass ceramic sintered body obtained by firing this glass ceramic composition. Further, this glass ceramic composition deposits crystal phases of $Mg_3B_2O_6$ and $Li_2MgSi_2O_8$. Since these crystal phases exhibit the high Q value, the Q value of a sintered body thereof can be enhanced.

A laminate ceramic substrate having a combined structure including a low dielectric constant layer and a high dielectric constant layer laminated together has been proposed. When such a laminate ceramic substrate is manufactured, it is conceivable that the low dielectric constant layer is formed of a sintered body of the glass ceramic composition described in Patent Document 1 and the high dielectric constant layer is formed of the a sintered body of the glass ceramic composition described in Patent Document 2 from the point of view of the dielectric constant.

When such an laminate ceramic substrate having a combined structure is manufactured, it is necessary to co-fire the low dielectric constant layer and the high dielectric constant layer. In this case, it is preferred that the difference in thermal expansion coefficient between the low dielectric constant layer and the high dielectric constant layer is as small as possible. However, there is a relatively large gap between the thermal expansion coefficient of the sintered body of the glass ceramic composition described in Patent Document 1 and the thermal expansion coefficient of the sintered body of the glass ceramic composition described in Patent Document 2, and there is a possibility that defects such as peeling, cracks and pores may be developed in the laminate ceramic substrate.

Patent Document 1: Japanese Unexamined Patent Publication No. 2008-37739
Patent Document 2: International Publication WO 2008/018408

DISCLOSURE OF THE INVENTION

Problem to be Solved by the Invention

It is an object of the present invention to provide a glass ceramic composition which increases the Q value in a compositional system of the glass ceramic composition described in Patent Document 1 and can yield a sintered body having excellent plating solution resistance.

It is another object of the present invention to provide a glass ceramic substrate which is obtained by firing the above-mentioned glass ceramic composition.

It is still another object of the present invention to provide a laminate glass ceramic substrate including a low dielectric constant layer and a high dielectric constant layer, and more specifically, to provide a glass ceramic composition which is suitable for forming the high dielectric constant layer when the low dielectric constant layer is formed by use of the above-mentioned glass ceramic composition.

Means for Solving the Problem

In the first aspect, the present invention is first aimed at a glass ceramic composition including a first ceramic having forsterite as the main constituent, a second ceramic having at least one of strontium titanate and titanium oxide as the main constituent, a third ceramic having barium zirconate as the main constituent, a fourth ceramic having zirconium oxide or manganese oxide as the main constituent, and a borosilicate glass, and the present invention is characterized by including the following constitution for solving the above-mentioned technical problems.

The content of the second ceramic is 3 weight % or more and 13 weight % or less when the second ceramic has strontium titanate as the main constituent, and is 0.3 weight % or more and 10 weight % or less when the second ceramic has titanium oxide as the main constituent, the content of the third ceramic is 4 weight % or more and 8 weight % or less, the content of the fourth ceramic is 5 weight % or more and 20 weight % or less when the fourth ceramic has zirconium oxide as the main constituent, and is 1 weight % or more and 9 weight % or less when the fourth ceramic has manganese oxide as the main constituent, and the content of the borosilicate glass is 3 weight % or more and 20 weight % or less.

Further, the borosilicate glass is characterized in that the borosilicate glass contains lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 35 weight % on a $SiO_2$ equivalent basis and zinc in an amount of 6 to 20 weight % on a ZnO equivalent basis, and further contains an additive constituent including at least one of calcium oxide and strontium oxide, wherein the upper limit of the content of the additive constituent is 15 weight % on a CaO equivalent basis in the case of calcium oxide and is 25 weight % on a SrO equivalent basis in the case of strontium oxide when the content of the additive constituent is represented as the percentage in the borosilicate glass.

In the second aspect, the glass ceramic composition of the present invention is characterized by including both of zirconium oxide and manganese oxide as the above-mentioned fourth ceramic as compared with the first aspect. In this case, with respect to the content of the fourth ceramic, the content of zirconium oxide is 5 weight % or more and 20 weight % or less and the content of manganese oxide is 1 weight % or more and 9 weight % or less.

The present invention is also aimed at a glass ceramic substrate obtained by molding the glass ceramic composition according to the first or second aspect into a predetermined shape, and firing the molded glass ceramic composition at a temperature of 1000° C. or lower. The glass ceramic substrate may be a laminate, or may be a single layer.

Moreover, the present invention is also aimed at a laminate glass ceramic substrate of a combined structure including a low dielectric constant layer and a high dielectric constant layer laminated with the low dielectric constant layer.

In the laminate glass ceramic substrate of the present invention, the low dielectric constant layer is formed by firing the above glass ceramic composition of the first or the second aspect of the present invention.

The high dielectric constant layer is formed by firing a glass ceramic composition including a fifth ceramic having strontium zirconate as the main constituent, a sixth ceramic having strontium titanate as the main constituent, a seventh ceramic having forsterite as the main constituent, and a second borosilicate glass.

The content of the second borosilicate glass is 1 weight % or more and 12 weight % or less, and the second borosilicate glass is characterized in that the borosilicate glass contains lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 35 weight % on a $SiO_2$ equivalent basis and zinc in an amount of 6 to 20 weight % on a ZnO equivalent basis, and further contains a second additive constituent including at least one of calcium oxide and strontium oxide, wherein the upper limit of the content of the second additive constituent is 15 weight % on a CaO equivalent basis in the case of calcium oxide and is 25 weight % on a SrO equivalent basis in the case of strontium oxide when the content of the second additive constituent is represented as the percentage in the second borosilicate glass.

The high dielectric glass ceramic composition may further include zirconium oxide and/or manganese oxide. Here, the content of zirconium oxide is selected so as to be 5 weight % or more and 20 weight % or less, and the content of manganese oxide is selected so as to be 1 weight % or more and 9 weight % or less.

Effects of the Invention

In accordance with the glass ceramic composition of the present invention, it is possible to fire a glass ceramic composition at a temperature of 1000° C. or lower, and a glass ceramic sintered body, which is obtained by this firing, can have a relatively low relative permittivity and a stable temperature characteristic, and can have not only high electric insulation reliability, but also a higher Q value and higher plating solution resistance than those of a sintered body prepared by firing the glass ceramic composition described in the above Patent Document 1.

Improvements in the Q value and plating solution resistance described above are by virtue of the addition of the fourth ceramic having zirconium oxide or manganese oxide as the main constituent, and are likely to be because crystallization of the glass is promoted by the addition of zirconium oxide or manganese oxide.

In addition, when the glass ceramic composition contains a high content of barium (Ba), a crystal made of Ba—B is deposited and this crystal has low plating solution resistance, and high plating solution resistance is not achieved in the sintered body. In the glass ceramic composition of the present invention, the content of the third ceramic having barium zirconate as the main constituent is as low as 8 weight % or less. Also the borosilicate glass contained in the glass ceramic composition described in Patent Document 1 can contain barium, but the borosilicate glass contained in the glass ceramic composition of the present invention does not contain barium. As described above, the glass ceramic composition of the present invention is thus characterized by containing less barium.

When the glass ceramic composition of the present invention includes both of zirconium oxide and manganese oxide as the main constituent of the fourth ceramic, the mechanical strength of a glass ceramic substrate obtained by firing the glass ceramic composition can be improved. The crystallization of glass is promoted by the addition of zirconium oxide or manganese oxide as described above, but when both of zirconium oxide and manganese oxide are added, the promotion of the crystallization of glass does not occur uniformly within a substrate and tends to occur in the vicinity of the surface of the substrate. Therefore, it is estimated that the thermal expansion coefficient decreases in the vicinity of the surface of the substrate compared to the inside of the substrate, and the compression stress acts in the vicinity of the surface by a difference in thermal expansion coefficient between the vicinity of the surface and the inside, and therefore mechanical strength is improved.

Since the glass ceramic composition of the present invention can be fired at a temperature of 1000° C. or lower, copper or silver can be used as the main constituent of the wiring conductors if a glass ceramic substrate is formed by use of the glass ceramic composition and a ceramic substrate suitable for high-frequency applications can be formed.

Further, since the borosilicate glass in accordance with the glass ceramic composition of the present invention contains at least one of calcium oxide and strontium oxide as an additive constituent, the electric insulation reliability of a glass ceramic sintered body obtained by firing the glass ceramic composition can be improved. A mechanism of improving the insulation reliability is not exactly ascertained, but the mechanism is likely as follows.

The sintered body obtained by firing the glass ceramic composition of the present invention basically includes a $Mg_2SiO_4$ crystal phase from the first ceramic and a Mg—Si—B—Zn—Li based glass phase from a borosilicate glass, and further has a microscopic structure in which a $Li_2(Mg,Zn)SiO_4$ crystal phase is deposited in the Mg—Si—B—Zn—Li based glass phase. Here, when the glass ceramic composition contains $TiO_2$ as the second ceramic, a $MgTiO_3$ or $MgTi_2O_5$ crystal phase is further deposited, and a crystal phase of the $AB_2O_5$ type, such as $MgTi_2O_5$, may be a major cause of deteriorating insulation reliability. If Ca and/or Sr are previously added to the glass phase, these react with $TiO_2$ to form a crystal phase of $ABO_3$ type, such as $CaTiO_3$ and $SrTiO_3$, and a crystal phase of the $AB_2O_5$ type is hardly formed. That is, since the crystal phase of $ABO_3$ type, such as $CaTiO_3$ and $SrTiO_3$, is preferentially deposited over the crystal phase of $AB_2O_5$ type such as $MgTi_2O_5$, the deposition of a crystal phase of $AB_2O_5$ type such as $MgTi_2O_5$ is consequently inhibited, and the deterioration of insulation reliability is suppressed.

If a laminate glass ceramic substrate is formed by use of the glass ceramic composition of the present invention, the glass ceramic layer provided therein can be thinner.

In the glass ceramic composition of the present invention, the content of the borosilicate glass can be reduced to 20 weight % or less. Since the borosilicate glass is relatively expensive, it is economically advantageous if the content of the borosilicate glass can be reduced as described above. Moreover, a reduction in the content of the borosilicate glass makes it easy to control the reaction of the second ceramic as an additive substance with the glass, and makes it easy to control the temperature coefficient ($\tau_f$) of a resonance frequency by the additive substance.

In accordance with the laminate glass ceramic substrate of the present invention, defects such as peeling, cracks, and pores can be suppressed. It is believed that addition of at least one of zirconium oxide and manganese oxide to the glass ceramic composition of the present invention to form the low dielectric constant layer significantly contributes to this.

That is, when both of zirconium oxide and manganese oxide are not added to the glass ceramic composition, a glass constituent in the glass ceramic composition having the forsterite as the main constituent tends to diffuse to a high dielectric constant layer side to cause a zirconate salt in the composition on the high dielectric constant layer side to decompose. Consequently, the difference in the thermal expansion coefficient between the low dielectric constant layer and the high dielectric constant layer is increased, and defects are easily produced in a co-sintered body. On the other hand, when at least one of zirconium oxide and manganese oxide is added to the glass ceramic composition, the crystallization of glass is promoted, and therefore the glass constituent is hardly fluidized to suppress the above-mentioned diffusion of the glass constituent, the decomposition of a zirconate salt on the high dielectric constant layer side is reduced, and consequently the difference in the linear expansion coefficient between the low dielectric constant layer and the high dielectric constant layer is reduced, and a good co-sintered body, in which the occurrence of the defects is suppressed, is obtained.

When a high dielectric constant layer provided in the laminate glass ceramic substrate of the present invention includes zirconium oxide and/or manganese oxide in a predetermined amount, warpage which can be produced during co-firing can be reduced.

BRIEF EXPLANATION OF DRAWINGS

FIG. 7(a) is a front view showing an internal structure of a second co-sintered body 72 for electrical property evaluation prepared in Experiment Example 4, and FIG. 7(b) is a plan view showing the internal structure.

FIG. 8 is a perspective view showing an appearance of a co-sintered body 81 for structural defect evaluation prepared in Experiment Example 4.

BEST MODE FOR CARRYING OUT THE INVENTION

Figure 1:
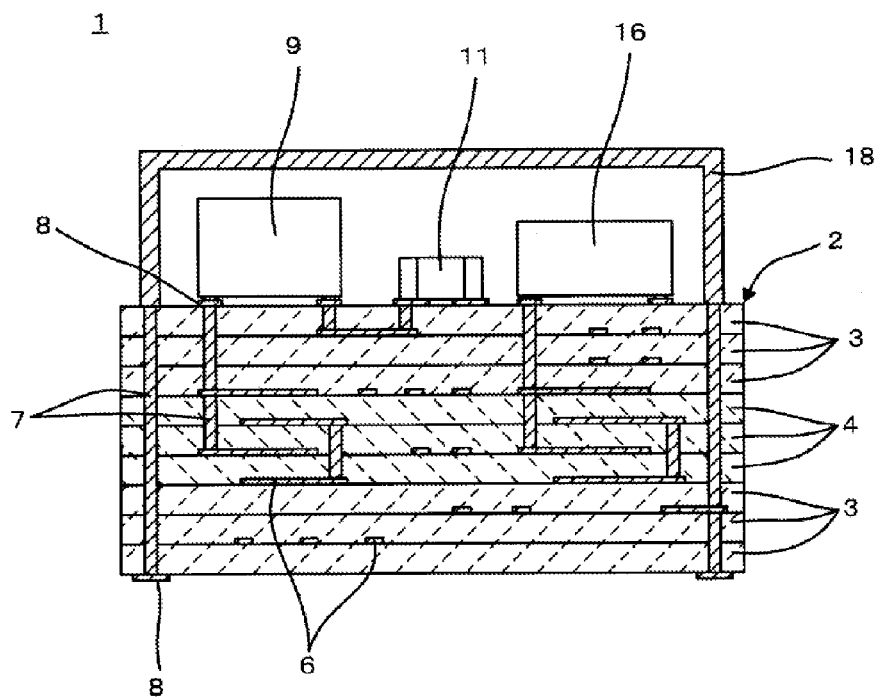
FIG. 1 is a sectional view showing a ceramic multilayer module 1 including a laminate glass ceramic substrate 2 configured by use of the glass ceramic composition of the present invention.

A glass ceramic composition of the present invention include a first ceramic having forsterite ($Mg_2SiO_4$) as the main constituent, and includes, as additive substances, a second ceramic having at least one of strontium titanate ($SrTiO_3$) and titanium oxide ($TiO_2$) as the main constituent, a third ceramic having barium zirconate ($BaZrO_3$) as the main constituent, and a fourth ceramic having zirconium oxide ($ZrO_2$) and/or manganese oxide (MnO) as the main constituent, and further includes a borosilicate glass.

The borosilicate glass contains lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 35 weight % on a $SiO_2$ equivalent basis, zinc in an amount of 6 to 20 weight % on a ZnO equivalent basis, and aluminum in an amount of 0 to 15 weight % on an $Al_2O_3$ equivalent basis. The borosilicate glass preferably has the composition in which a crystal phase of $Li_2(Mg,Zn)SiO_4$ can be precipitated in that a higher Q value and higher reliability (moisture resistance) can be realized in a sintered body.

Lithium contained in the borosilicate glass is a constituent for forming $Li_2(Mg,Zn)SiO_4$, and acts so as to lower the sintering temperature of the glass ceramic composition. The content of lithium is limited to 3 to 15 weight % calculated as $Li_2O$ (i.e., on a $Li_2O$ equivalent basis) in the borosilicate glass because when the content is less than 3 weight %, it is impossible to make the borosilicate glass compact at a temperature of 1000° C. or lower, a crystal phase of $Li_2(Mg,Zn)SiO_4$ is not deposited in a sintered body and the Q value is deteriorated, and on the other hand when the content is more than 15 weight %, a crystal phase of $Li_2(Mg,Zn)SiO_4$ is not deposited in a sintered body, the Q value is deteriorated, and plating solution resistance and insulation reliability are deteriorated. The content of lithium is more preferably 4 to 10 weight % on the $Li_2O$ equivalent basis, and thereby a Q value of the sintered body can be higher.

The magnesium contained in the borosilicate glass is a constituent for forming a crystal phase of $Li_2(Mg,Zn)SiO_4$, and acts so as to lower a melting temperature in preparing the glass. The content of magnesium is limited to 20 to 50 weight % on a MgO equivalent basis in the borosilicate glass because when the content is less than 20 weight %, a crystal phase of $Li_2(Mg,Zn)SiO_4$ is not deposited in a sintered body and a Q value is deteriorated, and on the other hand when the content is more than 50 weight %, the glass devitrifies.

"Denitrify" means that a part of the glass is crystallized. When having a certain specific composition, the glass is easily crystallized at the time when a melted raw material powder is quenched and the glass devitrifies, but the amount of the deposited crystal is unstable because crystallization depends on cooling conditions. Consequently, the sintering property of the glass ceramic composition or dielectric characteristics of the glass ceramic sintered body may be affected. Further, the glass ceramic is sometimes sintered employing a reduction in glass viscosity immediately before crystallization. Also in this case, should a part of the glass be crystallized and an amount of crystallization is unstable, it is thought that the crystallization affects the sintering property of the glass ceramic composition or dielectric characteristics of the glass ceramic sintered body, and if crystallization is significant, the glass ceramic composition is not sometimes sintered.

The content of magnesium is more preferably 30 to 45 weight % on the MgO equivalent basis. Thereby, a Q value of the sintered body can be higher.

The content of boron is limited to 15 to 30 weight % on the $B_2O_3$ equivalent basis in the borosilicate glass because when the content is less than 15 weight %, vitrification is difficult, and on the other hand, when the content is more than 30 weight %, moisture resistance in a sintered body is deteriorated, crystallinity is decreased, a Q value is deteriorated, and plating solution resistance and insulation reliability are deteriorated.

"Vitrification is difficult" means that since the contents of network forming oxides ($SiO_2$, $B_2O_3$, etc.) are small, the glass ceramic composition is not amorphous (vitriform). If an amount of the network forming oxide is small, the glass ceramic composition forms only a calcined substance.

The content of boron is more preferably 15 to 25 weight % on the $B_2O_3$ equivalent basis. Thereby a Q value is higher in the sintered body and reactivity of glass with $SrTiO_3$ and $TiO_2$ is reduced.

Silicon contained in the borosilicate glass is a constituent for forming a crystal phase of $Li_2(Mg,Zn)SiO_4$. The content of silicon is limited to 10 to 35 weight % on the $SiO_2$ equivalent basis in the borosilicate glass because when the content is less than 10 weight %, the glass devitrifies, and on the other hand when the content is more than 35 weight %, sintering is difficult at a temperature of 1000° C. or lower. The content of silicon is more preferably 15 to 30 weight % on the $SiO_2$ equivalent basis. Thereby, a Q value of the sintered body can be higher.

More preferably, the content of silicon contained in the borosilicate glass is limited to 23.5 to 26.5 weight % on the $SiO_2$ equivalent basis. Thereby, the capacity regulation before and after a load test in the case where the glass ceramic composition of the present invention is used in a capacitance forming element, such as a capacitor, can be suppressed below 0.5% in terms of an absolute value. Capacity regulation is determined by the following equation.

Capacity regulation(%)={$(C_1-C_0)/C_0$}×100

In the above equation, $C_0$ is the capacity before the test and $C_1$ is the capacity after the test. Further, the load test, in which the above-mentioned capacity regulation of 0.5% or less is determined, is an acceleration test performed for 100 hours under the conditions of a temperature of 120° C., a relative humidity of 95% and application of a DC voltage of 15 V.

Even though the preferred range of the content of silicon in the borosilicate glass is 20 to 26.5 weight % from the above less restrictive range, an effect similar to that described above for the less restrictive range can be achieved by separately adding silicon in an amount of 1 part by weight or less on the $SiO_2$ equivalent basis with respect to 100 parts by weight of the sum of the first ceramic, the second ceramic, the third ceramic, the fourth ceramic and the borosilicate glass.

If the capacity regulation of the capacitor can be kept below 0.5% or less in an absolute value, fluctuations of a filter's characteristics due to the capacity regulation can be reduced when a capacitance forming element is used for configuring the filter. In addition, if the capacity regulation is more than 0.5% in an absolute value, the fluctuations of the filter characteristics due to the capacity regulation reaches an unacceptable level and is not preferable.

Zinc contained in the borosilicate glass is a constituent for forming a crystal phase of $Li_2(Mg,Zn)SiO_4$, and has an effect of enhancing a Q value of a sintered body. The content of zinc is limited to 6 to 20 weight % on the ZnO equivalent basis in the borosilicate glass because when the content is less than 6 weight %, $Li_2(Mg,Zn)SiO_4$ is not formed in a sintered body, and this may cause a Q value and plating solution resistance to deteriorate, and further may cause insulation reliability to deteriorate, and on the other hand when the content is more than 20 weight %, plating solution resistance and insulation reliability of a sintered body are deteriorated.

The glass ceramic composition of the present invention is adapted to include the borosilicate glass in an amount of 3 to 20 weight %.

The glass ceramic composition is adapted to include the borosilicate glass in an amount of 3 weight % or more because when the content is less than 3 weight %, the borosilicate glass may not be compact at a temperature of 1000° C. or lower. On the other hand the content of the borosilicate glass is 20 weight % or less because when the content is more than 20 weight %, the amount of glass, which is expensive, increases, and it is economically disadvantageous. Further, when the amount of glass increases, the proportion of the above-mentioned crystal phase tends to relatively decrease, and a Q value of the resulting sintered body may decrease.

In other words, a lower content of the borosilicate glass is preferable, provided that the content is 3 weight % or more, and even the content of 20 weight % or less, and for example, 15 weight % or less is also sufficient. When the content of the borosilicate glass is reduced in this way, it becomes easy to control a reaction of the second ceramic as an additive substance with glass, and it becomes easy to control the temperature characteristic of a resonance frequency by the additive substance.

To the borosilicate glass contained in the glass ceramic composition of the present invention, an additive constituent including at least one of calcium oxide and strontium oxide is added in order to improve electrical insulation reliability.

When the content of the additive constituent is represented by the percentage in the borosilicate glass, the upper limit of the content of the additive constituent is 15 weight % on the CaO equivalent basis in the case of calcium oxide and is 25 weight % on the SrO equivalent basis in the case of strontium oxide. The content of calcium oxide as the additive constituent is limited to 15 weight % or less on the CaO equivalent basis because insulation reliability and a Q value are deteriorated when the content is more than 15 weight %. Further, the content of strontium oxide as the additive constituent is limited to 25 weight % or less on the SrO equivalent basis because a Q value may be deteriorated when the content is more than 25 weight %.

In addition, calcium oxide and strontium oxide as the additive constituent can achieve a larger effect on the improvement in insulation reliability by being used in combination.

The lower limit of the content of the additive constituent is preferably 2 weight % in terms of the sum of calcium oxide on the CaO equivalent basis and strontium oxide on the SrO equivalent basis. The content of the additive constituent is preferably 2 weight % or more because the effect of improving insulation reliability cannot be substantially achieved when the content is less than 2 weight %.

The glass ceramic composition of the present invention preferably includes the first ceramic in an amount of 55 weight % or more, and is adapted to include the second ceramic in an amount of 3 weight % or more and 13 weight % or less when the second ceramic has strontium titanate as the main constituent and in an amount of 0.3 weight % or more and 10 weight % or less when the second ceramic has titanium oxide as the main constituent.

Forsterite, which is a main constituent of the first ceramic, has a $\tau_f$ of −60 ppm/° C. $SrTiO_3$, which is a main constituent of the second ceramic, has a $\tau_f$ of +1700 ppm/° C., and similarly $TiO_2$ has a $\tau_f$ of +450 ppm/° C. Further, the borosilicate glass has a negative $\tau$. In order to attain a $\tau$ within ±30 ppm/° C., the above-mentioned formulation is preferable.

Forsterite, the main constituent of the first ceramic, is preferably a ceramic in which a molar ratio of MgO and $SiO_2$ is 1.92 to 2.04 in terms of the $MgO/SiO_2$ ratio. The reason for this is that when the $MgO/SiO_2$ ratio is less than 1.92 or more than 2.04, chemical stability of a sintered body may be deteriorated. Further, the first ceramic has forsterite ($Mg_2SiO_4$) as a main crystal phase, but the first ceramic may have no other phase, or may contain at least one of $SiO_2$ (quartz), MgO and $MgSiO_3$ (steatite) in a trace amount as another crystal phase.

A median grain diameter D50 of the first ceramic is preferably 1 μm or less. The reason for this is that when the median grain diameter D50 is more than 1 μm, the ceramic is not densified when the content of the borosilicate glass is in the range of 3 to 20 weight % in some cases.

The second ceramic as the additive substance acts so as to adjust temperature characteristics of a resonance frequency in a sintered body, and its effect is adequately exerted if the content of $SrTiO_3$ is 3 weight % or more in the case where the second ceramic has $SrTiO_3$ as the main constituent, and if the content of $TiO_2$ is 0.3 weight % or more in the case where the second ceramic has $TiO_2$ as the main constituent.

Further, when the second ceramic has $SrTiO_3$ as the main constituent, the content of $SrTiO_3$ is limited to 13 weight % or less. The reason for this is that if the content of $SrTiO_3$ is more than 13 weight %, the Q value may be reduced in a sintered body, and relative permittivity increases to have an effect on transmission rates in a high-frequency zone. Further, when the second ceramic has $TiO_2$ as the main constituent, the content of $TiO_2$ is limited to 30 weight % or less. The reason for this is that if the content of $TiO_2$ is more than 30 weight %, relative permittivity increases in a sintered body to have an effect on transmission rates in a high-frequency zone. Further, $TiO_2$ has an effect of increasing a crystallinity, but in order to adequately exert this effect, the content of $TiO_2$ is 0.3 weight % or more as described above.

Further, as described above, the second ceramic has a role of controlling temperature characteristics of the resonance frequency, and in order to control to the $\tau_f$ in addition to this role, the relative permittivity in the case where $SrTiO_3$ is used as the second ceramic can be lower than that in the case where $TiO_2$ is used as the second ceramic. With respect to $TiO_2$, the degree of contribution to promotion of the crystallization of glass (i.e., increase in Q value and improvement in moisture resistance of the sintered body) increases.

Further, when a combination of $SrTiO_3$ and $TiO_2$ is selected, it is preferred that the amount of $SrTiO_3$ based ceramic is 6 to 10 weight % and the amount of $TiO_2$ based ceramic is 0.3 to 3 weight % with respect to the total weight of the glass ceramic composition in order to reduce the dielectric constant of the sintered body or promote the crystallization of glass without largely deteriorating other characteristics.

When the amount of $SrTiO_3$ based ceramic is less than 6 weight %, the temperature coefficient of the resonance frequency of the sintered body tends to increase on the minus side. On the other hand, when the amount of $SrTiO_3$ based ceramic is more than 10 weight %, the Q value of the sintered body tends to decrease. Moreover, when the amount of $TiO_2$ based ceramic is less than 0.3 weight %, there is a tendency that a crystal phase of $TiO_2$ is hardly deposited. On the other hand, when the amount is more than 3 weight %, the temperature coefficient of a resonance frequency of the sintered body tends to increase on a minus side.

Further, when the second ceramic has strontium titanate as the main constituent, the strontium titanate is preferably one in which a molar ratio of SrO and $TiO_2$ is 0.92 to 1.05 in terms of a $SrO/TiO_2$ ratio.

When the $SrO/TiO_2$ ratio is more than 1.05, unreacted SrO may remain in the form of a carbonate, and the remaining SrO may cause a reduction in the Q value, or may react with the glass constituent to deteriorate moisture resistance. Further, a crystal phase of $Sr_2TiO_4$ may be deposited. The absolute value of the temperature coefficient (TCC) of the dielectric constant thereof is smaller than that of $SrTiO_3$. If $Sr_2TiO_4$ is deposited, the additive amount must be increased in order to adjust TCC of the whole system, and therefore the Q value may deteriorate.

On the other hand, $SrTiO_3$ and $TiO_2$ may be deposited when the $SrO/TiO_2$ ratio is less than 0.92. In the present invention, since $TiO_2$ may be added separately, by adjusting the respective additive amounts of $SrTiO_3$ and $TiO_2$, there is no problem with respect to electrical properties, but it is complicated to adjust the respective additive amounts of $SrTiO_3$ and $TiO_2$ in each case, leading to cost increases.

In the ceramic having strontium titanate as the main constituent, the amount of impurities other than strontium titanate is more preferably 1 weight % or less. Examples of the impurities include contamination at a raw material stage and contamination during production. Examples of the impurities include $Nb_2O_5$, $Fe_2O_3$, and $Na_2O$. When the content of these impurities is more than 1 weight % singly or as a total amount, the Q value may be deteriorated.

The specific surface area of a ceramic powder having strontium titanate as the main constituent is more preferably 1.5 to 7.5 $m^2/g$. The reason for this is that when the specific surface area is less than 1.5 $m^2/g$, the powder may be hard to sinter, and on the other hand, when the specific surface area is more than 7.5 $m^2/g$, the reactivity of strontium titanate with glass is increased, and the Q value may be deteriorated.

Further, it is more preferred in the ceramic having strontium titanate as the main constituent that the integral intensity of an X-ray diffraction peak for $SrTiO_3$ (222) plane of the ceramic is 1000 or more. The reason for this is that when the integral intensity is less than 1000, the crystallinity of $SrTiO_3$ is not so high, reactivity with glass increases and a Q value is decreased in some cases.

The glass ceramic composition described above can be fired at a temperature of 1000° C. or lower, and the glass ceramic sintered body obtained thereby is a sintered body in which a $Mg_2SiO_4$ crystal phase is deposited as a main phase and a $Li_2(Mg,Zn)SiO_4$ crystal phase is deposited as a sub phase, and is favorably used for forming a ceramic substrate.

The glass ceramic composition of the present invention is adapted to include the third ceramic having barium zirconate as the main constituent in an amount of 4 weight % or more and 8 weight % or less. Barium zirconate can keep the capacity regulation before and after a load test in the case where the glass ceramic composition is used in a capacitance forming element low while maintaining a high Q value and a stable temperature coefficient ($\tau_f$) of a resonance frequency.

The effect of keeping the capacity regulation low is higher than the case where the content of silicon in the above-mentioned borosilicate glass is limited to the range of 23.5 to 26.5 weight %. The capacity regulation even before and after a load test, which is performed for 100 hours under more severe conditions, i.e., a temperature of 150° C., a relative humidity of 95% and application of a DC voltage of 200 V, than those in the above-mentioned load test, can be suppressed to 0.3% or less in terms of an absolute value.

When the glass ceramic composition further includes the third ceramic as described above, it becomes possible to obtain a glass ceramic sintered body which is adequately sintered even though the content of the borosilicate glass is reduced, and the content of the first ceramic can be relatively increased. Therefore, a Qf value of 10000 GHz or more can be attained surely and a temperature coefficient ($\tau_f$) of a resonance frequency within ±30 ppm/° C. can be attained surely.

In the glass ceramic composition of the present invention, the fourth ceramic having zirconium oxide and/or manganese oxide as the main constituent is formed so as to include zirconium oxide in an amount of 5 weight % or more and 20 weight % or less when having zirconium oxide as the main constituent, and is formed so as to include manganese oxide in an amount of 1 weight % or more and 9 weight % or less when having manganese oxide as the main constituent. Zirconium oxide and manganese oxide act so as to enhance the Q value and plating solution resistance of a sintered body obtained by firing the glass ceramic composition. The reason for this is likely that crystallization of glass is promoted by addition of at least one of zirconium oxide and manganese oxide.

When the content of zirconium oxide is less than 5 weight % or the content of MnO is less than 1 weight %, the above-mentioned operation and effect are not adequately achieved, and on the other hand when the content of zirconium oxide is more than 20 weight % or the content of MnO is more than 9 weight %, the relative permittivity of the sintered body is undesirably increased.

The glass ceramic composition of the present invention may include both of zirconium oxide and manganese oxide as the main constituent of the fourth ceramic. In this case, the effect of improving mechanical strength of a glass ceramic substrate is achieved in addition to the effect of promoting the crystallization of glass described above.

Figure 2:
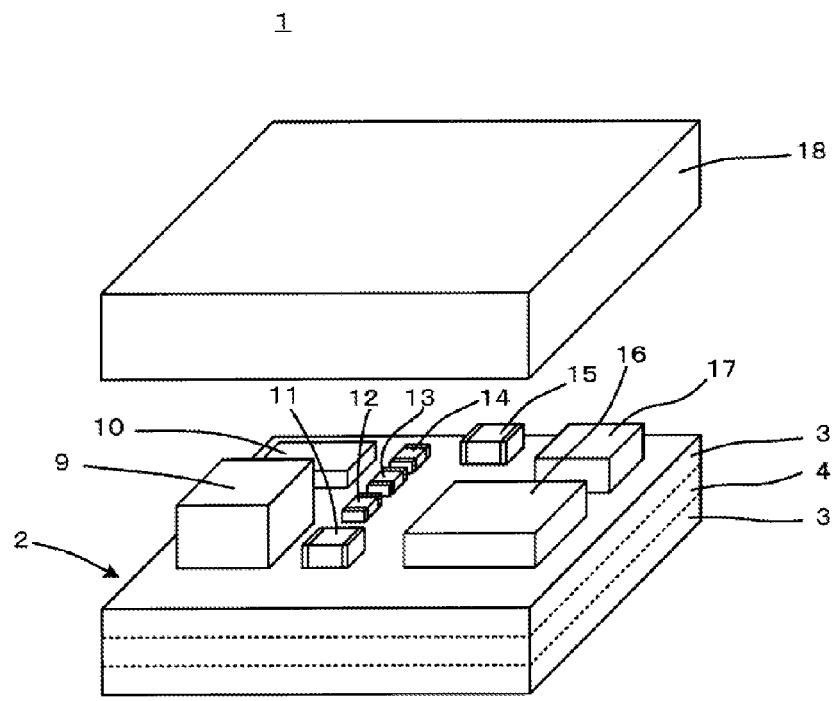
FIG. 2 is an exploded perspective view of the ceramic multilayer module 1 shown in FIG. 1.

FIG. 1 is a sectional view showing a ceramic multilayer module 1 configured by use of the glass ceramic composition of the present invention, and FIG. 2 is an exploded perspective view of the ceramic multilayer module 1 shown in FIG. 1.

The ceramic multilayer module 1 includes the laminate glass ceramic substrate 2. The laminate glass ceramic substrate 2 has a combined structure in which a plurality of the laminated low dielectric constant layers 3 and a plurality of the laminated high dielectric constant layers 4 are provided, and the plurality of the laminated low dielectric constant layers 3 are arranged in such a way that the plurality of the laminated high dielectric constant layers 4 are sandwiched between the plurality of the laminated low dielectric constant layers 3.

The low dielectric constant layer 3 is composed of a glass ceramic sintered body obtained by firing the glass ceramic composition of the present invention, and has a relatively low relative permittivity of, for example, 10 or less.

The high dielectric constant layer 4 has the composition described later and a relative permittivity thereof is 15 or more, preferably 25 or more.

The laminate glass ceramic substrate 2 includes various wiring conductors. Examples of the wiring conductor typically include internal conducting films 6 formed along a specific interface between the layer 3 and the layer 4, via hole conductors 7 extending through specific ones of the layer 3 and the layer 4, and external conducting films 8 formed on the outer surface of the laminate glass ceramic substrate 2.

Among the above internal conducting films 6, some of internal conducting films provided associated with the high dielectric constant layer 4 are arranged so as to give a capacitance, and a capacitor element is composed thereof.

A plurality of electronic components 9 to 17 are mounted on the upper surface of the laminate glass ceramic substrate 2. Among the electronic components 9 to 17 shown, for example, electronic component 9 is a diode, electronic component 11 is a laminate ceramic capacitor, and electronic component 16 is a semiconductor IC. While these electronic components 9 to 17 are electrically connected to specific ones of the external conducting films 8 formed on the upper surface of the laminate glass ceramic substrate 2, they form a circuit required by the ceramic multilayer module 1 with the wiring conductors formed within the laminate glass ceramic substrate 2.

A conducting cap 18 for shielding the electronic components 9 to 17 is fixed to the upper surface of the laminate glass ceramic substrate 2. The conducting cap 18 is electrically connected to a specific one of the via hole conductor 7 described above.

Further, the ceramic multilayer module 1 is mounted on a mother board (not shown) using specific ones of the external conducting films 8 formed on the lower surface of the laminate glass ceramic substrate 2 as a connecting terminal.

The ceramic multilayer module 1 can be manufactured by use of the known technology of firing a ceramic laminate integrally.

That is, first, a low dielectric ceramic green sheet for a low dielectric constant layer 3 is prepared. More specifically, an organic vehicle including a binder resin and a solvent is added to a low dielectric glass ceramic composition (i.e., a raw material composition) of the present invention to obtain a ceramic slurry. The ceramic slurry is formed into a sheet by a doctor blade method, dried, and then stamped into a predetermined dimension, and thereby a low dielectric ceramic green sheet is obtained. Then, a conductive paste, having copper or silver as the main constituent, is provided with a desired pattern for the low dielectric ceramic green sheet in order to form wiring conductors.

Also, a ceramic green sheet with a high dielectric constant including a high dielectric glass ceramic composition for a high dielectric constant layer 4 is prepared. More specifically, as the high dielectric glass ceramic composition, a glass ceramic composition, which includes a fifth ceramic having strontium zirconate as the main constituent, a sixth ceramic having strontium titanate as the main constituent, a seventh ceramic having forsterite as the main constituent and a borosilicate glass, is prepared. The high dielectric glass ceramic composition may further include zirconium oxide and/or manganese oxide. Herein, the content of zirconium oxide is selected so as to be 5 weight % or more and 20 weight % or less, and the content of manganese oxide is selected so as to be 1 weight % or more and 9 weight % or less.

The content of the above borosilicate glass is 1 weight % or more and 12 weight % or less. Further, the borosilicate glass contains lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 35 weight % on a $SiO_2$ equivalent basis and zinc in an amount of 6 to 20 weight % on a ZnO equivalent basis, and further contains an additive constituent including at least one of calcium oxide and strontium oxide, wherein the upper limit of the content of the additive constituent is 15 weight % on a CaO equivalent basis in the case of calcium oxide and is 25 weight % on a SrO equivalent basis in the case of strontium oxide when the content of the additive constituent is represented by the percentage in the borosilicate glass.

Next, an organic vehicle including a binder resin and a solvent is added to the above high dielectric glass ceramic composition to obtain a ceramic slurry. The ceramic slurry is formed into a sheet by a doctor blade method, dried, and then stamped into a predetermined dimension, and thereby a high dielectric ceramic green sheet is obtained. Then, a conductive paste, having copper or silver as the main constituent, is provided with a desired pattern for the high dielectric ceramic green sheet in order to form wiring conductors.

Next, a predetermined number of the low dielectric ceramic green sheets and a predetermined number of the high dielectric ceramic green sheets, which are respectively prepared as described above, are laminated in a predetermine order, and then these sheets are compressed in the thickness direction.

A laminate glass ceramic substrate 2 can then prepared by firing the raw laminate thus obtained at a temperature of 1000° C. or lower, for example, a temperature of 800 to 1000° C. Herein, firing is performed in a non-oxidizing atmosphere such as a nitrogen atmosphere when the wiring conductors have copper as the main constituent, and is performed in an oxidizing atmosphere such as the atmosphere when the wiring conductors have silver as the main constituent.

Next, the electronic components 9 to 17 are mounted on the surface of the laminate glass ceramic substrate 2 by applying soldering, and a conducting cap 18 is attached to complete a ceramic multilayer module 1.

In accordance with the ceramic multilayer module 1 described above, since the low dielectric constant layer 3 provided in the laminate glass ceramic substrate 2 is formed by use of the glass ceramic composition of the present invention and the wiring conductors 6 to 8 are formed of a metal with small specific resistance such as copper or silver as the main constituent, the low dielectric constant layer 3 has a low relative permittivity, excellent temperature characteristics of resonance frequency and a high Q value, and therefore the low dielectric constant layer 3 is suitable for high-frequency applications and a highly reliable ceramic multilayer module 1 can be attained therefrom. Further, the insulation reliability of the ceramic multilayer module 1 can be excellent. Moreover, the plating solution resistance of the laminate glass ceramic substrate 2 can be enhanced.

Further, since zirconium oxide and/or manganese oxide in accordance with the laminate glass ceramic substrate 2 provided in the multilayer module described above is added to the glass ceramic composition to form the low dielectric constant layer 3, the difference in the linear expansion coefficient between the low dielectric constant layer 3 and the high dielectric constant layer 4 can be reduced, and therefore defects such as peeling, cracks, and pores can be suppressed.

The above-mentioned difference in the linear expansion coefficient between the low dielectric constant layer 3 and the high dielectric constant layer 4 causes a warpage of the laminate glass ceramic substrate 2 after firing, but if zirconium oxide and/or manganese oxide is added not only to the glass ceramic composition to form the low dielectric constant layer 3, but also to the glass ceramic composition to form the high dielectric constant layer 4, the warpage can be reduced further.

Figure 3:
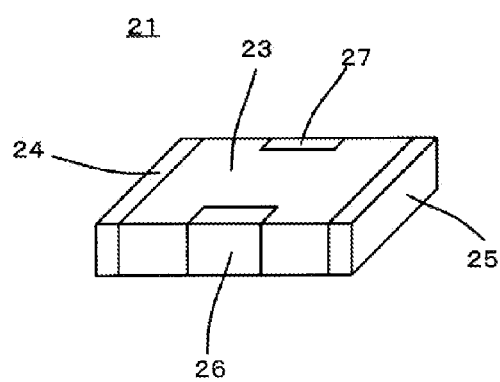
FIG. 3 is a perspective view showing an appearance of an LC filter 21 including a laminate glass ceramic substrate 23 configured by use of the glass ceramic composition of the present invention.
Figure 4:
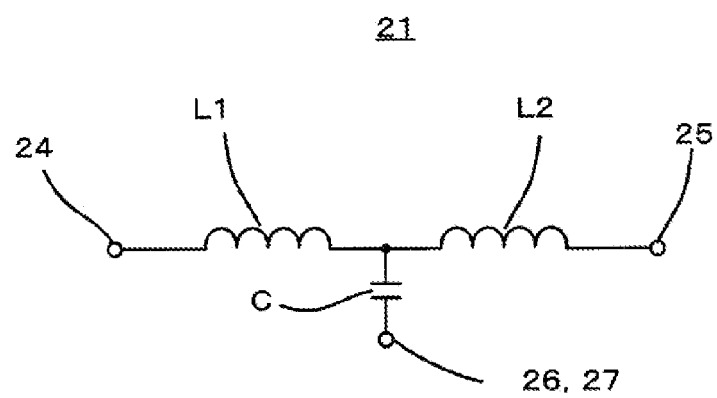
FIG. 4 is an equivalent circuit diagram of the LC filter 21 shown in FIG. 3.
Figure 5:
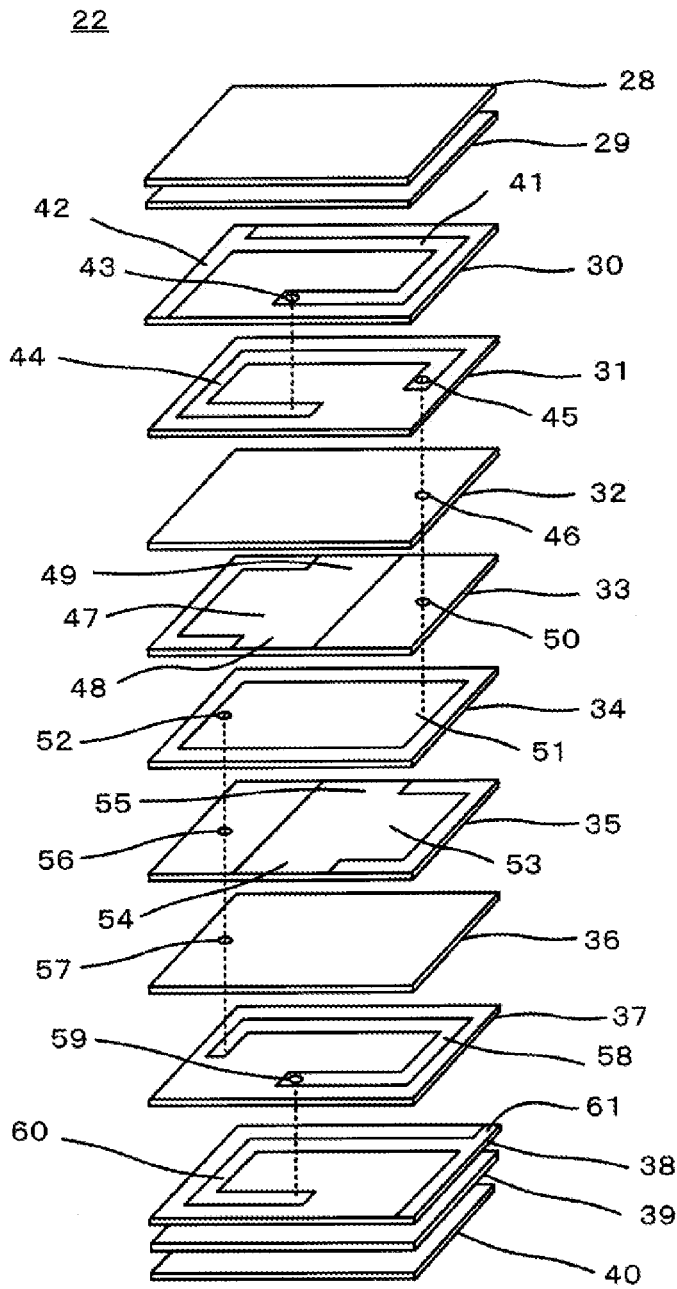
FIG. 5 is an exploded perspective view of a raw laminated product 22 as an intermediate product subjected to a firing step in manufacturing the LC filter 21 shown in FIG. 3.

FIG. 3 or 5 are views for explaining an LC filter 21 configured by use of the glass ceramic composition of the present invention. FIG. 3 is a perspective view showing an appearance of an LC filter 21, FIG. 4 is an equivalent circuit diagram of the LC filter 21, and FIG. 5 is an exploded perspective view of a raw laminate 22 as an intermediate product subjected to a firing step in manufacturing the LC filter.

The LC filter 21 includes the laminate glass ceramic substrate 23 configured by a plurality of the laminated glass ceramic layers as shown in FIG. 3, terminal electrodes 24 and 25 are disposed at both ends on the outer surface of the laminate glass ceramic substrate 23, and terminal electrodes 26 and 27 are disposed at intermediate portions of sides.

The LC filter 21 configures two inductances L1 and L2 connected in series between the terminal electrodes 24 and 25 as shown in FIG. 4 to form a capacitance C between a connecting point of the inductances L1 and L2 and the terminal electrodes 26 and 27.

Referring to FIG. 5, the raw laminate 22 which is to be formed into a laminate glass ceramic substrate 23 by being fired includes a plurality of laminated ceramic green sheets 28 to 40. However, the number of laminated ceramic green sheets is not limited to one shown in FIG. 5.

Each of the ceramic green sheets 28 to 40 is obtained by adding an organic vehicle including a binder resin and a solvent to the glass ceramic composition of the present invention, mixing them to obtain a ceramic slurry, forming the ceramic slurry into a sheet by a doctor blade method, drying the sheet, and then stamping the sheet into a predetermined size.

Further, wiring conductors are disposed in specific sheets of ceramic green sheets 28 to 40 as follows in order to provide the inductances L1 and L2, and the capacitance C as shown in FIG. 4.

On the ceramic green sheet 30, a coil pattern 41 composing a part of the inductance L1 is formed and a lead pattern 42 extending from one end of the coil pattern 41 is formed, and a via hole conductor 43 is disposed at the other end of the coil pattern 41.

On the ceramic green sheet 31, a coil pattern 44 composing a part of the inductance L1 is formed, and a via hole conductor 45 is disposed at one end of the coil pattern 44. The other end of the coil pattern 44 is connected to the above-mentioned via hole conductor 43.

A via hole conductor 46 connected to the via hole conductor 45 is provided in the ceramic green sheet 32.

On the ceramic green sheet 33, a capacitor pattern 47 composing a part of the capacitance C is formed and lead patterns 48 and 49 extending from the capacitor pattern 47 are formed. Further, a via hole conductor 50 connected to the via hole conductor 46 is provided in the ceramic green sheet 33.

On the ceramic green sheet 34, a capacitor pattern 51 composing a part of the capacitance C is formed and a via hole conductor 52 connected to the capacitor pattern 51 is provided. The capacitor pattern 51 is connected to the via hole conductor 50.

On the ceramic green sheet 35, a capacitor pattern 53 composing a part of the capacitance C is formed and lead patterns 54 and 55 extending from the capacitor pattern 53 are formed. Further, a via hole conductor 56 connected to the via hole conductor 52 is provided in the ceramic green sheet 35.

A via hole conductor 57 connected to the via hole conductor 56 is provided in the ceramic green sheet 36.

On the ceramic green sheet 37, a coil pattern 58 composing a part of the inductance L2 is formed, and a via hole conductor 59 is disposed at one end of the coil pattern 58. The other end of the coil pattern 58 is connected to the above-mentioned via hole conductor 57.

On the ceramic green sheet 38, a coil pattern 60 composing a part of the inductance L2 is formed and a lead pattern 61 extending from one end of the coil pattern 60 is formed. The other end of the coil pattern 60 is connected to the above-mentioned via hole conductor 59.

When the coil patterns 41, 44, 58 and 60 as the wiring conductor described above, the lead patterns 42, 48, 49, 54, 55 and 61, the via hole conductors 43, 45, 46, 50, 52, 56, 57 and 59, and the capacitor patterns 47, 51 and 53 are formed, a conductive paste, having copper or silver as the main constituent, is used, and for example, screen printing is applied in order to provide the conductive paste.

In order to obtain a raw laminate 22, the ceramic green sheets 28 to 40 are laminated in an order shown in FIG. 5, and then these sheets are compressed in a direction of thickness.

Thereafter, the laminate glass ceramic substrate 23 shown in FIG. 3 can be prepared by firing the raw laminate 22 at a temperature of 1000° C. or lower, for example, a temperature of 800 to 1000° C. In the ceramic multilayer module 1 described above, firing is performed in a non-oxidizing atmosphere such as a nitrogen atmosphere when the wiring conductors have copper as the main constituent, and is performed in an oxidizing atmosphere such as the atmosphere when the wiring conductors have silver as the main constituent.

Next, the terminal electrodes 24 to 27 are formed on the outer surface of the laminate glass ceramic substrate 23. In order to form these terminal electrodes 24 to 27, for example, application and baking of a conductive paste having copper or silver as the main constituent, or methods of forming a thin film such as vapor deposition, plating and sputtering are applied.

In the manner described above, the LC filter 21 can be obtained.

In the above description, each of the ceramic green sheets 28 to 40 is prepared by use of the low dielectric glass ceramic composition of the present invention, but particularly the ceramic green sheets 33 and 34, which directly contribute to the formation of capacitance C, of the ceramic green sheets 28 to 40 may be prepared by use of the high dielectric glass ceramic composition for forming the high dielectric constant layer 4 provided in the ceramic multilayer module 1 shown in FIG. 1 described above. Moreover, even though both of the low dielectric glass ceramic composition and the high dielectric glass ceramic composition are used, the occurrence of defects such as peeling, cracks, and pores can be suppressed in the laminate glass ceramic substrate 23.

The glass ceramic substrate application of the glass ceramic composition of the present invention is not limited to the glass ceramic substrate provided in the ceramic multilayer module 1 or the LC filter 21, which are shown. For example, the glass ceramic composition of the present invention can also be applied to a various glass ceramic substrates such as a glass ceramic substrate for a multichip module, and a glass ceramic substrate for a hybrid IC, various combined electronic components formed by mounting electronic components on the above-mentioned glass ceramic substrate, and glass ceramic substrates composing various chip-type laminated electronic components such as a chip-type laminated capacitor, and a chip-type laminated dielectric antenna.

Next, Experiment Examples performed in order to verify the characteristics attained by the glass ceramic composition of the present invention and to determine the scope of the present invention will be described.

Experiment Example 1

First, borosilicate glasses with various compositions shown in Table 1 were prepared for use as a borosilicate glass contained in the glass ceramic composition.

TABLE 1

| Glass symbol | Li$_2$O (Wt %) | MgO (Wt %) | CaO (Wt %) | SrO (Wt %) | B$_2$O$_3$ (Wt %) | SiO$_2$ (Wt %) | ZnO (Wt %) | Note |
|---|---|---|---|---|---|---|---|---|
| G1* | 2 | 30.5 | 0 | 15 | 20 | 25 | 7.5 | |
| G2 | 3 | 29.5 | 0 | 15 | 20 | 25 | 7.5 | |
| G3 | 15 | 25 | 0 | 10 | 17.5 | 25 | 7.5 | |
| G4* | 16 | 24 | 0 | 10 | 17.5 | 25 | 7.5 | |
| G5* | 5 | 17.5 | 0 | 20 | 25 | 25 | 7.5 | |
| G6 | 5 | 20 | 0 | 17.5 | 25 | 25 | 7.5 | |
| G7 | 5 | 50 | 0 | 5 | 17.5 | 15 | 7.5 | |
| G8 | 5 | 50 | 5 | 0 | 17.5 | 15 | 7.5 | |
| G9 | 5 | 50 | 3 | 2 | 17.5 | 15 | 7.5 | |
| G10* | 5 | 52.5 | 0 | 2.5 | 17.5 | 15 | 7.5 | Devitrification |
| G11* | 5 | 33.5 | 0 | 15 | 14 | 25 | 7.5 | Devitrification |
| G12 | 5 | 32.5 | 0 | 15 | 15 | 25 | 7.5 | |
| G13 | 5 | 27.5 | 0 | 10 | 30 | 20 | 7.5 | |
| G14* | 5 | 26.5 | 0 | 10 | 31 | 20 | 7.5 | |
| G15* | 5 | 43.5 | 0 | 15 | 20 | 9 | 7.5 | Devitrification |
| G16 | 5 | 42.5 | 0 | 15 | 20 | 10 | 7.5 | |
| G17 | 5 | 25 | 0 | 10 | 17.5 | 35 | 7.5 | |
| G18* | 5 | 24 | 0 | 10 | 17.5 | 36 | 7.5 | |
| G19* | 5 | 30 | 0 | 15 | 20 | 25 | 5 | |
| G20 | 5 | 29 | 0 | 15 | 20 | 25 | 6 | |
| G21 | 5 | 27.5 | 0 | 5 | 17.5 | 25 | 20 | |
| G22* | 5 | 26.5 | 0 | 5 | 17.5 | 25 | 21 | |
| G23* | 5 | 26.5 | 16 | 0 | 20 | 25 | 7.5 | |
| G24 | 5 | 27.5 | 15 | 0 | 20 | 25 | 7.5 | |
| G25 | 5 | 25 | 2.5 | 15 | 20 | 25 | 7.5 | |
| G26* | 5 | 21.5 | 0 | 26 | 20 | 20 | 7.5 | |
| G27 | 5 | 20 | 0 | 25 | 17.5 | 25 | 7.5 | |
| G28 | 5 | 30 | 10 | 2.5 | 20 | 25 | 7.5 | |
| G29 | 5 | 27.5 | 0 | 15 | 20 | 25 | 7.5 | |

In Table 1, those "glass symbol" marked with an asterisk indicates a glass having the composition out of the scope of the present invention.

The glasses shown in Table 1 other than "denitrification" glasses G10, G11 and G15 were pulverized until an average grain diameter of 1 to 2 μm was obtained, to form borosilicate glass powders for glass ceramic compositions.

A Mg$_2$SiO$_4$ powder having an average grain diameter (median grain diameter D50) of 0.8 μm was prepared as a first ceramic to be contained in the glass ceramic composition, a SrTiO$_3$ powder having an average grain diameter of 1.5 μm and a TiO$_2$ powder having an average grain diameter of 1.0 μm were respectively prepared as a second ceramic, a BaZrO$_3$ powder having an average grain diameter of 1.0 μm was prepared as a third ceramic, and a ZrO$_2$ powder having an average grain diameter of 1.0 μm was prepared as a fourth ceramic.

This Experiment Example 1 is characterized by using zirconium oxide (ZrO$_2$) as the fourth ceramic described above.

Next, in order to obtain a glass ceramic composition of each of samples shown in Table 2, the first ceramic, the borosilicate glass, the second ceramic, the third ceramic and the fourth ceramic powders were mixed.

TABLE 2

| Sample number | Amount of first ceramic (Wt %) | Borosilicate glass Kind | Borosilicate glass Amount (Weight %) | Amount of second ceramic (Weight %) SrTiO$_3$ | Amount of second ceramic (Weight %) TiO$_2$ | Amount of third ceramic (Weight %) | Amount of fourth ceramic (Weight %) |
|---|---|---|---|---|---|---|---|
| 1* | 61.0 | G1* | 20.0 | 5.0 | 1.0 | 6.0 | 7.0 |
| 2 | 61.0 | G2 | 20.0 | 5.0 | 1.0 | 6.0 | 7.0 |
| 3 | 78.0 | G3 | 3.0 | 5.0 | 1.0 | 6.0 | 7.0 |
| 4* | 78.0 | G4* | 3.0 | 5.0 | 1.0 | 6.0 | 7.0 |
| 5* | 71.0 | G5* | 10.0 | 5.0 | 1.0 | 6.0 | 7.0 |
| 6 | 71.0 | G6 | 10.0 | 5.0 | 1.0 | 6.0 | 7.0 |
| 7 | 71.0 | G7 | 10.0 | 5.0 | 1.0 | 6.0 | 7.0 |
| 8 | 71.0 | G8 | 10.0 | 5.0 | 1.0 | 6.0 | 7.0 |
| 9 | 71.0 | G9 | 10.0 | 5.0 | 1.0 | 6.0 | 7.0 |
| 10 | 66.0 | G12 | 15.0 | 5.0 | 1.0 | 6.0 | 7.0 |
| 11 | 76.0 | G13 | 5.0 | 5.0 | 1.0 | 6.0 | 7.0 |
| 12* | 76.0 | G14* | 5.0 | 5.0 | 1.0 | 6.0 | 7.0 |
| 13 | 76.0 | G16 | 5.0 | 5.0 | 1.0 | 6.0 | 7.0 |
| 14 | 63.5 | G17 | 17.5 | 5.0 | 1.0 | 6.0 | 7.0 |
| 15* | 63.5 | G18* | 17.5 | 5.0 | 1.0 | 6.0 | 7.0 |
| 16* | 71.0 | G19* | 10.0 | 5.0 | 1.0 | 6.0 | 7.0 |
| 17 | 71.0 | G20 | 10.0 | 5.0 | 1.0 | 6.0 | 7.0 |

TABLE 2-continued

| Sample number | Amount of first ceramic (Wt %) | Borosilicate glass Kind | Borosilicate glass Amount (Weight %) | Amount of second ceramic (Weight %) SrTiO$_3$ | Amount of second ceramic (Weight %) TiO$_2$ | Amount of third ceramic (Weight %) | Amount of fourth ceramic (Weight %) |
|---|---|---|---|---|---|---|---|
| 18 | 71.0 | G21 | 10.0 | 5.0 | 1.0 | 6.0 | 7.0 |
| 19* | 71.0 | G22* | 10.0 | 5.0 | 1.0 | 6.0 | 7.0 |
| 20* | 71.0 | G23* | 10.0 | 5.0 | 1.0 | 6.0 | 7.0 |
| 21 | 71.0 | G24 | 10.0 | 5.0 | 1.0 | 6.0 | 7.0 |
| 22 | 71.0 | G25 | 10.0 | 5.0 | 1.0 | 6.0 | 7.0 |
| 23* | 71.0 | G26* | 10.0 | 5.0 | 1.0 | 6.0 | 7.0 |
| 24 | 71.0 | G27 | 10.0 | 5.0 | 1.0 | 6.0 | 7.0 |
| 25 | 71.0 | G28 | 10.0 | 5.0 | 1.0 | 6.0 | 7.0 |
| 26* | 79.0 | G29 | 2.0 | 5.0 | 1.0 | 6.0 | 7.0 |
| 27 | 78.0 | G29 | 3.0 | 5.0 | 1.0 | 6.0 | 7.0 |
| 28 | 61.0 | G29 | 20.0 | 5.0 | 1.0 | 6.0 | 7.0 |
| 29* | 56.0 | G29 | 25.0 | 5.0 | 1.0 | 6.0 | 7.0 |
| 30 | 72.0 | G29 | 10.0 | 5.0 | 0.0 | 6.0 | 7.0 |
| 31 | 71.7 | G29 | 10.0 | 5.0 | 0.3 | 6.0 | 7.0 |
| 32 | 62.0 | G29 | 10.0 | 5.0 | 10.0 | 6.0 | 7.0 |
| 33* | 59.0 | G29 | 10.0 | 5.0 | 13.0 | 6.0 | 7.0 |
| 34 | 76.0 | G29 | 10.0 | 0.0 | 1.0 | 6.0 | 7.0 |
| 35 | 73.0 | G29 | 10.0 | 3.0 | 1.0 | 6.0 | 7.0 |
| 36 | 63.0 | G29 | 10.0 | 13.0 | 1.0 | 6.0 | 7.0 |
| 37* | 61.0 | G29 | 10.0 | 15.0 | 1.0 | 6.0 | 7.0 |
| 38* | 77.0 | G29 | 10.0 | 5.0 | 1.0 | 0.0 | 7.0 |
| 39 | 73.0 | G29 | 10.0 | 5.0 | 1.0 | 4.0 | 7.0 |
| 40 | 71.0 | G29 | 10.0 | 5.0 | 1.0 | 6.0 | 7.0 |
| 41 | 69.0 | G29 | 10.0 | 5.0 | 1.0 | 8.0 | 7.0 |
| 42* | 67.0 | G29 | 10.0 | 5.0 | 1.0 | 10.0 | 7.0 |
| 43* | 78.0 | G29 | 10.0 | 5.0 | 1.0 | 6.0 | 0.0 |
| 44* | 75.0 | G29 | 10.0 | 5.0 | 1.0 | 6.0 | 3.0 |
| 45 | 73.0 | G29 | 10.0 | 5.0 | 1.0 | 6.0 | 5.0 |
| 46 | 68.0 | G29 | 10.0 | 5.0 | 1.0 | 6.0 | 10.0 |
| 47 | 63.0 | G29 | 10.0 | 5.0 | 1.0 | 6.0 | 15.0 |
| 48 | 58.0 | G29 | 10.0 | 5.0 | 1.0 | 6.0 | 20.0 |
| 49* | 53.0 | G29 | 10.0 | 5.0 | 1.0 | 6.0 | 25.0 |
| 50* | 79.0 | G29 | 10.0 | 0.0 | 0.0 | 6.0 | 5.0 |

In Table 2, sample numbers marked with an asterisk indicate a glass ceramic composition out of the scope of the present invention.

In the respective boxes of "amount of first ceramic", "amount of second ceramic", "amount of third ceramic" and "amount of fourth ceramic" in Table 2, the additive amount of Mg$_2$SiO$_4$ powder as the first ceramic, the additive amounts of SrTiO$_3$ powder and TiO$_2$ powder as the second ceramics, the additive amount of BaZrO$_3$ powder as the third ceramic, and the additive amount of ZrO$_2$ powder as the fourth ceramic are respectively shown.

In a box "Kind" in "borosilicate glass", the "glass symbol" of Table 1 is shown, and similarly in a box "Amount", the additive amount of a borosilicate glass powder is shown.

For the glass ceramic composition of each of the samples, relative permittivity ($\in_r$), Qf value, temperature coefficient ($\tau_f$) of resonance frequency, insulation reliability, capacity regulation, and plating solution resistance were evaluated, as shown in Table 3.

The relative permittivity ($\in_r$) and the Qf value were determined in the following manner. To 100 parts by weight of the glass ceramic composition of each of the samples, 20 parts by weight of an acrylic resin as a binder resin and 30 parts by weight of methyl ethyl ketone as a solvent were added to prepare a slurry, and the slurry was formed by a doctor blade method and then dried to prepare a green sheet. Green sheets were cut, laminated, and attached to one another by pressure to prepare a raw laminate having a size of 50 mm×50 mm and a thickness of 0.6 mm. Next, a ceramic substrate was prepared by firing the raw laminate at a temperature of 1000° C. or lower. The relative permittivity ($\in_r$) and Qf value of the ceramic substrate were measured by a cavity resonator method, setting a measuring frequency at about 25 GHz.

The insulation reliability and the capacity regulation were determined in the following manner. The above green sheet was cut into green sheet pieces, and a conductive paste having Cu as the main constituent was printed on the pieces for forming internal electrodes. These green sheets (pieces) are laminated, attached to one another by pressure, and fired at a temperature of 1000° C. or lower to prepare a laminate ceramic capacitor in which a distance between internal electrodes is 15 μm. Insulation resistance measurement and capacity measurement of the obtained laminate ceramic capacitor by a LCR meter were carried out at the initial stage and after an acceleration test, which was performed for 100 hours under the conditions of a temperature of 121° C., a relative humidity of 100%, a pressure of 2 atm and application of a DC voltage of 200 V. A sample in which the insulation resistance IR after the acceleration test satisfied log IR≥11 was considered as a sample with high insulation reliability and denoted by a symbol "○" in Table 3, and the other samples were denoted by a symbol "x" in Table 3. Further, capacity at the initial stage was taken as $C_0$ and capacity after the acceleration test was taken as $C_1$, and the capacity regulation was determined from the equation:

Capacity regulation(%)={$(C_1-C_0)/C_0$}×100.

The plating solution resistance was measured as follows. The above green sheet was cut, laminated, and attached to one another by pressure to prepare a raw laminate having a size of 10 mm×10 mm and a thickness of 0.8 mm. The raw laminate was fired at a temperature of 1000° C. or lower to obtain a ceramic substrate. The ceramic substrate was continuously dipped for 24 hours in an acidic electrolytic Ni plating bath and an alkaline electrolytic Sn plating bath, respectively, and the ceramic substrate after dipping was dipped in an oil-based red ink, and the erosion state (plating solution resistance) of the surface was judged from the state of being dyed. A ceramic substrate with no dyeing of the red ink were considered as a ceramic substrate having excellent plating solution resistance and denoted by a symbol "◯" in Table 3 and other samples were denoted by a symbol "x" in Table 3.

The temperature coefficient ($\tau_f$) of resonance frequency was determined in the following manner. To 100 parts by weight of the glass ceramic composition of each of the samples shown in Table 2, 20 parts by weight of an acrylic resin as a binder resin and 30 parts by weight of methyl ethyl ketone as a solvent were added, and the resulting mixture was granulated to form a powder which was molded by pressing to obtain a cylindrical molded body of 15 mm in diameter and 8 mm in thickness. The molded body was fired at a temperature of 1000° C. or lower to obtain a glass ceramic sintered body as a sample. A temperature coefficient ($\tau_f$) of resonance frequency of the glass ceramic sintered body was determined by a dielectric resonator method.

TABLE 3

| Sample number | $\epsilon_r$ | Qf value (GHz) | $\tau_f$ (ppm · °C.$^{-1}$) | Insulation reliability | Capacity regulation (%) | Plating solution resistance |
|---|---|---|---|---|---|---|
| 1* | unsintered | — | — | — | — | — |
| 2 | 8.5 | 14000 | 8.1 | ◯ | 0.28 | ◯ |
| 3 | 8.6 | 12000 | −6 | ◯ | 0.17 | ◯ |
| 4* | 8.6 | 8000 | −6 | x | 1.22 | x |
| 5* | 9 | 9500 | 1 | ◯ | 0.18 | ◯ |
| 6 | 9 | 18000 | 1.4 | ◯ | 0.18 | ◯ |
| 7 | 8.6 | 26000 | 2.9 | ◯ | 0.07 | ◯ |
| 8 | 8.6 | 25000 | 2.7 | ◯ | 0.07 | ◯ |
| 9 | 8.6 | 25000 | 2.8 | ◯ | 0.06 | ◯ |
| 10 | 8.5 | 23000 | 4 | ◯ | 0.22 | ◯ |
| 11 | 8.6 | 12000 | −4.7 | ◯ | 0.26 | ◯ |
| 12* | 8.6 | 9000 | −5 | x | 0.42 | x |
| 13 | 8.6 | 18000 | −4.3 | ◯ | 0.30 | ◯ |
| 14 | 8.5 | 14000 | 6.1 | ◯ | 0.30 | ◯ |
| 15* | unsintered | — | — | — | — | — |
| 16* | 8.6 | 10000 | 0.4 | ◯ | 0.05 | x |
| 17 | 8.6 | 15000 | 0.1 | ◯ | 0.03 | ◯ |
| 18 | 8.4 | 13000 | 2.3 | ◯ | 0.27 | ◯ |
| 19* | 8.4 | 10000 | 1.6 | x | 0.37 | x |
| 20* | 8.6 | 10000 | 10.2 | ◯ | 0.18 | x |
| 21 | 8.6 | 14000 | 7.6 | ◯ | 0.14 | ◯ |
| 22 | 8.6 | 27000 | 5.2 | ◯ | 0.04 | ◯ |
| 23* | 8.5 | 10500 | 9.2 | ◯ | 0.11 | x |
| 24 | 8.5 | 18000 | 8 | ◯ | 0.09 | ◯ |
| 25 | 8.7 | 30000 | 2.9 | ◯ | 0.04 | ◯ |
| 26* | unsintered | — | — | — | — | — |
| 27 | 8.7 | 36000 | −6 | ◯ | 0.04 | ◯ |
| 28 | 8.5 | 13000 | 8.1 | ◯ | 0.30 | ◯ |
| 29* | 8.5 | 8000 | 1.2 | ◯ | 0.62 | x |
| 30 | 8.4 | 37000 | −4.2 | ◯ | 0.00 | ◯ |
| 31 | 8.5 | 36000 | −3.2 | ◯ | 0.01 | ◯ |
| 32 | 9.6 | 14000 | 25.8 | ◯ | 0.27 | ◯ |
| 33* | 11.2 | 10000 | 46 | ◯ | 0.50 | ◯ |
| 34 | 8.6 | 36000 | −27.2 | ◯ | 0.02 | ◯ |
| 35 | 8.6 | 34000 | −10.5 | ◯ | 0.02 | ◯ |
| 36 | 8.5 | 21000 | 28.8 | ◯ | 0.30 | ◯ |
| 37* | 8.5 | 21000 | 34.8 | ◯ | 0.62 | ◯ |
| 38* | 7.9 | 41000 | −0.2 | ◯ | 0.62 | ◯ |
| 39 | 7.9 | 38000 | −0.2 | ◯ | 0.30 | ◯ |
| 40 | 8.6 | 34000 | −0.1 | ◯ | 0.02 | ◯ |
| 41 | 9.5 | 23000 | 0 | ◯ | −0.18 | ◯ |
| 42* | 10.0 | 23000 | 0 | ◯ | −0.38 | ◯ |
| 43* | 8.2 | 16000 | −1.5 | ◯ | 0.04 | x |
| 44* | 8.4 | 20000 | −0.9 | ◯ | 0.04 | x |
| 45 | 8.6 | 31000 | −0.6 | ◯ | 0.03 | ◯ |
| 46 | 9.2 | 34000 | −0.1 | ◯ | 0.02 | ◯ |
| 47 | 9.6 | 34000 | 1.3 | ◯ | −0.01 | ◯ |
| 48 | 9.8 | 34000 | 4.3 | ◯ | −0.08 | ◯ |
| 49* | 10.1 | 34000 | 5.8 | ◯ | −0.13 | ◯ |
| 50* | 8.6 | 37000 | −34.2 | ◯ | 0.03 | ◯ |

Also in Table 3, the sample numbers out of the scope of the present invention are marked with an asterisk.

As is obvious from a box "Kind" in "borosilicate glass" in Table 2, the samples within the scope of the present invention shown in Tables 2 and 3 include a borosilicate glass within the scope of the present invention shown in Table 1, and include a $Mg_2SiO_4$ powder as the first ceramic, a powder including at least one of $SrTiO_3$ and $TiO_2$ as the second ceramic, a $BaZrO_3$ powder as the third ceramic, and a $ZrO_2$ powder as the fourth ceramic.

In the samples within the scope of the present invention, the content of the second ceramic is 3 weight % or more and 13 weight % or less when the second ceramic has $SrTiO_3$ as the main constituent, and is 0.3 weight % or more and 10 weight % or less when the second ceramic has titanium oxide ($TiO_2$) as the main constituent, the content of the third ceramic is 4 weight % or more and 8 weight % or less, the content of the fourth ceramic is 5 weight % or more and 20 weight % or less, and the content of the borosilicate glass is 3 weight % or more and 20 weight % or less.

Consequently, in accordance with the samples within the scope of the present invention, it is possible to obtain a glass ceramic sintered body which can be fired at a temperature of 1000° C. or lower, has a low relative permittivity ($\epsilon_r$<10) and a high Qf value (Qf≥10000 GHz), has a stable temperature characteristic ($\tau_f$±30 ppm/°C.) and high reliability (high insulation reliability and a capacity regulation within ±0.3%), and is excellent in plating solution resistance.

On the other hand, glass G1 shown in Table 1 has a content of $Li_2O$ of less than 3 weight %, and therefore the sample 1, using the glass G1, in Tables 2 and 3, was not sintered at a temperature of 1000° C. or lower. Further, glass G4 has a content of $Li_2O$ of more than 15 weight %, and therefore in the sample 4 using the glass G4, the Qf value was deteriorated, insulation reliability was poor, capacity regulation was high, and plating solution resistance was low.

In glass G5, the content of MgO was less than 20 weight %, and therefore in the sample 5 using the glass G5, the Qf value was deteriorated. On the other hand, the content of MgO was more than 50 weight % in glass G10. Therefore, a phenomenon in which a part of glass was crystallized, namely devitrified, occurred.

The content of $B_2O_3$ was less than 15 weight % in glass G11, and therefore devitrification occurred. On the other hand, the content of $B_2O_3$ was more than 30 weight % in the glass G14, and therefore in the sample 12 using the glass G14, the Qf value was deteriorated, insulation reliability was poor, a capacity regulation was high, and plating solution resistance was low.

In glass G15, the content of $SiO_2$ was less than 10 weight %, and therefore devitrification occurred. In glass G18, the content of $SiO_2$ was more than 35 weight %, on the other hand and therefore the sample 15 using the glass G18 was not sintered at a temperature of 1000° C. or lower.

The content of ZnO was less than 6 weight % in glass G19, and therefore the plating solution resistance was low in sample 16 using glass G19. On the other hand, the content of ZnO was more than 20 weight % in glass G22, and therefore sample 19 using glass G22 had poor insulation reliability, a capacity regulation was high, and plating solution resistance was low.

In glass G23, the content of CaO was more than 15 weight %, and therefore in the sample 20 using glass G23, insulation reliability and plating solution resistance were low.

The content of SrO was more than 25 weight % in glass G26, and therefore plating solution resistance was low in the sample 23 using the glass G26.

Glass G29 shown in Table 1 is a glass within the scope of the present invention, but some of samples 26 to 50 shown in Tables 2 and 3, which commonly used glass G29, are out of the scope of the present invention, and these samples out of the present invention will be described.

In sample 26, the content of the borosilicate glass was less than 3 weight % as shown in Table 2, and the sample was not sintered at a temperature of 1000° C. or lower as shown in Table 3. On the other hand, the content of the borosilicate glass in sample 29 was more than 20 weight % as shown in Table 2, and capacity regulation was high and plating solution resistance was low as shown in Table 3.

In sample 33, the relative permittivity ($\in_r$) was high, the temperature coefficient ($\tau_f$) of a resonance frequency was large, and the capacity regulation was high, as shown in Table 3 since the content of $TiO_2$ as the second ceramic was more than 10 weight % as shown in Table 2. Further, sample 37 had a content of $SrTiO_3$ as the second ceramic of more than 13 weight % as shown in Table 2, and the temperature coefficient ($\tau_f$) of resonance frequency was large and capacity regulation was high, as shown in Table 3. On the other hand, since the glass ceramic composition did not contain both of $TiO_2$ and $SrTiO_3$ as the second ceramic in sample 50 as shown in Table 2, the temperature coefficient ($\tau_f$) of resonance frequency was large as shown in Table 3.

Since the content of $BaZrO_3$ as the third ceramic in sample 38 was less than 4 weight % as shown in Table 2, capacity regulation was high as shown in Table 3. On the other hand, the content of $BaZrO_3$ as the third ceramic in the sample 42 was more than 8 weight % as shown in Table 2, and the relative permittivity ($\in_r$) was high and capacity regulation was high, as shown in Table 3.

In samples 43 and 44, the content of $ZrO_2$ as the fourth ceramic was less than 5 weight % as shown in Table 2. The plating solution resistance was low as shown in Table 3. On the other hand, the content of $ZrO_2$ as the fourth ceramic in sample 49 was more than 20 weight % as shown in Table 2, and the relative permittivity ($\in_r$) was high.

Experiment Example 2

This Experiment Example 2 is characterized by using manganese oxide in place of zirconium oxide used in Experiment Example 1 as the fourth ceramic.

First, the borosilicate glasses shown in Table 1 were used as the borosilicate glass contained in the glass ceramic composition.

A $Mg_2SiO_4$ powder having an average grain diameter (median grain diameter D50) of 0.8 μm was prepared as a first ceramic for the glass ceramic composition, a $SrTiO_3$ powder having an average grain diameter of 1.5 μm and a $TiO_2$ powder having an average grain diameter of 1.0 μm were respectively prepared as a second ceramic, a $BaZrO_3$ powder having an average grain diameter of 1.0 μm was prepared as a third ceramic, and a MnO powder having an average grain diameter of 1.0 μm was prepared as a fourth ceramic.

In order to obtain a glass ceramic composition of each of the samples shown in Table 4, the first ceramic, the borosilicate glass, the second ceramic, the third ceramic and the fourth ceramic powders were mixed.

TABLE 4

| Sample number | Amount of first ceramic (Wt %) | Borosilicate glass Kind | Borosilicate glass Amount (Weight %) | Amount of second ceramic (Weight %) SrTiO₃ | Amount of second ceramic (Weight %) TiO₂ | Amount of third ceramic (Weight %) | Amount of fourth ceramic (Weight %) |
|---|---|---|---|---|---|---|---|
| 101* | 62.5 | G1* | 20.0 | 6.0 | 0.5 | 6.0 | 5.0 |
| 102 | 62.5 | G2 | 20.0 | 6.0 | 0.5 | 6.0 | 5.0 |
| 103 | 79.5 | G3 | 3.0 | 6.0 | 0.5 | 6.0 | 5.0 |
| 104* | 79.5 | G4* | 3.0 | 6.0 | 0.5 | 6.0 | 5.0 |
| 105* | 72.5 | G5* | 10.0 | 6.0 | 0.5 | 6.0 | 5.0 |
| 106 | 72.5 | G6 | 10.0 | 6.0 | 0.5 | 6.0 | 5.0 |
| 107 | 72.5 | G7 | 10.0 | 6.0 | 0.5 | 6.0 | 5.0 |
| 108 | 72.5 | G8 | 10.0 | 6.0 | 0.5 | 6.0 | 5.0 |
| 109 | 72.5 | G9 | 10.0 | 6.0 | 0.5 | 6.0 | 5.0 |
| 110 | 67.5 | G12 | 15.0 | 6.0 | 0.5 | 6.0 | 5.0 |
| 111 | 77.5 | G13 | 5.0 | 6.0 | 0.5 | 6.0 | 5.0 |
| 112* | 77.5 | G14* | 5.0 | 6.0 | 0.5 | 6.0 | 5.0 |
| 113 | 77.5 | G16 | 5.0 | 6.0 | 0.5 | 6.0 | 5.0 |
| 114 | 65.0 | G17 | 17.5 | 6.0 | 0.5 | 6.0 | 5.0 |
| 115* | 65.0 | G18* | 17.5 | 6.0 | 0.5 | 6.0 | 5.0 |
| 116* | 72.5 | G19* | 10.0 | 6.0 | 0.5 | 6.0 | 5.0 |
| 117 | 72.5 | G20 | 10.0 | 6.0 | 0.5 | 6.0 | 5.0 |
| 118 | 72.5 | G21 | 10.0 | 6.0 | 0.5 | 6.0 | 5.0 |
| 119* | 72.5 | G22* | 10.0 | 6.0 | 0.5 | 6.0 | 5.0 |
| 120* | 72.5 | G23* | 10.0 | 6.0 | 0.5 | 6.0 | 5.0 |
| 121 | 72.5 | G24 | 10.0 | 6.0 | 0.5 | 6.0 | 5.0 |
| 122 | 72.5 | G25 | 10.0 | 6.0 | 0.5 | 6.0 | 5.0 |
| 123* | 72.5 | G26* | 10.0 | 6.0 | 0.5 | 6.0 | 5.0 |
| 124 | 72.5 | G27 | 10.0 | 6.0 | 0.5 | 6.0 | 5.0 |
| 125 | 72.5 | G28 | 10.0 | 6.0 | 0.5 | 6.0 | 5.0 |
| 126* | 80.5 | G29 | 2.0 | 6.0 | 0.5 | 6.0 | 5.0 |
| 127 | 79.5 | G29 | 3.0 | 6.0 | 0.5 | 6.0 | 5.0 |
| 128 | 62.5 | G29 | 20.0 | 6.0 | 0.5 | 6.0 | 5.0 |

TABLE 4-continued

| Sample number | Amount of first ceramic (Wt %) | Borosilicate glass Kind | Borosilicate glass Amount (Weight %) | Amount of second ceramic (Weight %) SrTiO$_3$ | Amount of second ceramic (Weight %) TiO$_2$ | Amount of third ceramic (Weight %) | Amount of fourth ceramic (Weight %) |
|---|---|---|---|---|---|---|---|
| 129* | 57.5 | G29 | 25.0 | 6.0 | 0.5 | 6.0 | 5.0 |
| 130 | 73.0 | G29 | 10.0 | 6.0 | 0.0 | 6.0 | 5.0 |
| 131 | 72.7 | G29 | 10.0 | 6.0 | 0.3 | 6.0 | 5.0 |
| 132 | 63.0 | G29 | 10.0 | 6.0 | 10.0 | 6.0 | 5.0 |
| 133* | 60.0 | G29 | 10.0 | 6.0 | 13.0 | 6.0 | 5.0 |
| 134 | 78.5 | G29 | 10.0 | 0.0 | 0.5 | 6.0 | 5.0 |
| 135 | 75.5 | G29 | 10.0 | 3.0 | 0.5 | 6.0 | 5.0 |
| 136 | 65.5 | G29 | 10.0 | 13.0 | 0.5 | 6.0 | 5.0 |
| 137* | 63.5 | G29 | 10.0 | 15.0 | 0.5 | 6.0 | 5.0 |
| 138* | 78.5 | G29 | 10.0 | 6.0 | 0.5 | 0.0 | 5.0 |
| 139 | 74.5 | G29 | 10.0 | 6.0 | 0.5 | 4.0 | 5.0 |
| 140 | 72.5 | G29 | 10.0 | 6.0 | 0.5 | 6.0 | 5.0 |
| 141 | 70.5 | G29 | 10.0 | 6.0 | 0.5 | 8.0 | 5.0 |
| 142* | 68.5 | G29 | 10.0 | 6.0 | 0.5 | 10.0 | 5.0 |
| 143* | 77.5 | G29 | 10.0 | 6.0 | 0.5 | 6.0 | 0.0 |
| 144* | 77.0 | G29 | 10.0 | 6.0 | 0.5 | 6.0 | 0.5 |
| 145 | 76.5 | G29 | 10.0 | 6.0 | 0.5 | 6.0 | 1.0 |
| 146 | 74.5 | G29 | 10.0 | 6.0 | 0.5 | 6.0 | 3.0 |
| 147 | 70.5 | G29 | 10.0 | 6.0 | 0.5 | 6.0 | 7.0 |
| 148 | 68.5 | G29 | 10.0 | 6.0 | 0.5 | 6.0 | 9.0 |
| 149* | 67.5 | G29 | 10.0 | 6.0 | 0.5 | 6.0 | 10.0 |
| 150* | 79.0 | G29 | 10.0 | 0.0 | 0.0 | 6.0 | 5.0 |

Table 4 corresponds to previous Table 2 and is shown in the same manner as in Table 2. In Table 4, the sample numbers marked with an asterisk indicate a glass ceramic composition out of the scope of the present invention.

Next, in the same manner as in Experiment Example 1, relative permittivity ($\epsilon_r$), Qf value, temperature coefficient ($\tau_f$) of resonance frequency, insulation reliability, capacity regulation, and plating solution resistance were evaluated on the glass ceramic composition of each of the samples as shown in Table 5.

TABLE 5

| Sample number | $\epsilon_r$ | Qf value (GHz) | $\tau_f$ (ppm · °C.$^{-1}$) | Insulation reliability | Capacity regulation (%) | Plating solution resistance |
|---|---|---|---|---|---|---|
| 101* | unsintered | — | — | — | — | — |
| 102 | 8.5 | 11000 | 8.1 | ○ | 0.28 | ○ |
| 103 | 8.6 | 10000 | −6 | ○ | 0.17 | ○ |
| 104* | 8.6 | 6000 | −6 | X | 1.22 | X |
| 105* | 9 | 7000 | 1 | ○ | 0.18 | ○ |
| 106 | 9 | 14000 | 1.4 | ○ | 0.18 | ○ |
| 107 | 8.6 | 21000 | 2.9 | ○ | 0.07 | ○ |
| 108 | 8.6 | 21000 | 2.7 | ○ | 0.07 | ○ |
| 109 | 8.6 | 21000 | 2.8 | ○ | 0.06 | ○ |
| 110 | 8.5 | 19000 | 4 | ○ | 0.22 | ○ |
| 111 | 8.6 | 10000 | −4.7 | ○ | 0.26 | ○ |
| 112* | 8.6 | 6000 | −5 | X | 0.42 | X |
| 113 | 8.6 | 14000 | −4.3 | ○ | 0.30 | ○ |
| 114 | 8.5 | 11000 | 6.1 | ○ | 0.30 | ○ |
| 115* | unsintered | — | — | — | — | — |
| 116* | 8.6 | 10000 | 0.4 | ○ | 0.05 | X |
| 117 | 8.6 | 12000 | 0.1 | ○ | 0.03 | ○ |
| 118 | 8.4 | 10000 | 2.3 | ○ | 0.27 | ○ |
| 119* | 8.4 | 7000 | 1.6 | X | 0.37 | X |
| 120* | 8.6 | 10000 | 10.2 | ○ | 0.18 | X |
| 121 | 8.6 | 11000 | 7.6 | ○ | 0.14 | ○ |
| 122 | 8.6 | 22000 | 5.2 | ○ | 0.04 | ○ |
| 123* | 8.5 | 10000 | 9.2 | ○ | 0.11 | X |
| 124 | 8.5 | 15000 | 8 | ○ | 0.09 | ○ |
| 125 | 8.7 | 25000 | 2.9 | ○ | 0.04 | ○ |
| 126* | unsintered | — | — | — | — | — |
| 127 | 8.7 | 22000 | −6 | ○ | 0.04 | ○ |
| 128 | 8.5 | 10000 | 8.1 | ○ | 0.30 | ○ |
| 129* | 8.5 | 6000 | 1.2 | ○ | 0.62 | X |
| 130 | 8.4 | 17000 | −4.2 | ○ | 0.00 | ○ |
| 131 | 8.5 | 16000 | −3.2 | ○ | 0.01 | ○ |
| 132 | 9.6 | 11000 | 25.8 | ○ | 0.27 | ○ |
| 133* | 11.2 | 7000 | 46 | ○ | 0.50 | ○ |
| 134 | 8.6 | 18000 | −27.2 | ○ | 0.02 | ○ |
| 135 | 8.6 | 17000 | −10.5 | ○ | 0.02 | ○ |
| 136 | 8.5 | 13000 | 28.8 | ○ | 0.30 | ○ |
| 137* | 8.5 | 13000 | 34.8 | ○ | 0.62 | ○ |
| 138* | 7.9 | 20000 | −0.2 | ○ | 0.62 | ○ |
| 139 | 7.9 | 18000 | −0.2 | ○ | 0.30 | ○ |
| 140 | 8.6 | 16000 | −0.1 | ○ | 0.02 | ○ |
| 141 | 9.5 | 14000 | 0 | ○ | −0.18 | ○ |
| 142* | 10.0 | 13000 | 0 | ○ | −0.38 | X |
| 143* | 8.2 | 20000 | −1.5 | X | 1.20 | X |
| 144* | 8.4 | 19000 | −0.9 | X | 0.90 | X |
| 145 | 8.6 | 18000 | −0.6 | ○ | 0.03 | ○ |
| 146 | 9.2 | 16000 | −0.1 | ○ | 0.02 | ○ |
| 147 | 9.6 | 13000 | 1.3 | ○ | −0.01 | ○ |
| 148 | 9.8 | 10000 | 4.3 | ○ | −0.08 | ○ |
| 149* | 10.1 | 8000 | 5.8 | ○ | −0.13 | ○ |
| 150* | 8.6 | 18000 | −34.2 | ○ | 0.03 | ○ |

Also in Table 5, a sample number out of the scope of the present invention is marked with an asterisk.

As is obvious from a box "Kind" in "borosilicate glass" in Table 4, the samples within the scope of the present invention shown in Tables 4 and 5 include a borosilicate glass within the scope of the present invention shown in Table 1, and include a Mg$_2$SiO$_4$ powder as the first ceramic, a powder including at least one of SrTiO$_3$ and TiO$_2$ as the second ceramic, a BaZrO$_3$ powder as the third ceramic, and a ZrO$_2$ powder as the fourth ceramic.

In the samples within the scope of the present invention, the content of the second ceramic is 3 weight % or more and 13 weight % or less when the second ceramic has SrTiO$_3$ as the main constituent, and is 0.3 weight % or more and 10 weight % or less when the second ceramic has titanium oxide (TiO$_2$)

as the main constituent, the content of the third ceramic is 4 weight % or more and 8 weight % or less, the content of MnO as the fourth ceramic is 1 weight % or more and 9 weight % or less, and the content of the borosilicate glass is 3 weight % or more and 20 weight % or less.

Consequently, it is possible to obtain a glass ceramic sintered body in accordance with the samples within the scope of the present invention which can be fired at a temperature of 1000° C. or lower, has a low relative permittivity ($\in_r$<10) and a high Qf value (Qf≧10000 GHz), has a stable temperature characteristic ($\tau_f$≦±30 ppm/° C.) and high reliability (high insulation reliability and a capacity regulation within ±0.3%), and is excellent in plating solution resistance.

On the other hand, glass G1 shown in Table 1 has a content of $Li_2O$ of less than 3 weight %, and therefore the sample 101 in Tables 4 and 5, using the glass G1, was not sintered at a temperature of 1000° C. or lower. On the other hand, the content of $Li_2O$ in glass G4 was more than 15 weight %, and therefore in sample 104 using glass G4, the Qf value was deteriorated, insulation reliability was poor, capacity regulation was high, and plating solution resistance was low.

In glass G5, the content of MgO was less than 20 weight %, and therefore in sample 105 using glass G5, the Qf value was deteriorated.

The content of $B_2O_3$ in glass G14 was more than 30 weight %, and therefore in the sample 112 using glass G14, the Qf value was deteriorated, insulation reliability was poor, a capacity regulation was high, and plating solution resistance was low.

In glass G18, the content of $SiO_2$ was more than 35 weight %, and therefore sample 115 using glass G18 was not sintered at a temperature of 1000° C. or lower.

In glass G19, the content of ZnO was less than 6 weight %, and therefore in sample 116 using glass G19, plating solution resistance was low. On the other hand, the content of ZnO in glass G22 was more than 20 weight %, and therefore in sample 119 using glass G22, insulation reliability was poor, capacity regulation was high, and plating solution resistance was low.

The content of CaO was more than 15 weight % in the glass G23, and therefore in sample 120 using glass G23, insulation reliability and plating solution resistance were low.

In glass G26, the content of SrO was more than 25 weight %, and therefore in the sample 123 using the glass G26, plating solution resistance was low.

The glass G29 shown in Table 1 is a glass within the scope of the present invention, but some of samples 126 to 150 shown in Tables 4 and 5, which commonly used glass G29, are out of the scope of the present invention, and these samples out of the present invention will be described.

In sample 126, the content of the borosilicate glass was less than 3 weight % as shown in Table 4, and the sample was not sintered at a temperature of 1000° C. or lower as shown in Table 5. On the other hand, since the content of the borosilicate glass in sample 129 was more than 20 weight % as shown in Table 4, and capacity regulation was high and plating solution resistance was low as shown in Table 5.

In sample 133, since content of $TiO_2$ as the second ceramic was more than 10 weight % as shown in Table 4. The relative permittivity ($\in_r$) was high, temperature coefficient ($\tau_f$) of a resonance frequency was large, and a capacity regulation was high, as shown in Table 5. Further, since the content of $SrTiO_3$ as the second ceramic in sample 137 was more than 13 weight % as shown in Table 4, and the temperature coefficient ($\tau_f$) of resonance frequency was large and capacity regulation was high, as shown in Table 5. On the other hand, since the glass in sample 150 ceramic composition did not contain both of $TiO_2$ and $SrTiO_3$ as the second ceramic as shown in Table 4, the temperature coefficient ($\tau_f$) of a resonance frequency was large as shown in Table 5.

Since the content of $BaZrO_3$ as the third ceramic was less than 4 weight % in sample 138 as shown in Table 4, the capacity regulation was high as shown in Table 5. On the other hand, in sample 142, the content of $BaZrO_3$ as the third ceramic was more than 8 weight % as shown in Table 4, and the relative permittivity ($\in_r$) was high and capacity regulation was high, as shown in Table 5.

In samples 143 and 144, since the content of MnO as the fourth ceramic is less than 1 weight % as shown in Table 4, insulation reliability and plating solution resistance were low as shown in Table 5. On the other hand, since the content of MnO as the fourth ceramic in sample 149 was more than 9 weight % as shown in Table 4, and relative permittivity ($\in_r$) was high.

Experiment Example 3

This Experiment Example 3 is characterized by using both of zirconium oxide used in Experiment Example 1 and manganese oxide used in Experiment Example 2 as the fourth ceramic.

First, the borosilicate glasses shown in Table 1 were used as the borosilicate glass contained in the glass ceramic composition.

A $Mg_2SiO_4$ powder having an average grain diameter (median grain diameter D50) of 0.8 μm was prepared as a first ceramic contained in the glass ceramic composition, a $SrTiO_3$ powder having an average grain diameter of 1.5 μm and a $TiO_2$ powder having an average grain diameter of 1.0 μm were respectively prepared as a second ceramic, a $BaZrO_3$ powder having an average grain diameter of 1.0 μm was prepared as a third ceramic, and a $ZrO_2$ powder having an average grain diameter of 1.0 μm and a MnO powder having an average grain diameter of 1.0 μm were prepared as a fourth ceramic.

Next, the first ceramic, the borosilicate glass, the second ceramic, the third ceramic and the fourth ceramic powders were mixed in order to obtain the glass ceramic composition of each of samples shown in Table 6.

TABLE 6

| Sample number | Amount of first ceramic (Weight %) | Borosilicate glass | | Amount of second ceramic (Weight %) | | Amount of third ceramic (Weight %) | Amount of fourth ceramic (Weight %) | |
|---|---|---|---|---|---|---|---|---|
| | | Kind | Amount (Weight %) | $SrTiO_3$ | $TiO_2$ | | $ZrO_2$ | MnO |
| 201* | 55.5 | G1* | 20.0 | 6.0 | 0.5 | 6.0 | 7.0 | 5.0 |
| 202 | 55.5 | G2 | 20.0 | 6.0 | 0.5 | 6.0 | 7.0 | 5.0 |
| 203 | 72.5 | G3 | 3.0 | 6.0 | 0.5 | 6.0 | 7.0 | 5.0 |

TABLE 6-continued

| Sample number | Amount of first ceramic (Weight %) | Borosilicate glass Kind | Borosilicate glass Amount (Weight %) | Amount of second ceramic (Weight %) SrTiO₃ | Amount of second ceramic (Weight %) TiO₂ | Amount of third ceramic (Weight %) | Amount of fourth ceramic (Weight %) ZrO₂ | Amount of fourth ceramic (Weight %) MnO |
|---|---|---|---|---|---|---|---|---|
| 204* | 72.5 | G4* | 3.0 | 6.0 | 0.5 | 6.0 | 7.0 | 5.0 |
| 205* | 65.5 | G5* | 10.0 | 6.0 | 0.5 | 6.0 | 7.0 | 5.0 |
| 206 | 65.5 | G6 | 10.0 | 6.0 | 0.5 | 6.0 | 7.0 | 5.0 |
| 207 | 65.5 | G7 | 10.0 | 6.0 | 0.5 | 6.0 | 7.0 | 5.0 |
| 208 | 65.5 | G8 | 10.0 | 6.0 | 0.5 | 6.0 | 7.0 | 5.0 |
| 209 | 65.5 | G9 | 10.0 | 6.0 | 0.5 | 6.0 | 7.0 | 5.0 |
| 210 | 60.5 | G12 | 15.0 | 6.0 | 0.5 | 6.0 | 7.0 | 5.0 |
| 211 | 70.5 | G13 | 5.0 | 6.0 | 0.5 | 6.0 | 7.0 | 5.0 |
| 212* | 70.5 | G14* | 5.0 | 6.0 | 0.5 | 6.0 | 7.0 | 5.0 |
| 213 | 70.5 | G16 | 5.0 | 6.0 | 0.5 | 6.0 | 7.0 | 5.0 |
| 214 | 58.0 | G17 | 17.5 | 6.0 | 0.5 | 6.0 | 7.0 | 5.0 |
| 215* | 58.0 | G18* | 17.5 | 6.0 | 0.5 | 6.0 | 7.0 | 5.0 |
| 216* | 65.5 | G19* | 10.0 | 6.0 | 0.5 | 6.0 | 7.0 | 5.0 |
| 207 | 65.5 | G20 | 10.0 | 6.0 | 0.5 | 6.0 | 7.0 | 5.0 |
| 208 | 65.5 | G21 | 10.0 | 6.0 | 0.5 | 6.0 | 7.0 | 5.0 |
| 219* | 65.5 | G22* | 10.0 | 6.0 | 0.5 | 6.0 | 7.0 | 5.0 |
| 220* | 65.5 | G23* | 10.0 | 6.0 | 0.5 | 6.0 | 7.0 | 5.0 |
| 221 | 65.5 | G24 | 10.0 | 6.0 | 0.5 | 6.0 | 7.0 | 5.0 |
| 222 | 65.5 | G25 | 10.0 | 6.0 | 0.5 | 6.0 | 7.0 | 5.0 |
| 223* | 65.5 | G26* | 10.0 | 6.0 | 0.5 | 6.0 | 7.0 | 5.0 |
| 224 | 65.5 | G27 | 10.0 | 6.0 | 0.5 | 6.0 | 7.0 | 5.0 |
| 225 | 65.5 | G28 | 10.0 | 6.0 | 0.5 | 6.0 | 7.0 | 5.0 |
| 226* | 73.5 | G29 | 2.0 | 6.0 | 0.5 | 6.0 | 7.0 | 5.0 |
| 227 | 72.5 | G29 | 3.0 | 6.0 | 0.5 | 6.0 | 7.0 | 5.0 |
| 228 | 55.5 | G29 | 20.0 | 6.0 | 0.5 | 6.0 | 7.0 | 5.0 |
| 229* | 50.5 | G29 | 25.0 | 6.0 | 0.5 | 6.0 | 7.0 | 5.0 |
| 230 | 66.0 | G29 | 10.0 | 6.0 | 0.0 | 6.0 | 7.0 | 5.0 |
| 231 | 65.7 | G29 | 10.0 | 6.0 | 0.3 | 6.0 | 7.0 | 5.0 |
| 232 | 56.0 | G29 | 10.0 | 6.0 | 10.0 | 6.0 | 7.0 | 5.0 |
| 233* | 53.0 | G29 | 10.0 | 6.0 | 13.0 | 6.0 | 7.0 | 5.0 |
| 234 | 71.5 | G29 | 10.0 | 0.0 | 0.5 | 6.0 | 7.0 | 5.0 |
| 235 | 68.5 | G29 | 10.0 | 3.0 | 0.5 | 6.0 | 7.0 | 5.0 |
| 236 | 58.5 | G29 | 10.0 | 13.0 | 0.5 | 6.0 | 7.0 | 5.0 |
| 237* | 56.5 | G29 | 10.0 | 15.0 | 0.5 | 6.0 | 7.0 | 5.0 |
| 238* | 71.5 | G29 | 10.0 | 6.0 | 0.5 | 0.0 | 7.0 | 5.0 |
| 239 | 67.5 | G29 | 10.0 | 6.0 | 0.5 | 4.0 | 7.0 | 5.0 |
| 240 | 65.5 | G29 | 10.0 | 6.0 | 0.5 | 6.0 | 7.0 | 5.0 |
| 241 | 63.5 | G29 | 10.0 | 6.0 | 0.5 | 8.0 | 7.0 | 5.0 |
| 242* | 61.5 | G29 | 10.0 | 6.0 | 0.5 | 10.0 | 7.0 | 5.0 |
| 243* | 77.5 | G29 | 10.0 | 6.0 | 0.5 | 6.0 | 0.0 | 0.0 |
| 244* | 72.5 | G29 | 10.0 | 6.0 | 0.5 | 6.0 | 0.0 | 5.0 |
| 245* | 69.5 | G29 | 10.0 | 6.0 | 0.5 | 6.0 | 3.0 | 5.0 |
| 246 | 67.5 | G29 | 10.0 | 6.0 | 0.5 | 6.0 | 5.0 | 5.0 |
| 247 | 65.5 | G29 | 10.0 | 6.0 | 0.5 | 6.0 | 7.0 | 5.0 |
| 248 | 52.5 | G29 | 10.0 | 6.0 | 0.5 | 6.0 | 20.0 | 5.0 |
| 249* | 47.5 | G29 | 10.0 | 6.0 | 0.5 | 6.0 | 25.0 | 5.0 |
| 250* | 70.5 | G29 | 10.0 | 6.0 | 0.5 | 6.0 | 7.0 | 0.0 |
| 251* | 70.0 | G29 | 10.0 | 6.0 | 0.5 | 6.0 | 7.0 | 0.5 |
| 252 | 69.5 | G29 | 10.0 | 6.0 | 0.5 | 6.0 | 7.0 | 1.0 |
| 253 | 63.5 | G29 | 10.0 | 6.0 | 0.5 | 6.0 | 7.0 | 7.0 |
| 254 | 61.5 | G29 | 10.0 | 6.0 | 0.5 | 6.0 | 7.0 | 9.0 |
| 255* | 60.5 | G29 | 10.0 | 6.0 | 0.5 | 6.0 | 7.0 | 10.0 |
| 256* | 72.0 | G29 | 10.0 | 0.0 | 0.0 | 6.0 | 7.0 | 5.0 |

Table 6 corresponds to previous Table 2. A sample number marked with an asterisk indicates a glass ceramic composition out of the scope of the present invention.

Next, in the same manner as in Experiment Example 1, relative permittivity ($\epsilon_r$), Qf value, temperature coefficient ($\tau_f$) of resonance frequency, insulation reliability, capacity regulation, and plating solution resistance were evaluated as shown in Table 7 on the glass ceramic compositions of each of the samples. Moreover, deflecting strength was also evaluated in Experiment Example 3.

In the evaluation of the deflecting strength, green sheets similar to the green sheet prepared for the evaluation of the relative permittivity ($\epsilon_r$) were cut, laminated, and attached to one another by pressure to prepare a raw laminate with a size of 0.6 mm×4 mm×50 mm, and the raw laminate was fired at a temperature of 1000° C. or lower to obtain a ceramic substrate. The deflecting strength of the ceramic substrate was measured by a three point bending method.

TABLE 7

| Sample number | $\epsilon_r$ | Qf (GHz) | $\tau_f$ (ppm·°C.$^{-1}$) | Deflecting strength (MPa) | Insulation reliability | Capacity regulation (%) | Plating solution resistance |
|---|---|---|---|---|---|---|---|
| 201* | unsintered | — | — | — | — | — | — |
| 202 | 8.4 | 12000 | 7.5 | 340 | ○ | 0.21 | ○ |
| 203 | 8.5 | 11000 | −2 | 330 | ○ | 0.15 | ○ |
| 204* | 8.5 | 7000 | −0.5 | 300 | X | 1.35 | X |
| 205* | 8.9 | 8000 | 3.2 | 320 | ○ | 0.22 | ○ |
| 206 | 8.9 | 15000 | 4.5 | 310 | ○ | 0.15 | ○ |
| 207 | 8.5 | 21000 | 5.3 | 310 | ○ | 0.03 | ○ |
| 208 | 8.5 | 22000 | 6.5 | 310 | ○ | 0.05 | ○ |
| 209 | 8.5 | 21000 | 8.2 | 330 | ○ | 0.01 | ○ |
| 210 | 8.5 | 18000 | 5.2 | 330 | ○ | 0.05 | ○ |
| 211 | 8.5 | 11000 | −3.5 | 340 | ○ | 0.06 | ○ |
| 212* | 8.5 | 7000 | −4.2 | 300 | X | 0.51 | X |
| 213 | 8.5 | 15000 | −5.3 | 330 | ○ | 0.28 | ○ |
| 214 | 8.4 | 12000 | 4.2 | 320 | ○ | 0.25 | ○ |
| 215* | unsintered | — | — | — | — | — | — |
| 216* | 8.5 | 11000 | 3.5 | 310 | ○ | 0.07 | X |
| 207 | 8.5 | 12000 | 3.3 | 310 | ○ | 0.12 | ○ |
| 208 | 8.3 | 10000 | 4.5 | 320 | ○ | 0.16 | ○ |
| 219* | 8.3 | 6000 | 5.2 | 300 | X | 0.65 | X |
| 220* | 8.5 | 11000 | 10.5 | 310 | ○ | 0.12 | X |
| 221 | 8.5 | 10000 | 5.3 | 320 | ○ | 0.11 | ○ |
| 222 | 8.5 | 23000 | 5 | 320 | ○ | 0.08 | ○ |
| 223* | 8.5 | 11000 | 8.2 | 310 | ○ | 0.08 | X |
| 224 | 8.4 | 15000 | 7.3 | 300 | ○ | 0.13 | ○ |
| 225 | 8.6 | 23000 | 3.2 | 300 | ○ | 0.15 | ○ |
| 226* | unsintered | — | — | — | — | — | — |
| 227 | 8.6 | 20000 | −4.3 | 320 | ○ | 0.07 | ○ |
| 228 | 8.4 | 11000 | 6.5 | 340 | ○ | 0.22 | ○ |
| 229* | 8.4 | 6000 | −1.2 | 340 | ○ | 0.95 | X |
| 230 | 8.3 | 18000 | −5.6 | 320 | ○ | 0.05 | ○ |
| 231 | 8.4 | 15000 | 1.2 | 310 | ○ | 0.06 | ○ |
| 232 | 9.4 | 12000 | 18.5 | 320 | ○ | 0.22 | ○ |
| 233* | 11.2 | 6000 | 41 | 330 | ○ | 0.66 | ○ |
| 234 | 8.5 | 17000 | −25 | 330 | ○ | 0.07 | ○ |
| 235 | 8.5 | 16000 | −11.3 | 330 | ○ | 0.08 | ○ |
| 236 | 8.4 | 12000 | 27.8 | 310 | ○ | 0.30 | ○ |
| 237* | 8.4 | 12000 | 35.2 | 310 | ○ | 0.55 | ○ |
| 238* | 7.8 | 21000 | −1.3 | 310 | ○ | 0.74 | ○ |
| 239 | 7.8 | 18000 | −2.3 | 320 | ○ | 0.27 | ○ |
| 240 | 8.5 | 17000 | −3.5 | 320 | ○ | 0.06 | ○ |
| 241 | 9.4 | 13000 | 1.4 | 330 | ○ | −0.22 | ○ |
| 242* | 9.8 | 14000 | 1.3 | 310 | ○ | −0.25 | X |
| 243* | 9.5 | 13000 | 8.2 | 230 | X | 1.30 | X |
| 244* | 8.4 | 21000 | 1.2 | 240 | ○ | 1.10 | ○ |
| 245* | 8.4 | 20000 | 0.8 | 230 | ○ | 0.05 | ○ |
| 246 | 8.3 | 18000 | 1.3 | 300 | ○ | 0.05 | ○ |
| 247 | 8.3 | 13000 | 3.5 | 320 | ○ | 0.21 | ○ |
| 248 | 8.6 | 10000 | 5.2 | 310 | ○ | 0.15 | ○ |
| 249* | 8.7 | 10000 | 11.2 | 280 | ○ | 0.22 | ○ |
| 250* | 8.6 | 20000 | 1.2 | 230 | ○ | 0.15 | ○ |
| 251* | 9.2 | 20000 | 1.3 | 240 | ○ | 0.11 | ○ |
| 252 | 8.8 | 18000 | −2.4 | 330 | ○ | 0.02 | ○ |
| 253 | 8.7 | 13000 | 2.4 | 310 | ○ | −0.05 | ○ |
| 254 | 8.6 | 10000 | 5.2 | 320 | ○ | −0.15 | ○ |
| 255* | 8.6 | 7000 | 5.1 | 270 | ○ | 0.21 | ○ |
| 256* | 8.3 | 18000 | −33.1 | 320 | ○ | 0.05 | ○ |

A sample number out of the scope of the present invention is marked with an asterisk in Table 7.

As is obvious from box "Kind" in "borosilicate glass" in Table 6, samples within the scope of the present invention shown in Tables 6 and 7 include a borosilicate glass within the scope of the present invention shown in Table 1, and include a Mg$_2$SiO$_4$ powder as the first ceramic, a powder including at least one of SrTiO$_3$ and TiO$_2$ as the second ceramic, a BaZrO$_3$ powder as the third ceramic, and a ZrO$_2$ powder and a MnO powder as the fourth ceramic.

In the samples within the scope of the present invention, the content of the second ceramic is 3 weight % or more and 13 weight % or less when the second ceramic has SrTiO$_3$ as the main constituent, and is 0.3 weight % or more and 10 weight % or less when the second ceramic has titanium oxide (TiO$_2$) as the main constituent, the content of the third ceramic is 4 weight % or more and 8 weight % or less, the content of ZrO$_2$ as the fourth ceramic is 5 weight % or more and 20 weight % or less, the content of MnO as the fourth ceramic is 1 weight % or more and 9 weight % or less, and the content of the borosilicate glass is 3 weight % or more and 20 weight % or less.

Consequently, it is possible to obtain a glass ceramic sintered body which can be fired at a temperature of 1000° C. or lower, has a low relative permittivity ($\epsilon_r$<10) and a high Qf value ($\tau_f$≥10000 GHz), has a stable temperature characteristic ($\tau_f$≤±30 ppm/° C.), high reliability (high insulation durability and a capacity regulation within ±0.3%) and a high deflecting strength of 300 MPa or more, and is excellent in plating solution resistance in accordance with the samples within the scope of the present invention.

On the other hand, glass G1 shown in Table 1 has a content of $Li_2O$ of less than 3 weight %, and therefore the 201, in Tables 6 and 7, using glass G1, was not sintered at a temperature of 1000° C. or lower. In glass G4, the content of $Li_2O$ was more than 15 weight %, and therefore in sample 204 using glass G4, the Qf value was deteriorated, insulation reliability was poor, a capacity regulation was high, and plating solution resistance was low.

In glass G5, the content of MgO was less than 20 weight %, and therefore in the sample 205 using the glass G5, the Qf value was deteriorated.

In glass G14, the content of $B_2O_3$ was more than 30 weight %, and therefore in sample 212 using glass G14, the Qf value was deteriorated, insulation reliability was poor, a capacity regulation was high, and plating solution resistance was low.

Glass G18 had a content of $SiO_2$ of more than 35 weight %, and therefore sample 215 using glass G18 was not sintered at a temperature of 1000° C. or lower.

In glass G19, the content of ZnO was less than 6 weight %, and therefore plating solution resistance was low in sample 216 using glass G19. In the glass G22, the content of ZnO was more than 20 weight %, and therefore in sample 219 using glass G22, insulation reliability was poor, a capacity regulation was high, and plating solution resistance was low.

The content of CaO was more than 15 weight % in glass G23, and therefore in sample 220 using glass G23, insulation reliability and plating solution resistance were low.

In glass G26, the content of SrO was more than 25 weight %, and therefore in sample 223 using glass G26, plating solution resistance was low.

The glass G29 shown in Table 1 is a glass within the scope of the present invention, but some of samples 226 to 256 shown in Tables 6 and 7, which commonly use glass G29, are out of the scope of the present invention, and these samples out of the present invention will be described.

In sample 226, the content of the borosilicate glass was less than 3 weight % as shown in Table 6, and the sample was not sintered at a temperature of 1000° C. or lower as shown in Table 7. In sample 229, the content of the borosilicate glass was more than 20 weight % as shown in Table 6, and capacity regulation was high and plating solution resistance was low as shown in Table 7.

In sample 233, relative permittivity ($\in_r$) was high, a temperature coefficient ($\tau_f$) of a resonance frequency was large, and a capacity regulation was high, as shown in Table 7 since the content of $TiO_2$ as the second ceramic is more than 10 weight % as shown in Table 6. Further, since the content of $SrTiO_3$ as the second ceramic in sample 237 was more than 13 weight % as shown in Table 6, the temperature coefficient ($\tau_f$) of resonance frequency was large and capacity regulation was high, as shown in Table 7. Since the glass ceramic composition in sample 256 did not contain both of $TiO_2$ and $SrTiO_3$ as the second ceramic as shown in Table 6, the temperature coefficient ($\tau_f$) of resonance frequency was large as shown in Table 7.

In sample 238, since the content of $BaZrO_3$ as the third ceramic is less than 4 weight % as shown in Table 6, capacity regulation was high as shown in Table 7. On the other hand, since the content of $BaZrO_3$ as the third ceramic was more than 8 weight % as shown in sample 242 in Table 6, relative permittivity ($\in_r$) was high and capacity regulation was high, as shown in Table 7.

Since as shown in Table 6, the content of $ZrO_2$ as the fourth ceramic in sample 243 was less than 5 weight % and the content of MnO was less than 1 weight %, deflecting strength, insulation reliability and plating solution resistance were low as shown in Table 7. Further, since as shown in Table 6, the content of $ZrO_2$ as the fourth ceramic was less than 5 in samples 244 and 245, deflecting strength was low as shown in Table 7. Similarly, since the content of MnO as the fourth ceramic was less than 1 weight % as shown in Table 6 in samples 250 and 251, deflecting strength was low.

On the other hand, since the content of $ZrO_2$ as the fourth ceramic in sample 249 is more than 20 weight % as shown in Table 6, deflecting strength was low. Further, the content of MnO as the fourth ceramic in sample 255 is more than 9 weight % as shown in Table 6, and deflecting strength was low.

Experiment Example 4

In Experiment Example 4, a co-sintered body, formed by laminating a low dielectric constant layer and a high dielectric constant layer together and integrally firing the resulting laminate, was prepared, and electrical properties and the presence or absence of the structural defects thereof were evaluated.

First, glass ceramic compositions of the samples 2, 3, 6, 9, 10, 11, 13, 14, 27, 28, 30, 34, 39, 41, 43, 44, 45, 46, 47 and 48, respectively, prepared in Experiment Example 1, were used as the glass ceramic composition (low $\in$ material) for forming the low dielectric constant layer. Samples 43 and 44 are samples out of the scope of the present invention.

In order to obtain a glass ceramic composition (high $\in$ material) for forming the high dielectric constant layer, a $SrZrO_3$ powder having an average grain diameter (median grain diameter D50) of 1.0 μm was prepared as a fifth ceramic, and a $SrTiO_3$ powder having an average grain diameter of 1.5 μm was prepared as a sixth ceramic, and a $Mg_2SiO_4$ powder having an average grain diameter of 0.8 μm was prepared as a seventh ceramic. Further, as the borosilicate glass, glasses G2, G3, G6, G9, G12, G13, G16, G17 and G29, which were prepared in Experiment Example 1, were used, respectively.

Next, the ceramic, the borosilicate glass, the sixth ceramic and the seventh ceramic were mixed to prepare glass ceramic compositions (high $\in$ material) of the samples 301 to 313 with the compositions shown in Table 8 below. The relative permittivity ($\in_r$) of each of the sintered bodies obtained by firing the glass ceramic compositions of the samples 301 to 313 was determined by the same method as in Experiment Example 1. The results of the measurements are shown in Table 8. In this Table, a sample number out of the scope of the present invention is marked with an asterisk.

TABLE 8

| Sample number | Amount of fifth ceramic (Weight %) | Borosilicate glass | | Amount of sixth ceramic (Weight %) | Amount of seventh ceramic (Weight %) | $\in_r$ |
|---|---|---|---|---|---|---|
| | | Kind | Amount (Wt %) | | | |
| 301 | 67 | G2 | 10 | 3 | 20 | 22.4 |
| 302 | 75.5 | G3 | 1.5 | 3 | 20 | 27.7 |
| 303 | 72 | G6 | 5 | 3 | 20 | 25.3 |
| 304 | 72 | G9 | 5 | 3 | 20 | 25.2 |
| 305 | 69.5 | G12 | 7.5 | 3 | 20 | 23.6 |
| 306 | 74.5 | G13 | 2.5 | 3 | 20 | 26.1 |
| 307 | 74.5 | G16 | 2.5 | 3 | 20 | 26 |
| 308 | 68 | G17 | 9 | 3 | 20 | 22.5 |
| 309 | 76 | G29 | 1 | 3 | 20 | 27.3 |
| 310 | 65 | G29 | 12 | 3 | 20 | 22.1 |

TABLE 8-continued

| Sample number | Amount of fifth ceramic (Weight %) | Borosilicate glass Kind | Borosilicate glass Amount (Wt %) | Amount of sixth ceramic (Weight %) | Amount of seventh ceramic (Weight %) | $\epsilon_r$ |
|---|---|---|---|---|---|---|
| 311* | 92 | G29 | 5 | 3 | 0 | 30.2 |
| 312 | 87 | G29 | 5 | 3 | 5 | 28.6 |
| 313 | 72 | G29 | 5 | 3 | 20 | 25.6 |

Next, green sheets were prepared in the same manner as in Experiment Example 1 by use of the glass ceramic compositions to be the above low ∈ material and the glass ceramic compositions to be the above high ∈ material.

By use of a combination of the green sheet to be the above low ∈ material and the green sheet to be the above high ∈ material, as shown in the box "sample number of low ∈ material" and the box "sample number of high ∈ material" in Tables 9 and 10, co-sintered bodies 71 and 72 for electrical properties evaluation, shown in FIGS. 6 and 7 were prepared.

Figure 6A:
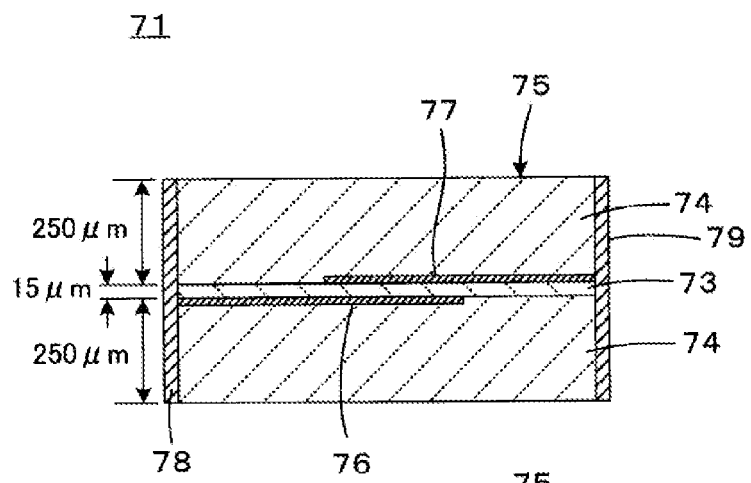
FIG. 6(a) is a front view showing an internal structure of a first co-sintered body 71 for electrical property evaluation prepared in Experiment Example 4.
Figure 6B:
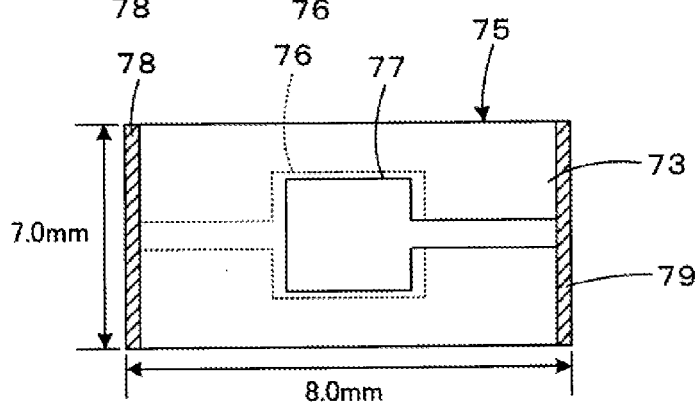
FIG. 6(b) is a plan view showing the internal structure.

The co-sintered body 71 shown in FIGS. 6(a) and 6(b) is for evaluating electrical properties in a column of the low ∈ material 73, and includes a laminate 75 having a laminated structure in which the low ∈ material 73 is sandwiched between the high ∈ materials 74. A pair of internal electrodes 76 and 77 is formed so as to be opposed with the low ∈ material 73 therebetween within the laminate 75. A pair of external electrodes 78 and 79 is formed at each end of the laminate 75, and the external electrodes 78 and 79 are electrically connected to the internal electrodes 76 and 77, respectively.

The co-sintered body 72 shown in FIGS. 7(a) and 7(b) is for evaluating electrical properties in a column of the high ∈ material 74, and includes a laminate 75a having a laminated structure in which the high ∈ material 74 is sandwiched between the low ∈ materials 73. Since other configuration is substantially the same as in the co-sintered body 72 shown in FIG. 6, corresponding parts are designated by like reference symbols and reduplicated descriptions are omitted.

The above-mentioned co-sintered bodies 71 and 72 for electrical properties evaluation were prepared by undergoing the steps of printing a Cu-containing conductive paste for forming the internal electrodes 76 and 77 on the green sheet, laminating predetermined green sheets and attaching predetermined green sheets by pressure, firing the resulting raw laminate 75 or 75a, and applying and firing a Cu-containing conductive paste for forming the external electrodes 78 and 79 on the laminate 75 or 75a, and the co-sintered bodies 71 and 72 have dimensions shown in FIG. 6.

Next, the relative permittivity of the low ∈ material 73 contained in the co-sintered body 71 for electrical properties evaluation, and the relative permittivity of the high ∈ material 74 contained in the co-sintered body 72 for electrical properties evaluation on each of samples 401 to 476 shown in Tables 9 and 10 were measured. Capacitances C of the co-sintered bodies 71 and 72 for electrical properties evaluation were measured at 1 MHZ by a LCR meter, the opposed area S of the internal electrodes 76 and 77, and the distance d between the internal electrodes 76 and 77 were measured, and thereby a relative permittivity ∈$_r$ was derived from the following equation:

$$\epsilon_r = (d \times C)/(\epsilon_0 \times S)$$

wherein ∈$_0$ is the dielectric constant at a vacuum.

In Tables 9 and 10, the relative permittivity of the low ∈ material 73 contained in the above-mentioned co-sintered body 71 for electrical properties evaluation is shown in a box "co-sintered body 71" in a column "low ∈ material: ∈$_r$", and the relative permittivity of the high ∈ material 74 contained in the above-mentioned co-sintered body 72 for electrical properties evaluation is shown in a box "co-sintered body 72" in a column "high ∈ material: ∈$_r$".

Further, the relative permittivity of each of the sintered bodies obtained by firing the used low ∈ materials singly is shown in the box "single substance" in the column "low ∈ material: ∈$_r$" of Tables 9 and 10, and similarly in a box "single substance" in a column "high ∈ material: ∈$_r$", the relative permittivity of each of the sintered bodies obtained by firing the used high ∈ materials singly is shown. The relative permittivity of the sintered body obtained by firing the used low ∈ materials singly is similar to that shown in Table 3, and the relative permittivity of the sintered body obtained by firing the used high ∈ materials singly is similar to that shown in Table 8.

TABLE 9

| Sample number | Sample number of low ∈ material | Sample number of high ∈ material | Low ∈ material: ∈$_r$ Single substance | Low ∈ material: ∈$_r$ Co-sintered body 71 | High ∈ material: ∈$_r$ Single substance | High ∈ material: ∈$_r$ Co-sintered body 72 | Co-sintered body 81 defective cross-section |
|---|---|---|---|---|---|---|---|
| 401 | 2 | 313 | 8.5 | 8.5 | 25.6 | 25.6 | ○ |
| 402 | 3 | 313 | 8.6 | 8.6 | 25.6 | 25.6 | ○ |
| 403 | 6 | 313 | 9.0 | 9.0 | 25.6 | 25.6 | ○ |
| 404 | 9 | 313 | 8.6 | 8.6 | 25.6 | 25.6 | ○ |
| 405 | 10 | 313 | 8.5 | 8.5 | 25.6 | 25.6 | ○ |
| 406 | 11 | 313 | 8.6 | 8.6 | 25.6 | 25.6 | ○ |
| 407 | 13 | 323 | 8.6 | 8.6 | 25.6 | 25.6 | ○ |
| 408 | 14 | 323 | 8.5 | 8.5 | 25.6 | 25.6 | ○ |
| 409 | 46 | 301 | 9.2 | 9.2 | 22.4 | 22.4 | ○ |
| 410 | 46 | 302 | 9.2 | 9.2 | 27.7 | 27.7 | ○ |
| 411 | 46 | 303 | 9.2 | 9.2 | 25.3 | 25.3 | ○ |
| 412 | 46 | 304 | 9.2 | 9.2 | 25.2 | 25.2 | ○ |
| 413 | 46 | 305 | 9.2 | 9.2 | 23.6 | 23.6 | ○ |
| 414 | 46 | 306 | 9.2 | 9.2 | 26.1 | 26.1 | ○ |
| 415 | 46 | 307 | 9.2 | 9.2 | 26 | 26 | ○ |
| 416 | 46 | 308 | 9.2 | 9.2 | 22.5 | 22.5 | ○ |
| 417 | 27 | 309 | 8.7 | 8.7 | 27.3 | 27.3 | ○ |

TABLE 9-continued

| Sample number | Sample number of low ϵ material | Sample number of high ϵ material | Low ϵ material: ϵr Single substance | Low ϵ material: ϵr Co-sintered body 71 | High ϵ material: ϵr Single substance | High ϵ material: ϵr Co-sintered body 72 | Co-sintered body 81 defective cross-section |
|---|---|---|---|---|---|---|---|
| 418 | 27 | 310 | 8.7 | 8.7 | 22.1 | 22.1 | ○ |
| 419* | 27 | 311 | 8.7 | 8.7 | 30.2 | 30.2 | X |
| 420 | 27 | 312 | 8.7 | 8.7 | 28.6 | 28.6 | ○ |
| 421 | 27 | 313 | 8.7 | 8.7 | 25.6 | 25.6 | ○ |
| 422 | 28 | 309 | 8.5 | 8.5 | 27.3 | 27.3 | ○ |
| 423 | 28 | 310 | 8.5 | 8.5 | 22.1 | 22.1 | ○ |
| 424* | 28 | 311 | 8.5 | 8.5 | 30.2 | 30.2 | X |
| 425 | 28 | 312 | 8.5 | 8.5 | 28.6 | 28.6 | ○ |
| 426 | 28 | 313 | 8.5 | 8.5 | 25.6 | 25.6 | ○ |
| 427 | 30 | 309 | 8.4 | 8.4 | 27.3 | 27.3 | ○ |
| 428 | 30 | 310 | 8.4 | 8.4 | 22.1 | 22.1 | ○ |
| 429* | 30 | 311 | 8.4 | 8.4 | 30.2 | 30.2 | X |
| 430 | 30 | 312 | 8.4 | 8.4 | 28.6 | 28.6 | ○ |
| 431 | 30 | 313 | 8.4 | 8.4 | 25.6 | 25.6 | ○ |
| 432 | 34 | 309 | 8.6 | 8.6 | 27.3 | 27.3 | ○ |
| 433 | 34 | 310 | 8.6 | 8.6 | 22.1 | 22.1 | ○ |
| 434* | 34 | 311 | 8.6 | 8.6 | 30.2 | 30.2 | X |
| 435 | 34 | 312 | 8.6 | 8.6 | 28.6 | 28.6 | ○ |
| 436 | 34 | 313 | 8.6 | 8.6 | 25.6 | 25.6 | ○ |
| 437 | 39 | 309 | 7.9 | 7.9 | 27.3 | 27.3 | ○ |
| 438 | 39 | 310 | 7.9 | 7.9 | 22.1 | 22.1 | ○ |
| 439* | 39 | 311 | 7.9 | 7.9 | 30.2 | 30.2 | X |
| 440 | 39 | 312 | 7.9 | 7.9 | 28.6 | 28.6 | ○ |
| 441 | 39 | 313 | 7.9 | 7.9 | 25.6 | 25.6 | ○ |

TABLE 10

| Sample number | Sample number of low ϵ material | Sample number of high ϵ material | Low ϵ material: ϵr Single substance | Low ϵ material: ϵr Co-sintered body 71 | High ϵ material: ϵr Single substance | High ϵ material: ϵr Co-sintered body 72 | Co-sintered body 81 defective cross-section |
|---|---|---|---|---|---|---|---|
| 442 | 41 | 309 | 9.5 | 9.5 | 27.3 | 27.3 | ○ |
| 443 | 41 | 310 | 9.5 | 9.5 | 22.1 | 22.1 | ○ |
| 444* | 41 | 311* | 9.5 | 9.5 | 30.2 | 30.2 | X |
| 445 | 41 | 312 | 9.5 | 9.5 | 28.6 | 28.6 | ○ |
| 446 | 41 | 313 | 9.5 | 9.5 | 25.6 | 25.6 | ○ |
| 447* | 43* | 309 | 8.2 | 8.2 | 27.3 | 27.3 | X |
| 448* | 43* | 310 | 8.2 | 8.2 | 22.1 | 22.1 | X |
| 449* | 43* | 311* | 8.2 | 8.2 | 30.2 | 30.2 | X |
| 450* | 43* | 312 | 8.2 | 8.2 | 28.6 | 28.6 | X |
| 451* | 43* | 313 | 8.2 | 8.2 | 25.6 | 25.6 | X |
| 452* | 44* | 309 | 8.4 | 8.4 | 27.3 | 27.3 | X |
| 453* | 44* | 310 | 8.4 | 8.4 | 22.1 | 22.1 | X |
| 454* | 44* | 311 | 8.4 | 8.4 | 30.2 | 30.2 | X |
| 455* | 44* | 312 | 8.4 | 8.4 | 28.6 | 28.6 | X |
| 456* | 44* | 313 | 8.4 | 8.4 | 25.6 | 25.6 | X |
| 457 | 45 | 309 | 8.6 | 8.6 | 27.3 | 27.3 | ○ |
| 458 | 45 | 310 | 8.6 | 8.6 | 22.1 | 22.1 | ○ |
| 459* | 45 | 311* | 8.6 | 8.6 | 30.2 | 30.2 | X |
| 460 | 45 | 312 | 8.6 | 8.6 | 28.6 | 28.6 | ○ |
| 461 | 45 | 313 | 8.6 | 8.6 | 25.6 | 25.6 | ○ |
| 462 | 46 | 309 | 9.2 | 9.2 | 27.3 | 27.3 | ○ |
| 463 | 46 | 310 | 9.2 | 9.2 | 22.1 | 22.1 | ○ |
| 464* | 46 | 311* | 9.2 | 9.2 | 30.2 | 30.2 | X |
| 465 | 46 | 312 | 9.2 | 9.2 | 28.6 | 28.6 | ○ |
| 466 | 46 | 313 | 9.2 | 9.2 | 25.6 | 25.6 | ○ |
| 467 | 47 | 309 | 9.6 | 9.6 | 27.3 | 27.3 | ○ |
| 468 | 47 | 310 | 9.6 | 9.6 | 22.1 | 22.1 | ○ |
| 469* | 47 | 311* | 9.6 | 9.6 | 30.2 | 30.2 | X |
| 470 | 47 | 312 | 9.6 | 9.6 | 28.8 | 28.6 | ○ |
| 471 | 47 | 313 | 9.6 | 9.6 | 25.6 | 25.6 | ○ |
| 472 | 48 | 309 | 9.8 | 9.8 | 27.3 | 27.3 | ○ |
| 473 | 48 | 310 | 9.8 | 9.8 | 22.1 | 22.1 | ○ |

TABLE 10-continued

| Sample number | Sample number of low ϵ material | Sample number of high ϵ material | Low ϵ material: ϵr Single substance | Low ϵ material: ϵr Co-sintered body 71 | High ϵ material: ϵr Single substance | High ϵ material: ϵr Co-sintered body 72 | Co-sintered body 81 defective cross-section |
|---|---|---|---|---|---|---|---|
| 474* | 48 | 311* | 9.8 | 9.8 | 30.2 | 30.2 | X |
| 475 | 48 | 312 | 9.8 | 9.8 | 28.6 | 28.6 | ○ |
| 476 | 48 | 313 | 9.8 | 9.8 | 25.6 | 25.6 | ○ |

In Tables 9 and 10, the sample number marked with an asterisk indicates a glass ceramic composition out of the scope of the present invention.

If the values in Tables 9 and 10 shown in the box "co-sintered body 71" in the column "low ∈ material: ∈$_r$" are compared with the values shown in the box "single substance" in the column "low ∈ material: ∈$_r$", it is found that the former is the same as the latter. Further, if the values shown in the box "co-sintered body 72" in the column "high ∈ material: ∈$_r$" are compared with the values shown in the box "single substance" in the column "high ∈ material: ∈$_r$", it is found that the former is the same as the latter. From these results, it is found that it is possible to co-sinter the low ∈ material and the high ∈ material while maintaining an electrical property (relative permittivity) of the low dielectric constant layer alone and an electrical property (relative permittivity) of the high dielectric constant layer alone.

Next, the co-sintered body 81 for structural defect evaluation shown in FIG. 8 was prepared in order to evaluate the presence or absence of structural defects of a co-sintered body formed by laminating a low dielectric constant layer and a high dielectric constant layer together and integrally firing the resulting laminate.

The co-sintered body 81 for structural defect evaluation has a structure in which the low ∈ material 82 and the high ∈ material 83 are laminated to each other, and is prepared by using a green sheet to be the low ∈ material 82 and a green sheet to be the high ∈ material 83 in combination, laminating the green sheets, attaching them to each other by pressure, and firing them, as shown in "sample number of low ∈ material" and "sample number of high ∈ material" in Tables 9 and 10.

A cross-section of the obtained co-sintered body 81 for structural defect evaluation was observed by a metallograph and evaluated on the presence or absence of structural defects such as pores, cracks, and peeling. In the box "co-sintered body 81 defective cross-section" in Tables 9 and 10, a sample in which the defect was developed is denoted by a symbol "x", and the sample in which the defect was not developed is denoted by a symbol "○".

As is evident from Tables 9 and 10, the structural defects such as pores, cracks, and peeling were not developed in the co-sintered body 81 in accordance with the samples within the scope of the present invention.

On the other hand, structural defects were developed in samples 419, 424, 429, 434, 439, 444, 449, 454, 459, 464, 469, and 474 in which the glass ceramic composition of sample 311 in Table 8 was used in the high ∈ material 83. The reason for this is likely that the glass ceramic composition of the sample 311 in Table 8 does not include a seventh ceramic having forsterite as the main constituent and the difference in thermal expansion coefficients between the high ∈ material 83 and the low ∈ material 82 is relatively large.

Further, structural defects in the low ∈ material 82 were developed in the samples 447 to 456 in which sample 43 or 44 in Tables 2 and 3 was used. The reason for this is likely that as shown in Table 2, the glass ceramic compositions of the samples 43 and 44 do not include $ZrO_2$ as the fourth ceramic in an amount of 5 weight % or more and the difference in thermal expansion coefficients between the high ∈ material 83 and the low ∈ material 82 is relatively large.

Experiment Example 5

In Experiment Example 5, a co-sintered body, formed by laminating a low dielectric constant layer and a high dielectric constant layer together and integrally firing the resulting laminate, was prepared as in Experiment Example 4, and electrical properties and the presence or absence of the structural defects thereof were evaluated. In Experiment Example 5, a ceramic containing manganese oxide was used in place of the ceramic containing zirconium oxide used in Experiment Example 4 as the fourth ceramic in the glass ceramic composition (low ∈ material) for forming the low dielectric constant layer.

As the glass ceramic composition (low ∈ material) for forming the low dielectric constant layer, glass ceramic compositions with the composition shown in Table 11 were prepared by the same manner as in Experiment Example 2, using glasses G2, G3, G6, G9, G12, G13, G16, G17 and G29 shown in Table 1. Further, the relative permittivity (∈$_r$) of each of the sintered bodies obtained by firing the obtained glass ceramic compositions was determined by the same method as in Experiment Example 1. The results of the measurements are shown in Table 11.

TABLE 11

| Sample number | Amount of first ceramic (Weight %) | Borosilicate glass Kind | Borosilicate glass Amount (Weight %) | Amount of second ceramic (Weight %) $SrTiO_3$ | Amount of second ceramic (Weight %) $TiO_2$ | Amount of third ceramic (Weight %) | Amount of fourth ceramic (Weight %) | ϵ$_r$ |
|---|---|---|---|---|---|---|---|---|
| 501 | 62.5 | G2 | 20.0 | 6.0 | 0.5 | 6.0 | 5.0 | 8.5 |
| 502 | 79.5 | G3 | 3.0 | 6.0 | 0.5 | 6.0 | 5.0 | 8.6 |

TABLE 11-continued

| Sample number | Amount of first ceramic (Weight %) | Borosilicate glass Kind | Amount (Weight %) | Amount of second ceramic (Weight %) SrTiO₃ | TiO₂ | Amount of third ceramic (Weight %) | Amount of fourth ceramic (Weight %) | $\epsilon_r$ |
|---|---|---|---|---|---|---|---|---|
| 503 | 72.5 | G6  | 10.0 | 6.0 | 0.5 | 6.0 | 5.0 | 9 |
| 504 | 72.5 | G9  | 10.0 | 6.0 | 0.5 | 6.0 | 5.0 | 8.6 |
| 505 | 67.5 | G12 | 15.0 | 6.0 | 0.5 | 6.0 | 5.0 | 8.5 |
| 506 | 77.5 | G13 | 5.0  | 6.0 | 0.5 | 6.0 | 5.0 | 8.6 |
| 507 | 77.5 | G16 | 5.0  | 6.0 | 0.5 | 6.0 | 5.0 | 8.6 |
| 508 | 65.0 | G17 | 17.5 | 6.0 | 0.5 | 6.0 | 5.0 | 8.5 |
| 509 | 79.5 | G29 | 3.0  | 6.0 | 0.5 | 6.0 | 5.0 | 8.7 |
| 510 | 62.5 | G29 | 20.0 | 6.0 | 0.5 | 6.0 | 5.0 | 8.5 |
| 511 | 73.0 | G29 | 10.0 | 6.0 | 0.0 | 6.0 | 5.0 | 8.4 |
| 512 | 78.5 | G29 | 10.0 | 0.0 | 0.5 | 6.0 | 5.0 | 8.6 |
| 513 | 74.5 | G29 | 10.0 | 6.0 | 0.5 | 4.0 | 5.0 | 7.9 |
| 514 | 70.5 | G29 | 10.0 | 6.0 | 0.5 | 8.0 | 5.0 | 9.5 |
| 515 | 77.5 | G29 | 10.0 | 6.0 | 0.5 | 6.0 | 0.0 | 8.2 |
| 516 | 76.5 | G29 | 10.0 | 6.0 | 0.5 | 6.0 | 0.5 | 8.4 |
| 517 | 75.5 | G29 | 10.0 | 6.0 | 0.5 | 6.0 | 1.0 | 8.6 |
| 518 | 73.5 | G29 | 10.0 | 6.0 | 0.5 | 6.0 | 3.0 | 9.2 |
| 519 | 71.5 | G29 | 10.0 | 6.0 | 0.5 | 6.0 | 7.0 | 9.6 |
| 520 | 69.5 | G29 | 10.0 | 6.0 | 0.5 | 6.0 | 9.0 | 9.8 |

As the glass ceramic composition (high ∈ material) for forming the high dielectric constant layer, glass ceramic compositions shown in Table 8 prepared in Experiment Example 4 described above were used.

Hereinafter, in the same manner as in Experiment Example 4, co-sintered bodies 71 and 72 for electrical properties evaluation, shown in FIGS. 6 and 7, were prepared on each of combinations of samples 601 to 676 shown in Tables 12 and 13. Tables 12 and 13 correspond to previous Tables 9 and 10 and is shown in the same manner as in Tables 9 and 10.

Next, the same evaluations as in Experiment Example 4 were performed on samples 601 to 676 shown in Tables 12 and 13. The results of the evaluations are shown in Tables 12 and 13.

TABLE 12

| Sample number | Sample number of low ∈ material | Sample number of high ∈ material | Low ∈ material: $\epsilon_r$ Single substance | Co-sintered body 71 | High ∈ material: $\epsilon_r$ Single substance | Co-sintered body 72 | Co-sintered body 81 defective cross-section |
|---|---|---|---|---|---|---|---|
| 601 | 501 | 313 | 8.5 | 8.5 | 25.6 | 25.6 | ○ |
| 602 | 502 | 313 | 8.6 | 8.6 | 25.6 | 25.6 | ○ |
| 603 | 503 | 313 | 9.0 | 9.0 | 25.6 | 25.6 | ○ |
| 604 | 504 | 313 | 8.6 | 8.6 | 25.6 | 25.6 | ○ |
| 605 | 505 | 313 | 8.5 | 8.5 | 25.6 | 25.6 | ○ |
| 606 | 506 | 313 | 8.6 | 8.6 | 25.6 | 25.6 | ○ |
| 607 | 507 | 313 | 8.6 | 8.6 | 25.6 | 25.6 | ○ |
| 608 | 508 | 313 | 8.5 | 8.5 | 25.6 | 25.6 | ○ |
| 609 | 518 | 301 | 9.2 | 9.2 | 22.4 | 22.4 | ○ |
| 610 | 518 | 302 | 9.2 | 9.2 | 27.7 | 27.7 | ○ |
| 611 | 518 | 303 | 9.2 | 9.2 | 25.3 | 25.3 | ○ |
| 612 | 518 | 304 | 9.2 | 9.2 | 25.2 | 25.2 | ○ |
| 613 | 518 | 305 | 9.2 | 9.2 | 23.6 | 23.6 | ○ |
| 614 | 518 | 306 | 9.2 | 9.2 | 26.1 | 26.1 | ○ |
| 615 | 518 | 307 | 9.2 | 9.2 | 26   | 26   | ○ |
| 616 | 518 | 308 | 9.2 | 9.2 | 22.5 | 22.5 | ○ |
| 617 | 509 | 309 | 8.7 | 8.7 | 27.3 | 27.3 | ○ |
| 618 | 509 | 310 | 8.7 | 8.7 | 22.1 | 22.1 | ○ |
| 619* | 509 | 311 | 8.7 | 8.7 | 30.2 | 30.2 | X |
| 620 | 509 | 312 | 8.7 | 8.7 | 28.6 | 28.6 | ○ |
| 621 | 509 | 313 | 8.7 | 8.7 | 25.6 | 25.6 | ○ |
| 622 | 510 | 309 | 8.5 | 8.5 | 27.3 | 27.3 | ○ |
| 623 | 510 | 310 | 8.5 | 8.5 | 22.1 | 22.1 | ○ |
| 624* | 510 | 311 | 8.5 | 8.5 | 30.2 | 30.2 | X |
| 625 | 510 | 312 | 8.5 | 8.5 | 28.6 | 28.6 | ○ |
| 626 | 510 | 313 | 8.5 | 8.5 | 25.6 | 25.6 | ○ |
| 627 | 511 | 309 | 8.4 | 8.4 | 27.3 | 27.3 | ○ |
| 628 | 511 | 310 | 8.4 | 8.4 | 22.1 | 22.1 | ○ |
| 629* | 511 | 311 | 8.4 | 8.4 | 30.2 | 30.2 | X |
| 630 | 511 | 312 | 8.4 | 8.4 | 28.6 | 28.6 | ○ |
| 631 | 511 | 313 | 8.4 | 8.4 | 25.6 | 25.6 | ○ |
| 632 | 512 | 309 | 8.6 | 8.6 | 27.3 | 27.3 | ○ |

TABLE 12-continued

| Sample number | Sample number of low ε material | Sample number of high ε material | Low ε material: $\epsilon_r$ Single substance | Low ε material: $\epsilon_r$ Co-sintered body 71 | High ε material: $\epsilon_r$ Single substance | High ε material: $\epsilon_r$ Co-sintered body 72 | Co-sintered body 81 defective cross-section |
|---|---|---|---|---|---|---|---|
| 633  | 512 | 310 | 8.6 | 8.6 | 22.1 | 22.1 | ○ |
| 634* | 512 | 311 | 8.6 | 8.6 | 30.2 | 30.2 | X |
| 635  | 512 | 312 | 8.6 | 8.6 | 28.6 | 28.6 | ○ |
| 636  | 512 | 313 | 8.6 | 8.6 | 25.6 | 25.6 | ○ |
| 637  | 513 | 309 | 7.9 | 7.9 | 27.3 | 27.3 | ○ |
| 638  | 513 | 310 | 7.9 | 7.9 | 22.1 | 22.1 | ○ |
| 639* | 513 | 311 | 7.9 | 7.9 | 30.2 | 30.2 | X |
| 640  | 513 | 312 | 7.9 | 7.9 | 28.6 | 28.6 | ○ |
| 641  | 513 | 313 | 7.9 | 7.9 | 25.6 | 25.6 | ○ |

TABLE 13

| Sample number | Sample number of low ε material | Sample number of high ε material | Low ε material: $\epsilon_r$ Single substance | Low ε material: $\epsilon_r$ Co-sintered body 72 | High ε material: $\epsilon_r$ Single substance | High ε material: $\epsilon_r$ Co-sintered body 72 | Co-sintered body 81 defective cross-section |
|---|---|---|---|---|---|---|---|
| 642  | 514 | 309 | 9.5 | 9.5 | 27.3 | 27.3 | ○ |
| 643  | 514 | 310 | 9.5 | 9.5 | 22.1 | 22.1 | ○ |
| 644* | 514 | 311 | 9.5 | 9.5 | 30.2 | 30.2 | X |
| 645  | 514 | 312 | 9.5 | 9.5 | 28.6 | 28.6 | ○ |
| 646  | 514 | 313 | 9.5 | 9.5 | 25.6 | 25.6 | ○ |
| 647* | 515 | 309 | 8.2 | 8.2 | 27.3 | 27.3 | X |
| 648* | 515 | 310 | 8.2 | 8.2 | 22.1 | 22.1 | X |
| 649* | 515 | 311 | 8.2 | 8.2 | 30.2 | 30.2 | X |
| 650* | 515 | 312 | 8.2 | 8.2 | 28.6 | 28.6 | X |
| 651* | 515 | 313 | 8.2 | 8.2 | 25.6 | 25.6 | X |
| 652* | 516 | 309 | 8.4 | 8.4 | 27.3 | 27.3 | X |
| 653* | 516 | 310 | 8.4 | 8.4 | 22.1 | 22.1 | X |
| 654* | 516 | 311 | 8.4 | 8.4 | 30.2 | 30.2 | X |
| 655* | 516 | 312 | 8.4 | 8.4 | 28.6 | 28.6 | X |
| 656* | 516 | 313 | 8.4 | 8.4 | 25.6 | 25.6 | X |
| 657  | 517 | 309 | 8.6 | 8.6 | 27.3 | 27.3 | ○ |
| 658  | 517 | 310 | 8.6 | 8.6 | 22.1 | 22.1 | ○ |
| 659* | 517 | 311 | 8.6 | 8.6 | 30.2 | 30.2 | X |
| 660  | 517 | 312 | 8.6 | 8.6 | 28.6 | 28.6 | ○ |
| 661  | 517 | 313 | 8.6 | 8.6 | 25.6 | 25.6 | ○ |
| 662  | 518 | 309 | 9.2 | 9.2 | 27.3 | 27.3 | ○ |
| 663  | 518 | 310 | 9.2 | 9.2 | 22.1 | 22.1 | ○ |
| 664* | 518 | 311 | 9.2 | 9.2 | 30.2 | 30.2 | X |
| 665  | 518 | 312 | 9.2 | 9.2 | 28.6 | 28.6 | ○ |
| 666  | 518 | 313 | 9.2 | 9.2 | 25.6 | 25.6 | ○ |
| 667  | 519 | 309 | 9.6 | 9.6 | 27.3 | 27.3 | ○ |
| 668  | 519 | 310 | 9.6 | 9.6 | 22.1 | 22.1 | ○ |
| 669* | 519 | 311 | 9.6 | 9.6 | 30.2 | 30.2 | X |
| 670  | 519 | 312 | 9.6 | 9.6 | 28.6 | 28.6 | ○ |
| 671  | 519 | 313 | 9.6 | 9.6 | 25.6 | 25.6 | ○ |
| 672  | 520 | 309 | 9.8 | 9.8 | 27.3 | 27.3 | ○ |
| 673  | 520 | 310 | 9.8 | 9.8 | 22.1 | 22.1 | ○ |
| 674* | 520 | 311 | 9.8 | 9.8 | 30.2 | 30.2 | X |
| 675  | 520 | 312 | 9.8 | 9.8 | 28.6 | 28.6 | ○ |
| 676  | 520 | 313 | 9.8 | 9.8 | 25.6 | 25.6 | ○ |

In Tables 12 and 13, a sample number marked with an asterisk indicates a glass ceramic composition out of the scope of the present invention.

If the values shown in the box "co-sintered body 71" in the column "low ∈ material: $\epsilon_r$" in Tables 12 and 13 are compared with the values shown in the box "single substance" in the column "low ∈ material: $\epsilon_r$", it is found that the former is the same as the latter. Further, if the values shown in the box "co-sintered body 72" in the column "high ∈ material: $\epsilon_r$" are compared with the values shown in the box "single substance" in the column "high ∈ material: $\epsilon_r$", it is found that the former is the same as the latter. From these results, it is found that it is possible to co-sinter the low ∈ material and the high ∈ material while maintaining an electrical property (relative permittivity) of the low dielectric constant layer alone and an electrical property (relative permittivity) of the high dielectric constant layer alone.

Next, the co-sintered body 81 for structural defect evaluation shown in FIG. 8 was prepared as in Experiment Example 4 in order to evaluate the presence or absence of structural defects of the co-sintered body formed by laminating a low dielectric constant layer and a high dielectric constant layer together and integrally firing the resulting laminate.

A cross-section of the obtained co-sintered body 81 for structural defect evaluation was observed by a metallograph and evaluated on the presence or absence of structural defects such as pores, cracks, and peeling. In the box "co-sintered body 81 defective cross-section" in Tables 12 and 13, a sample in which the defect was developed is denoted by a symbol "x", and a sample in which the defect was not developed is denoted by a symbol "○".

As can be seen from Tables 12 and 13, the structural defects such as pores, cracks, and peeling were not developed in the co-sintered body 81 in accordance with the samples within the scope of the present invention.

On the other hand, structural defects were developed in samples 619, 624, 629, 634, 639, 644, 649, 654, 659, 664, 669, and 674 in which the glass ceramic composition of sample 311 in Table 8 were used in the high ∈ material 83.

The reason for this is likely that the glass ceramic composition of sample 311 in Table 8 does not include a seventh ceramic having forsterite as the main constituent and the difference in thermal expansion coefficients between the high ∈ material 83 and the low ∈ material 82 is relatively large.

Further, in the low ∈ material 82, structural defects were developed in the samples 647 to 656 in which sample 515 or 516 in Table 11 was used. The reason for this is likely that as shown in Table 11, the glass ceramic compositions of samples 515 and 516 do not include MnO as the fourth ceramic in an amount of 1 weight % or more and the difference in thermal expansion coefficients between the high ∈ material 83 and the low ∈ material 82 is relatively large.

Experiment Example 6

In Experiment Example 6, a co-sintered body obtained by laminating a low dielectric constant layer and a high dielectric constant layer together and integrally firing the resulting laminate was prepared as in Experiment Examples 4 and 5, and the deflecting strength thereof was evaluated. In this Experiment Example 6, a ceramic containing both of zirconium oxide and manganese oxide was used as the fourth ceramic in the glass ceramic composition (low ∈ material) for forming the low dielectric constant layer.

That is, the glass ceramic composition (low ∈ material) for forming the low dielectric constant layer, shown in Table 14 were prepared by the same manner as in Experiment Example 3, using glasses G2, G3, G6, G9, G12, G13, G16, G17 and G29 shown in Table 1. Moreover, deflecting strength of a ceramic substrate made of the glass ceramic composition was determined in the same manner as in Experiment Example 3. The results of the measurements are shown in the box "single substance" in the column "low ∈ material: deflecting strength" of Tables 15 and 16 described later.

TABLE 14

| Sample number | Amount of first ceramic (Weight %) | Borosilicate glass Kind | Amount (Weight %) | Amount of second ceramic (Weight %) SrTiO$_3$ | TiO$_2$ | Amount of third ceramic (Weight %) | Amount of fourth ceramic (Weight %) ZrO$_2$ | MnO |
|---|---|---|---|---|---|---|---|---|
| 701 | 55.5 | G2 | 20.0 | 6.0 | 0.5 | 6.0 | 7.0 | 5.0 |
| 702 | 72.5 | G3 | 3.0 | 6.0 | 0.5 | 6.0 | 7.0 | 5.0 |
| 703 | 65.5 | G6 | 10.0 | 6.0 | 0.5 | 6.0 | 7.0 | 5.0 |
| 704 | 65.5 | G9 | 10.0 | 6.0 | 0.5 | 6.0 | 7.0 | 5.0 |
| 705 | 60.5 | G12 | 15.0 | 6.0 | 0.5 | 6.0 | 7.0 | 5.0 |
| 706 | 70.5 | G13 | 5.0 | 6.0 | 0.5 | 6.0 | 7.0 | 5.0 |
| 707 | 70.5 | G16 | 5.0 | 6.0 | 0.5 | 6.0 | 7.0 | 5.0 |
| 708 | 58.0 | G17 | 17.5 | 6.0 | 0.5 | 6.0 | 7.0 | 5.0 |
| 709 | 72.5 | G29 | 3.0 | 6.0 | 0.5 | 6.0 | 7.0 | 5.0 |
| 710 | 55.5 | G29 | 20.0 | 6.0 | 0.5 | 6.0 | 7.0 | 5.0 |
| 711 | 66.0 | G29 | 10.0 | 6.0 | 0.0 | 6.0 | 7.0 | 5.0 |
| 712 | 71.5 | G29 | 10.0 | 0.0 | 0.5 | 6.0 | 7.0 | 5.0 |
| 713 | 67.5 | G29 | 10.0 | 6.0 | 0.5 | 4.0 | 7.0 | 5.0 |
| 714 | 63.5 | G29 | 10.0 | 6.0 | 0.5 | 8.0 | 7.0 | 5.0 |
| 715* | 77.5 | G29 | 10.0 | 6.0 | 0.5 | 6.0 | 0.0 | 0.0 |
| 716* | 72.5 | G29 | 10.0 | 6.0 | 0.5 | 6.0 | 0.0 | 5.0 |
| 717* | 69.5 | G29 | 10.0 | 6.0 | 0.5 | 6.0 | 3.0 | 5.0 |
| 718 | 67.5 | G29 | 10.0 | 6.0 | 0.5 | 6.0 | 5.0 | 5.0 |
| 719 | 65.5 | G29 | 10.0 | 6.0 | 0.5 | 6.0 | 7.0 | 5.0 |
| 720 | 52.5 | G29 | 10.0 | 6.0 | 0.5 | 6.0 | 20.0 | 5.0 |
| 721* | 70.5 | G29 | 10.0 | 6.0 | 0.5 | 6.0 | 7.0 | 0.0 |
| 722* | 70.0 | G29 | 10.0 | 6.0 | 0.5 | 6.0 | 7.0 | 0.5 |
| 723 | 69.5 | G29 | 10.0 | 6.0 | 0.5 | 6.0 | 7.0 | 1.0 |
| 724 | 63.5 | G29 | 10.0 | 6.0 | 0.5 | 6.0 | 7.0 | 7.0 |
| 725 | 61.5 | G29 | 10.0 | 6.0 | 0.5 | 6.0 | 7.0 | 9.0 |

In Table 14, a sample number marked with an asterisk indicates a glass ceramic composition out of the scope of the present invention. Samples 715 to 717, 721 and 722 out of the scope of the present invention were samples in which if the fourth ceramic was ZrO$_2$, the content of ZrO$_2$ was out of the range of 5 to 20 weight %, and if the fourth ceramic was MnO, the content of MnO was out of the range of 1 to 9 weight %.

As the glass ceramic composition (high ∈ material) for forming the high dielectric constant layer, glass ceramic compositions shown in Table 8 prepared in Experiment Example 4 described above were used. In the same manner as in Experiment Example 3, deflecting strength of a ceramic substrate made of the high ∈ material was determined. The results of the measurements are shown in the box "single substance" in "high ∈ material: deflecting strength" of Tables 15 and 16 described later.

Figure 9:
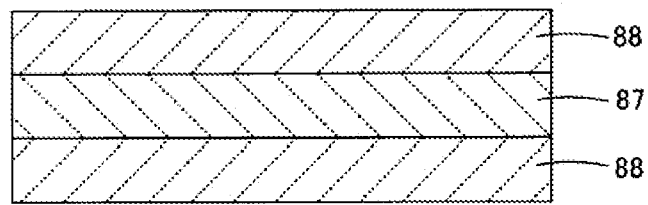
FIG. 9 is a sectional view showing a laminated structure of a first co-sintered body 85 for deflecting strength evaluation prepared in Experiment Example 6.
Figure 10:
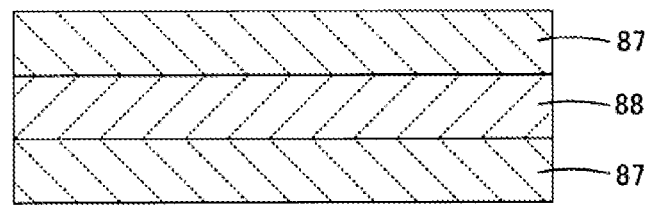
FIG. 10 is a sectional view showing a laminated structure of a second co-sintered body 86 for deflecting strength evaluation prepared in Experiment Example 6.

Next, a first sintered body 85 for deflecting strength evaluation and a second sintered body 86 for deflecting strength evaluation, shown in FIGS. 9 and 10, were prepared on each of combinations of samples 801 to 876 shown in Tables 15 and 16.

The first sintered body 85 for deflecting strength evaluation and the second sintered body 86 for deflecting strength evaluation were prepared by laminating green sheets prepared by the same method as in Example 3, and attaching the green sheet to one another by pressure to prepare a raw laminate with a size of 0.6 mm×4 mm×50 mm, and firing the raw laminate at a temperature of 1000° C. or lower. The first co-sintered body 85 for deflecting strength evaluation shown in FIG. 9 had a laminated structure in which the low ∈ material 87 was sandwiched between the high ∈ materials 88, and on the other hand, the second co-sintered body 86 for deflecting strength evaluation shown in FIG. 10 had a laminated structure in which the high ∈ material 88 was sandwiched between the low ∈ materials 87, and the thickness after attaching by pressure of each of the low ∈ material 87 and the high ∈ material 88 in each of these co-sintered bodies 85 and 86 for deflecting strength evaluation was 0.2 mm.

The deflecting strength of each of the first and the second co-sintered bodies 85 and 86 for deflecting strength evaluation was determined by a three point bending method. The deflecting strength determined on the first co-sintered body 85 for deflecting strength evaluation are shown in the box "co-sintered body 85" in the column "low ∈ material: deflecting strength" of Tables 15 and 16. The deflecting strength determined on the second co-sintered body 86 for deflecting strength evaluation are shown in the box "co-sintered body 86" in the column "high ∈ material: deflecting strength" of Tables 15 and 16.

TABLE 15

| Sample number | Sample number of low ∈ material | Sample number of high ∈ material | Low ∈ material: Deflecting strength (MPa) | | High ∈ material: Deflecting strength (MPa) | |
|---|---|---|---|---|---|---|
| | | | Single substance | Co-sintered body 85 | Single substance | Co-sintered body 86 |
| 801 | 701 | 313 | 340 | 310 | 210 | 310 |
| 802 | 702 | 313 | 330 | 310 | 210 | 300 |
| 803 | 703 | 313 | 310 | 300 | 210 | 310 |
| 804 | 704 | 313 | 330 | 300 | 210 | 300 |
| 805 | 705 | 313 | 330 | 310 | 210 | 300 |
| 806 | 706 | 313 | 340 | 300 | 210 | 310 |
| 807 | 707 | 313 | 330 | 310 | 210 | 300 |
| 808 | 708 | 313 | 320 | 300 | 210 | 300 |
| 809 | 718 | 301 | 300 | 300 | 250 | 310 |
| 810 | 718 | 302 | 300 | 310 | 240 | 300 |
| 811 | 718 | 303 | 300 | 300 | 220 | 310 |
| 812 | 718 | 304 | 300 | 300 | 230 | 310 |
| 813 | 718 | 305 | 300 | 300 | 230 | 310 |
| 814 | 718 | 306 | 300 | 300 | 240 | 320 |
| 815 | 718 | 307 | 300 | 300 | 240 | 310 |
| 816 | 718 | 308 | 300 | 310 | 250 | 300 |
| 817 | 709 | 309 | 320 | 310 | 240 | 300 |
| 818 | 709 | 310 | 320 | 320 | 260 | 310 |
| 819* | 709 | 311 | 320 | 210 | 220 | 200 |
| 820 | 709 | 312 | 320 | 300 | 220 | 300 |
| 821 | 709 | 313 | 320 | 310 | 210 | 300 |
| 822 | 710 | 309 | 340 | 310 | 240 | 300 |
| 823 | 710 | 310 | 340 | 300 | 260 | 300 |
| 824* | 710 | 311 | 340 | 220 | 220 | 210 |
| 825 | 710 | 312 | 340 | 300 | 220 | 310 |
| 826 | 710 | 313 | 340 | 300 | 210 | 310 |
| 827 | 711 | 309 | 320 | 300 | 240 | 310 |
| 828 | 711 | 310 | 320 | 300 | 260 | 310 |
| 829* | 711 | 311 | 320 | 220 | 220 | 210 |
| 830 | 711 | 312 | 320 | 300 | 220 | 320 |
| 831 | 711 | 313 | 320 | 310 | 210 | 310 |
| 832 | 712 | 309 | 330 | 300 | 240 | 310 |
| 833 | 712 | 310 | 330 | 300 | 260 | 300 |
| 834* | 712 | 311 | 330 | 230 | 220 | 310 |
| 835 | 712 | 312 | 330 | 300 | 220 | 300 |
| 836 | 712 | 313 | 330 | 310 | 210 | 310 |
| 837 | 713 | 309 | 320 | 310 | 240 | 300 |
| 838 | 713 | 310 | 320 | 300 | 260 | 300 |
| 839* | 713 | 311 | 320 | 200 | 220 | 210 |
| 840 | 713 | 312 | 320 | 300 | 220 | 310 |
| 841 | 713 | 313 | 320 | 300 | 210 | 300 |
| 842 | 714 | 309 | 330 | 300 | 240 | 300 |
| 843 | 714 | 310 | 330 | 300 | 260 | 300 |
| 844* | 714 | 311 | 330 | 210 | 220 | 200 |
| 845 | 714 | 312 | 330 | 300 | 220 | 320 |
| 846 | 714 | 303 | 330 | 300 | 210 | 320 |
| 847* | 715 | 309 | 230 | 210 | 240 | 200 |
| 848* | 715 | 310 | 230 | 200 | 260 | 200 |
| 849* | 715 | 311 | 230 | 220 | 220 | 200 |
| 850* | 715 | 312 | 230 | 210 | 220 | 200 |
| 851* | 715 | 313 | 230 | 200 | 210 | 210 |

TABLE 16

| Sample number | Sample number of low ϵ material | Sample number of high ϵ material | Low ϵ material: Deflecting strength (MPa) | | High ϵ material: Deflecting strength (MPa) | |
|---|---|---|---|---|---|---|
| | | | Single substance | Co-sintered body 85 | Single substance | Co-sintered body 86 |
| 852* | 716 | 309 | 240 | 200 | 240 | 200 |
| 853* | 716 | 310 | 240 | 200 | 260 | 200 |
| 854* | 716 | 311 | 240 | 200 | 220 | 210 |
| 855* | 716 | 312 | 240 | 210 | 220 | 200 |
| 856* | 716 | 313 | 240 | 200 | 210 | 200 |
| 857* | 717 | 309 | 230 | 200 | 240 | 210 |
| 858* | 717 | 310 | 230 | 200 | 260 | 200 |
| 859* | 717 | 311 | 230 | 200 | 220 | 200 |
| 860* | 717 | 312 | 230 | 210 | 220 | 200 |
| 861* | 717 | 313 | 230 | 210 | 210 | 210 |
| 862 | 718 | 309 | 300 | 300 | 240 | 310 |
| 863 | 718 | 310 | 300 | 310 | 260 | 310 |
| 864* | 718 | 311 | 300 | 300 | 220 | 310 |
| 865 | 718 | 312 | 300 | 310 | 220 | 310 |
| 866 | 718 | 313 | 300 | 310 | 210 | 310 |
| 867 | 719 | 309 | 320 | 310 | 240 | 300 |
| 868 | 719 | 310 | 320 | 310 | 260 | 310 |
| 869* | 719 | 311 | 320 | 220 | 220 | 210 |
| 870 | 719 | 312 | 320 | 310 | 220 | 320 |
| 871 | 719 | 313 | 320 | 310 | 210 | 310 |
| 872 | 720 | 309 | 310 | 300 | 240 | 310 |
| 873 | 720 | 310 | 310 | 300 | 260 | 310 |
| 874* | 720 | 311 | 310 | 220 | 220 | 210 |
| 875 | 720 | 312 | 310 | 320 | 220 | 310 |
| 876 | 720 | 313 | 310 | 310 | 210 | 310 |
| 877* | 721 | 309 | 230 | 210 | 240 | 220 |
| 878* | 721 | 310 | 230 | 210 | 260 | 210 |
| 879* | 721 | 311 | 230 | 200 | 220 | 210 |
| 880* | 721 | 312 | 230 | 200 | 220 | 210 |
| 881* | 721 | 313 | 230 | 210 | 210 | 210 |
| 882* | 722 | 309 | 240 | 210 | 240 | 200 |
| 883* | 722 | 310 | 240 | 200 | 260 | 210 |
| 884* | 722 | 311 | 240 | 220 | 220 | 210 |
| 885* | 722 | 312 | 240 | 200 | 220 | 210 |
| 886* | 722 | 313 | 240 | 200 | 210 | 210 |
| 887 | 723 | 309 | 330 | 310 | 240 | 310 |
| 888 | 723 | 310 | 330 | 300 | 260 | 300 |
| 889* | 723 | 311 | 330 | 200 | 220 | 200 |
| 890 | 723 | 312 | 330 | 310 | 220 | 300 |
| 891 | 723 | 313 | 330 | 310 | 210 | 310 |
| 892 | 724 | 309 | 310 | 320 | 240 | 310 |
| 893 | 724 | 310 | 310 | 320 | 260 | 310 |
| 894* | 724 | 311 | 310 | 200 | 220 | 210 |
| 895 | 724 | 312 | 310 | 310 | 220 | 300 |
| 866 | 724 | 313 | 310 | 300 | 210 | 310 |
| 897 | 725 | 309 | 320 | 300 | 240 | 320 |
| 898 | 725 | 310 | 320 | 320 | 260 | 320 |
| 899* | 725 | 311 | 320 | 210 | 220 | 220 |
| 900 | 725 | 312 | 320 | 320 | 220 | 300 |
| 901 | 725 | 313 | 320 | 320 | 210 | 300 |

In Tables 15 and 16, a sample number marked with an asterisk indicates a glass ceramic composition out of the scope of the present invention.

In co-sintered body samples 841 to 861 and 877 to 868 in Tables 15 and 16 in which out of the scope of the present invention samples 715 to 717, 721 and 722 were used as the low ∈ material, both of the "co-sintered body 85" and the "co-sintered body 86" did not exhibit higher deflecting strength than those of "single substance" in "low ∈ material" and "single substance" in "high ∈ material" since the low ∈ material did not have the effect of improving strength.

On the other hand, in co-sintered body samples 801 to 818, 820 to 823, 812 to 828, 830 to 833, 835 to 838, 840 to 843, 845, 846, 862, 863, 865 to 868, 870 to 873, 875, 876, 887, 888, 890 to 893, 895 to 898, 900 and 901 in which within the scope of the present invention samples 701 to 714, 718 to 720 and 723 to 725 were used as the low ∈ material and out of the scope of the present invention samples 301 to 310, 312 and 313 were used as the high ∈ material, both of the "co-sintered body 85" and the "co-sintered body 86" exhibited higher deflecting strength than those of "single substance" in "high ∈ material" since the low ∈ material had the effect of improving strength.

It is guessed that both of the "co-sintered body 85" and the "co-sintered body 86" which exhibited higher deflecting strength than those of "single substance" in "high ∈ material" as described above for the following reasons.

First, "co-sintered body 86" exhibited higher deflecting strength than those of "single substance" in "high ∈ material" because the low ∈ material had the effect of improving strength. More specifically, referring to FIG. 10, in the co-sintered body 86, when both of $ZrO_2$ and MnO were added to the low ∈ material 87, the crystallization of glass tended to be promoted in the vicinity of the surface where the low ∈ material 87 was exposed, and therefore the thermal expansion coefficient was smaller in the vicinity of the surface of the sintered body than the inside of the sintered body. It is guessed that since a region where the thermal expansion coefficient was smaller was positioned along both main surfaces of the sintered body 86, the sintered body 86 was brought into a state in which compression stress was exerted along both main surfaces of the sintered body 86 and therefore the "co-sintered body 86" exhibited higher deflecting strength than those of "single substance" in "high ∈ material".

It is guessed that the "co-sintered body 85" exhibited higher deflecting strength than those of "single substance" in "high ∈ material" for the following reasons. In the co-sintered body 85, the side edges of the low ∈ material 87 are exposed as shown in FIG. 9. In such a situation, when the low ∈ material 87 contains both of $ZrO_2$ and MnO, the crystallization of glass is promoted in the side edges of the low ∈ material 87 more than at an inner portion of the low ∈ material 87. Therefore, more diffusion of the glass constituent from the low ∈ material 87 to the high ∈ material 88 occurs at the inner portion than at the side edges of the low ∈ material 87. Since a part of a titanate salt, such as strontium titanate as the sixth ceramic contained in the high ∈ material 88, is dissolved in a glass constituent, the above-mentioned diffusion of a glass constituent causes a reduction in thermal expansion coefficient in an inner portion of the high ∈ material 88 other than a side edge of the high ∈ material 88. Therefore, it is guessed that in the exposed main surface of the high ∈ material 88, an inner portion thereof is subjected to compression stress from a peripheral portion to improve mechanical strength.

Experiment Example 7

In Experiment Example 7, a co-sintered body formed by laminating a low dielectric constant layer and a high dielectric constant layer together and integrally firing the resulting laminate, was prepared as in Experiment Examples 4, 5 and 6, and the warpage quantity thereof was evaluated. In this Experiment Example 7, a ceramic containing at least one of zirconium oxide and manganese oxide was used as the fourth ceramic in the glass ceramic composition (low ∈ material) for forming the low dielectric constant layer, and a ceramic containing at least one of zirconium oxide and manganese oxide was used in the glass ceramic composition (high ∈ material) for forming the high dielectric constant layer.

As the glass ceramic composition (low ∈ material) for forming the low dielectric constant layer, glass ceramic compositions with the composition shown in Table 17 were prepared by the same manner as in Experiment Example 3, using glass G29 shown in Table 1.

TABLE 17

| Sample number | Borosilicate glass Kind | Borosilicate glass Amount (Weight %) | Amount of fifth ceramic (W %) | Amount of second ceramic (Weight %) SrTiO₃ | Amount of second ceramic (Weight %) TiO₂ | Amount of third ceramic (Weight %) | Amount of fourth ceramic (Weight %) ZrO₂ | Amount of fourth ceramic (Weight %) MnO |
|---|---|---|---|---|---|---|---|---|
| 1001 | G29 | 10 | 77.5 | 6 | 0.5 | 6 | 0 | 0 |
| 1002 | G29 | 10 | 72.5 | 6 | 0.5 | 6 | 5 | 0 |
| 1003 | G29 | 10 | 67.5 | 6 | 0.5 | 6 | 10 | 0 |
| 1004 | G29 | 10 | 57.5 | 6 | 0.5 | 6 | 20 | 0 |
| 1005 | G29 | 10 | 76.5 | 6 | 0.5 | 6 | 0 | 1 |
| 1006 | G29 | 10 | 72.5 | 6 | 0.5 | 6 | 0 | 5 |
| 1007 | G29 | 10 | 68.5 | 6 | 0.5 | 6 | 0 | 9 |
| 1008 | G29 | 10 | 71.5 | 6 | 0.5 | 6 | 5 | 1 |
| 1009 | G29 | 10 | 62.5 | 6 | 0.5 | 6 | 10 | 5 |
| 1010 | G29 | 10 | 48.5 | 6 | 0.5 | 6 | 20 | 9 |

As the glass ceramic composition (high ∈ material) for forming the high dielectric constant layer, glass ceramic compositions with the composition shown in Table 18 were prepared by the same manner as in Experiment Example 4, using glass G29 shown in Table 1. In addition, a BaZrO₃ powder having an average grain diameter of 1.0 µm was further added in the high ∈ material as shown in Table 18 to bring the composition of the high ∈ material close to the composition of the low ∈ material.

TABLE 18

| Sample number | Borosilicate glass Kind | Borosilicate glass Amount (Weight %) | Amount of fifth ceramic (Weight %) | Amount of BaZrO₃ (Weight %) | Amount of sixth ceramic (Weight %) | Amount of seventh ceramic (Weight %) | Amount of ZrO₂ (Weight %) | Amount of MnO (Weight %) |
|---|---|---|---|---|---|---|---|---|
| 1101 | G29 | 5 | 62 | 10 | 3 | 20 | 0 | 0 |
| 1102 | G29 | 5 | 59 | 10 | 3 | 20 | 3 | 0 |
| 1103 | G29 | 5 | 57 | 10 | 3 | 20 | 5 | 0 |
| 1104 | G29 | 5 | 52 | 10 | 3 | 20 | 10 | 0 |
| 1105 | G29 | 5 | 42 | 10 | 3 | 20 | 20 | 0 |
| 1106 | G29 | 5 | 61 | 10 | 3 | 20 | 0 | 1 |
| 1107 | G29 | 5 | 57 | 10 | 3 | 20 | 0 | 5 |
| 1108 | G29 | 5 | 53 | 10 | 3 | 20 | 0 | 9 |
| 1109 | G29 | 5 | 56 | 10 | 3 | 20 | 5 | 1 |
| 1110 | G29 | 5 | 47 | 10 | 3 | 20 | 10 | 5 |
| 1111 | G29 | 5 | 33 | 10 | 3 | 20 | 20 | 9 |

Figure 11:
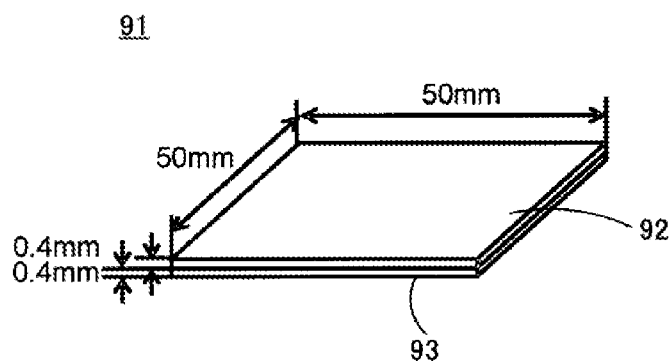
FIG. 11 is a perspective view showing an appearance of a co-sintered body 91 for warpage quantity evaluation prepared in Experiment Example 7.
Figure 12:
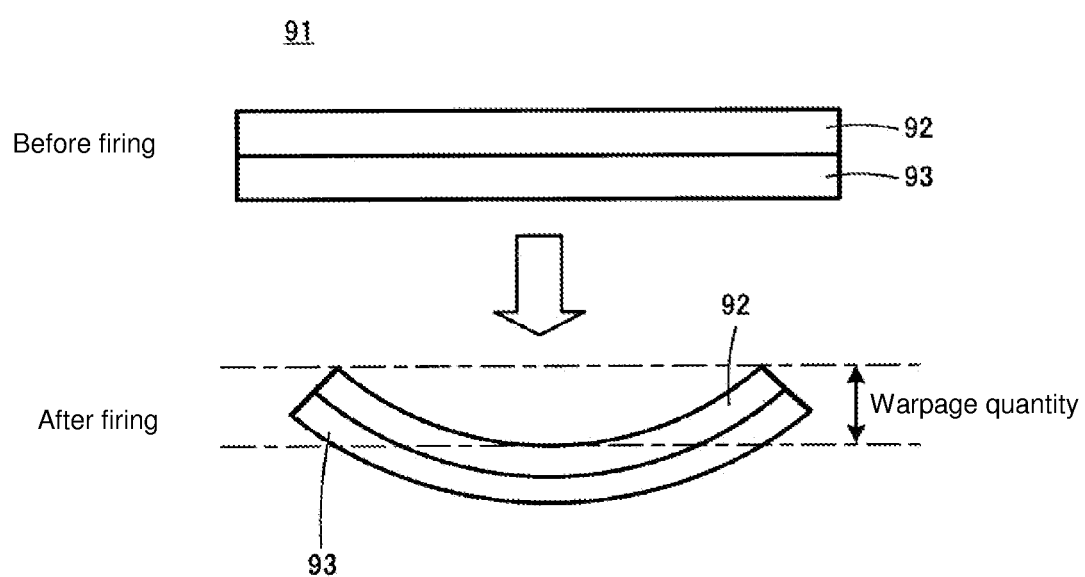
FIG. 12 is a side view of the co-sintered body 91 for warpage quantity evaluation shown in FIG. 11 for explaining a method of measuring a warpage quantity.

Next, a sintered body 91 for a warpage quantity evaluation, shown in FIGS. 11 and 12, was prepared on each of the combinations of samples 1201 to 1240 shown in Table 19.

The co-sintered body 91 for warpage quantity evaluation had a laminated structure in which the low ∈ material 92 was laminated on the high ∈ material 93, and had dimensions indicated in FIG. 11. The warpage quantity was a measurement of warpage after firing as shown in FIG. 12 and was measured by a noncontact laser displacement meter. The results of the measurement are shown in Table 19.

TABLE 19

| Sample number | Low ∈ material | High ∈ material | Warpage quantity amount [µm] |
|---|---|---|---|
| 1201 | 1002 | 1101 | 92 |
| 1202 | 1002 | 1102 | 52 |
| 1203 | 1002 | 1103 | 46 |
| 1204 | 1002 | 1104 | 54 |
| 1205 | 1002 | 1105 | 58 |
| 1206 | 1003 | 1101 | 83 |
| 1207 | 1003 | 1102 | 42 |
| 1208 | 1003 | 1103 | 38 |
| 1209 | 1003 | 1104 | 42 |
| 1210 | 1003 | 1105 | 46 |
| 1211 | 1004 | 1101 | 91 |
| 1212 | 1004 | 1102 | 53 |
| 1213 | 1004 | 1103 | 49 |
| 1214 | 1004 | 1104 | 52 |
| 1215 | 1004 | 1105 | 55 |
| 1216 | 1005 | 1101 | 51 |
| 1217 | 1005 | 1106 | 15 |
| 1218 | 1005 | 1107 | 13 |
| 1219 | 1005 | 1108 | 16 |
| 1220 | 1006 | 1101 | 32 |
| 1221 | 1006 | 1106 | 16 |
| 1222 | 1006 | 1107 | 13 |
| 1223 | 1006 | 1108 | 15 |
| 1224 | 1007 | 1101 | 49 |
| 1225 | 1007 | 1106 | 17 |
| 1226 | 1007 | 1107 | 14 |

TABLE 19-continued

| Sample number | Low ∈ material | High ∈ material | Warpage quantity amount [μm] |
|---|---|---|---|
| 1227 | 1007 | 1108 | 15 |
| 1228 | 1008 | 1101 | 33 |
| 1229 | 1010 | 1109 | 2 |
| 1230 | 1008 | 1110 | 0 |
| 1231 | 1008 | 1111 | 2 |
| 1232 | 1009 | 1101 | 22 |
| 1233 | 1009 | 1109 | 2 |
| 1234 | 1009 | 1110 | 0 |
| 1235 | 1009 | 1111 | 1 |
| 1236 | 1010 | 1101 | 28 |
| 1237 | 1010 | 1109 | 1 |
| 1238 | 1010 | 1110 | 0 |
| 1239 | 1010 | 1111 | 2 |
| 1240 | 1001 | 1101 | 152 |

In Table 17, sample 1001 has a low ∈ material not containing both of $ZrO_2$ and MnO, as shown in Table 18, sample 1101 has a high ∈ material not containing both of $ZrO_2$ and MnO. The co-sintered body of sample 1240 formed by combining the low ∈ material of sample 1001 with the high ∈ material of the sample 1101 exhibited a warpage quantity exceeding 100 as shown in Table 19.

In of all samples 1201 to 1239 other than the above sample 1252, both of the low ∈ material shown in Table 17 and the high ∈ material shown in Table 18 contain at least one of $ZrO_2$ and MnO, in which the content is 5 to 20 weight % for $ZrO_2$ and 1 to 9 weight % for MnO, and the warpage quantity could be kept below 100 μm as shown in Table 19. Further, the warpage quantities of the samples 1216 to 1227 containing MnO could be kept smaller than those of the samples 1201 to 1215 containing $ZrO_2$. The reason for this is likely that the crystallization of glass is promoted in the case where a Mn constituent not contained in other materials is newly contained more than the case where a Zr constituent previously contained in other materials such as $BaZrO_3$ and $SrZrO_3$ is additionally contained as $ZrO_2$, and thereby glass is hardly fluidized and diffusion of glass constituents is inhibited to decrease the difference in the linear expansion coefficient between the low ∈ material and the high ∈ material.

Further, samples 1008 to 1010 have a low ∈ material containing both of $ZrO_2$ and MnO having a content of 5 to 20 weight % and MnO having a content of 1 to 9 weight % as shown in Table 17. Samples 1109 to 1111 have a high ∈ material containing both of $ZrO_2$ having a content of 5 to 20 weight % and MnO having a content of 1 to 9 weight % as shown in Table 18. The combinations of the low ∈ material of any of samples 1008 to 1010 and the high ∈ material of any of samples 1109 to 1111 are realized in the samples 1229 to 1231, 1233 to 1235 and 1237 to 1239 as shown in Table 19.

In these samples 1229 to 1231, 1233 to 1235 and 1237 to 1239, the warpage quantities of the co-sintered bodies could be kept as extremely low as 2 μm or less as shown in Table 19.

DESCRIPTION OF REFERENCE SYMBOLS

| | |
|---|---|
| 1 | Ceramic multilayer module |
| 2 | Laminate glass ceramic substrate |
| 3 | Low dielectric constant layer |
| 4 | High dielectric constant layer |
| 21 | LC filter |
| 23 | Laminate glass ceramic substrate |
| 28 to 40 | Ceramic green sheet |

The invention claimed is:

1. A glass ceramic composition comprising:
   at least 55 weight % of a first ceramic comprising forsterite as the main constituent,
   a second ceramic comprising at least one of strontium titanate and titanium oxide as the main constituent,
   a third ceramic comprising barium zirconate as the main constituent,
   a fourth ceramic comprising zirconium oxide or manganese oxide as the main constituent, and
   a borosilicate glass, wherein
   the first ceramic is the main constituent of the composition,
   the content of said second ceramic is 3 weight % to 13 weight % when the second ceramic has strontium titanate as the main constituent, and is 0.3 weight % to 10 weight % when the second ceramic has titanium oxide as the main constituent,
   the content of said third ceramic is 4 weight % to 8 weight %,
   the content of said fourth ceramic is 5 weight % to 20 weight % when the fourth ceramic has zirconium oxide as the main constituent, and is 1 weight % to 9 weight % when the fourth ceramic has manganese oxide as the main constituent,
   the content of said borosilicate glass is 3 weight % to 15 weight %, and
   wherein said borosilicate glass contains lithium in an amount of 4 to 10 weight % on a $Li_2O$ equivalent basis, magnesium in an amount of 30 to 45 weight % on a MgO equivalent basis, boron in an amount of 15 to 25 weight % on a $B_2O_3$ equivalent basis, silicon in an amount of 15 to 30 weight % on a $SiO_2$ equivalent basis and zinc in an amount of 6 to 20 weight % on a ZnO equivalent basis, up to 15 weight % Al on an $Al_2O_3$ equivalent basis, and further contains at least 2 weight percent on a CaO equivalent basis plus SrO equivalent basis of an additive constituent comprising at least one of calcium oxide and strontium oxide, wherein the upper limit of the content of said additive constituent is 15 weight % on a CaO equivalent basis in the case of calcium oxide and is 25 weight % on a SrO equivalent basis in the case of strontium oxide based on the total weight of the borosilicate glass.

2. A glass ceramic composition according to claim 1 in which the second ceramic comprising strontium titanate as the main constituent, the strontium titanate has a molar ratio of $SrO/TiO_2$ of 0.92 to 1.05, and has a specific surface area of 1.5 to 7.5 m²/g.

3. A glass ceramic composition according to claim 2 in which the first ceramic has median grain diameter of 1 μm or less, and the forsterite has a $MgO/SiO_2$ molar ratio of 1.92 to 2.04.

4. A glass ceramic composition according to claim 1 in which the content of the second ceramic is 6.3 weight % to 13 weight % of which 6 weight % to 10 weight % is $SrTiO_3$ and 0.3 weight % to 3 weight % is $TiO_2$.

5. A glass ceramic composition according to claim 1 in which the content of silicon in the borosilicate glass is 20 to 26.5 weight percent.

6. A glass according to claim 1 in which the fourth ceramic has manganese oxide as the main constituent.

7. A fired glass ceramic substrate comprising a fired glass ceramic composition according to claim 6.

8. A glass ceramic substrate laminate comprising a low dielectric constant layer and a high dielectric constant layer, wherein said low dielectric constant layer is a glass ceramic substrate according to claim 7, and said high dielectric constant layer is a fired second glass ceramic composition which comprises a ceramic having strontium zirconate as the main constituent, a ceramic having strontium titanate as the main constituent, a ceramic having forsterite as the main constituent and 1 weight % to 12 weight % of a second borosilicate glass, wherein said second borosilicate glass contains lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 35 weight % on a $SiO_2$ equivalent basis and zinc in an amount of 6 to 20 weight % on a ZnO equivalent basis, and further contains a second additive constituent comprising at least one of calcium oxide and strontium oxide, wherein the upper limit of the content of said second additive constituent is 15 weight % on a CaO equivalent basis in the case of calcium oxide and is 25 weight % on a SrO equivalent basis in the case of strontium oxide based on the total weight of the second borosilicate glass.

9. A glass ceramic composition according to claim 8 in which the low dielectric constant layer glass ceramic composition fired has a content of said borosilicate glass of 3 weight % to 15 weight % and which said borosilicate glass contains lithium in an amount of 4 to 10 weight % on a $Li_2O$ equivalent basis, magnesium in an amount of 30 to 40 weight % on a MgO equivalent basis, boron in an amount of 15 to 25 weight % on a $B_2O_3$ equivalent basis, silicon in an amount of 15 to 30 weight % on a $SiO_2$ equivalent basis, up to 15 weight % Al on a $Al_2O_3$ equivalent basis, and the additive constituent is at least 2 weight percent on a CaO equivalent basis plus SrO equivalent basis.

10. A laminate glass ceramic substrate according to claim 8, wherein said high dielectric constant layer glass ceramic composition contains zirconium oxide in an amount of 5 weight % to 20 weight % or manganese oxide in an amount of 1 weight % to 9 weight %, or both.

11. A glass ceramic composition according to claim 10 in which the low dielectric constant layer glass ceramic composition has a content of said borosilicate glass of 3 weight % to 15 weight % and which said borosilicate glass contains lithium in an amount of 4 to 10 weight % on a $Li_2O$ equivalent basis, magnesium in an amount of 30 to 45 weight % on a MgO equivalent basis, boron in an amount of 15 to 25 weight % on a $B_2O_3$ equivalent basis, silicon in an amount of 15 to 30 weight % on a $SiO_2$ equivalent basis, up to 15 weight % Al on a $Al_2O_3$ equivalent basis, and the additive constituent is at least 2 weight percent on a CaO equivalent basis plus SrO equivalent basis.

12. A glass ceramic substrate comprising a fired glass ceramic composition according to claim 1.

13. A glass ceramic substrate laminate comprising a low dielectric constant layer and a high dielectric constant layer, wherein said low dielectric constant layer is a fired glass ceramic composition according to claim 12, and said high dielectric constant layer is a fired second glass ceramic composition which comprises a ceramic having strontium zirconate as the main constituent, a ceramic having strontium titanate as the main constituent, a ceramic having forsterite as the main constituent and 1 weight % to 12 weight % of a second borosilicate glass, wherein said second borosilicate glass contains lithium in an amount of 3 to 15 weight % on a $Li_2O$ equivalent basis, magnesium in an amount of 20 to 50 weight % on a MgO equivalent basis, boron in an amount of 15 to 30 weight % on a $B_2O_3$ equivalent basis, silicon in an amount of 10 to 35 weight % on a $SiO_2$ equivalent basis and zinc in an amount of 6 to 20 weight % on a ZnO equivalent basis, and further contains a second additive constituent comprising at least one of calcium oxide and strontium oxide, wherein the upper limit of the content of said second additive constituent is 15 weight % on a CaO equivalent basis in the case of calcium oxide and is 25 weight % on a SrO equivalent basis in the case of strontium oxide based on the total weight of the second borosilicate glass.

14. A glass ceramic composition according to claim 13 in which the low dielectric constant layer glass ceramic composition has a content of said borosilicate glass of 3 weight % to 15 weight % and which said borosilicate glass contains lithium in an amount of 4 to 10 weight % on a $Li_2O$ equivalent basis, magnesium in an amount of 30 to 45 weight % on a MgO equivalent basis, boron in an amount of 15 to 25 weight % on a $B_2O_3$ equivalent basis, silicon in an amount of 15 to 30 weight % on a $SiO_2$ equivalent basis, up to 15 weight % Al on a $Al_2O_3$ equivalent basis, and the additive constituent is at least 2 weight percent on a CaO equivalent basis plus SrO equivalent basis.

15. A laminate glass ceramic substrate according to claim 13, wherein said high dielectric constant layer glass ceramic composition contains zirconium oxide in an amount of 5 weight % to 20 weight % or manganese oxide in an amount of 1 weight % to 9 weight %, or both.

16. A glass ceramic composition according to claim 15 in which the low dielectric constant layer glass ceramic composition has a content of said borosilicate glass of 3 weight % to 15 weight % and which said borosilicate glass contains lithium in an amount of 4 to 10 weight % on a $Li_2O$ equivalent basis, magnesium in an amount of 30 to 45 weight % on a MgO equivalent basis, boron in an amount of 15 to 25 weight % on a $B_2O_3$ equivalent basis, silicon in an amount of 15 to 30 weight % on a $SiO_2$ equivalent basis, up to 15 weight % Al on a $Al_2O_3$ equivalent basis, and the additive constituent is at least 2 weight percent on a CaO equivalent basis plus SrO equivalent basis.

* * * * *